United States Patent
Yamazaki

(10) Patent No.: US 10,396,210 B2
(45) Date of Patent: Aug. 27, 2019

(54) SEMICONDUCTOR DEVICE WITH STACKED METAL OXIDE AND OXIDE SEMICONDUCTOR LAYERS AND DISPLAY DEVICE INCLUDING THE SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 128 days.

(21) Appl. No.: 14/977,978

(22) Filed: Dec. 22, 2015

(65) Prior Publication Data

US 2016/0190330 A1    Jun. 30, 2016

(30) Foreign Application Priority Data

Dec. 26, 2014    (JP) .................. 2014-264126

(51) Int. Cl.
*H01L 29/04*    (2006.01)
*H01L 29/40*    (2006.01)
(Continued)

(52) U.S. Cl.
CPC .... *H01L 29/7869* (2013.01); *H01L 21/02565* (2013.01); *H01L 21/02631* (2013.01);
(Continued)

(58) Field of Classification Search
CPC .......... H01L 29/7869–78693; H01L 29/78696
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Kevin Parendo
(74) *Attorney, Agent, or Firm* — Fish & Richardson P.C.

(57) ABSTRACT

The field-effect mobility of a semiconductor device is improved, and the on-state current thereof is increased, so that stable electrical characteristics are obtained. The semiconductor device includes a first oxide insulator, an oxide semiconductor, and a second oxide insulator which are stacked. The first oxide insulator includes In, Zn, and M (M represents Ti, Ga, Y, Zr, La, Ce, Nd, Sn, or Hf), and the content of In is lower than the content of M, and the content of In is lower than the content of Zn. The oxide semiconductor includes In and M (M represents Ti, Ga, Y, Zr, La, Ce, Nd, Sn, or Hf), and the content of In is higher than the content of M. The second oxide insulator includes In, Zn, and M (M represents Ti, Ga, Y, Zr, La, Ce, Nd, Sn, or Hf).

26 Claims, 35 Drawing Sheets

(51) Int. Cl.
*H01L 29/66* (2006.01)
*H01L 29/417* (2006.01)
*H01L 29/786* (2006.01)
*H01L 21/02* (2006.01)
*H01L 21/443* (2006.01)
*H01L 21/465* (2006.01)
*H01L 21/467* (2006.01)
*H01L 21/477* (2006.01)

(52) U.S. Cl.
CPC .......... *H01L 21/443* (2013.01); *H01L 21/465* (2013.01); *H01L 21/467* (2013.01); *H01L 21/477* (2013.01); *H01L 29/04* (2013.01); *H01L 29/408* (2013.01); *H01L 29/41733* (2013.01); *H01L 29/66969* (2013.01); *H01L 29/78618* (2013.01); *H01L 29/78645* (2013.01); *H01L 29/78693* (2013.01); *H01L 29/78696* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 8,384,080 B2 | 2/2013 | Taniguchi et al. |
| 8,502,221 B2 | 8/2013 | Yamazaki |
| 8,669,556 B2 | 3/2014 | Yamazaki et al. |
| 9,064,853 B2 | 6/2015 | Nomura et al. |
| 9,130,049 B2 | 9/2015 | Sano et al. |
| 9,225,329 B2 * | 12/2015 | Kozuma ............ H03K 19/0008 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2013/0009111 A1 * | 1/2013 | Morita ............ H01L 21/02554 252/519.1 |
| 2013/0026479 A1 * | 1/2013 | Kawashima ...... H01L 21/02422 257/66 |
| 2013/0048977 A1 | 2/2013 | Watanabe et al. |
| 2013/0320334 A1 * | 12/2013 | Yamazaki ........... H01L 29/7869 257/43 |
| 2014/0027762 A1 * | 1/2014 | Tsurume ................ H01L 29/24 257/43 |
| 2014/0034946 A1 * | 2/2014 | Yamazaki ............. H01L 29/247 257/43 |
| 2015/0364610 A1 | 12/2015 | Tsukuku et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |

(56) References Cited

FOREIGN PATENT DOCUMENTS

| JP | 2003-086000 A | 3/2003 |
|---|---|---|
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2011-138934 A | 7/2011 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications" SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000°C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350°C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandems OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Toshihiro Kugimiya et al.; "High Mobility Zn-Free Oxide Thin-Film Transistors"; IDW '14 : Proceedings of the 21st International Display Workshops, vol. 21; pp. 217-220; Dec. 3, 2014.

\* cited by examiner

SEMICONDUCTOR DEVICE WITH STACKED METAL OXIDE AND OXIDE SEMICONDUCTOR LAYERS AND DISPLAY DEVICE INCLUDING THE SEMICONDUCTOR DEVICE

BACKGROUND OF THE INVENTION

1. Field of the Invention

One embodiment of the present invention relates to a semiconductor device including an oxide semiconductor and a display device including the semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. In particular, one embodiment of the present invention relates to a semiconductor device, a display device, a liquid crystal display device, a light-emitting device, a power storage device, a memory device, an imaging device, a method for driving them, or a method for manufacturing them.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

Attention has been focused on a technique for forming a transistor using a semiconductor thin film formed over a substrate having an insulating surface (also referred to as a field-effect transistor (FET) or a thin film transistor (TFT)). Such transistors are applied to a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention (e.g., Patent Document 1).

REFERENCE

Patent Document

[Patent Document 1] Japanese Published Patent Application No. 2006-165529

SUMMARY OF THE INVENTION

Along with an increase in definition of an image display device and an increase in the size of a panel, an improvement in the mobility of a transistor serving as a switching transistor provided in a pixel portion and an increase in the on-state current thereof have been required. Furthermore, in the case where a pixel portion and a driver circuit of an image display device are formed over the same substrate at the same time, an improvement in the mobility of a transistor serving as a switching transistor in the driver circuit and an increase in the on-state current thereof have also been required.

Also in a semiconductor device such as an image display device in which an oxide semiconductor is used, an improvement in the field-effect mobility of a transistor including an oxide semiconductor and an increase in the on-state current thereof have been required.

When the field-effect mobility of a transistor including an oxide semiconductor is improved and the on-state current thereof is increased, problems such as an increase in a leakage current in an off state and unstable electrical characteristics of the transistor occur in some cases accordingly.

In view of the foregoing problems, an object of one embodiment of the present invention is to improve the field-effect mobility and increase the on-state current of a transistor including an oxide semiconductor in a semiconductor device. Another object of one embodiment of the present invention is to provide a transistor including an oxide semiconductor with stable electrical characteristics in a semiconductor device. Another object of one embodiment of the present invention is to reduce a leakage current in an off state.

Another object of one embodiment of the present invention is to provide a novel semiconductor device. Another object of one embodiment of the present invention is to provide a novel display device.

Note that the descriptions of the above objects do not disturb the existence of other objects. In one embodiment of the present invention, there is no need to achieve all the objects. Other objects are apparent from and can be derived from the description of the specification and the like.

One embodiment of the present invention is a semiconductor device including a first conductor formed over a substrate; a first insulator formed over the first conductor; a first metal oxide formed over the first insulator to overlap with at least part of the first conductor; an oxide semiconductor formed in contact with at least part of a top surface of the first metal oxide; a second metal oxide formed in contact with at least part of a top surface of the oxide semiconductor; a second conductor formed in contact with at least part of the second metal oxide; and a third conductor formed in contact with at least part of the second metal oxide and separated from the second conductor. The first metal oxide includes In, Zn, and M (M is Ti, Ga, Y, Zr, La, Ce, Nd, Sn, or Hf), and the content of In is lower than the content of M and lower than the content of Zn. The oxide semiconductor includes In and M, and the content of In is higher than the content of M. The second metal oxide includes In, Zn, and M.

Another embodiment of the present invention is a semiconductor device including a first conductor formed over a substrate; a first insulator formed over the first conductor; a first metal oxide formed over the first insulator to overlap with at least part of the first conductor; an oxide semiconductor formed in contact with at least part of a top surface of the first metal oxide; a second metal oxide formed in contact with at least part of a top surface of the oxide semiconductor; a second conductor formed in contact with at least part of the second metal oxide; and a third conductor formed in contact with at least part of the second metal oxide and separated from the second conductor. The first metal oxide includes Zn and M (M is Ti, Ga, Y, Zr, La, Ce, Nd, Sn, or Hf). The oxide semiconductor includes In and M, and the content of In is higher than the content of M. The second metal oxide includes In, Zn, and M.

In each of the above semiconductor devices, a side edge portion of the first metal oxide may be substantially aligned with a side edge portion of the oxide semiconductor, the side edge portion of the oxide semiconductor may be substantially aligned with a side edge portion of the second metal oxide, and the second conductor and the third conductor may be in contact with part of a top surface of the second metal oxide.

In each of the above semiconductor devices, the side edge portion of the second metal oxide may be positioned on an inner side than the side edge portion of the oxide semiconductor, and the second conductor and the third conductor may be in contact with part of the top surfaces of the oxide semiconductor and the second metal oxide.

In each of the above semiconductor devices, the thickness of a region of the second metal oxide, which is not in contact with the second conductor and the third conductor, may be smaller than the thickness of a region of the second metal oxide, which is in contact with the second conductor and the third conductor.

In each of the above semiconductor devices, at least part of a bottom surface of the second metal oxide may be in contact with the second conductor and the third conductor, and the second conductor and the third conductor may be in contact with at least part of the top surface of the oxide semiconductor.

In each of the above semiconductor devices, the thickness of a region of the oxide semiconductor, which is not in contact with the second conductor and the third conductor, may be smaller than the thickness of a region of the oxide semiconductor, which is in contact with the second conductor and the third conductor.

Each of the above semiconductor devices may further include a second insulator formed over the second metal oxide, the second conductor, and the third conductor; and a fourth conductor formed over the second insulator to overlap with at least part of the second metal oxide.

In each of the above semiconductor devices, the energy level of the conduction band minimum of the first metal oxide may be closer to the vacuum level than the energy level of the conduction band minimum of the oxide semiconductor, and the energy level of the conduction band minimum of the second metal oxide may be closer to the vacuum level than the energy level of the conduction band minimum of the oxide semiconductor.

In each of the above semiconductor devices, the oxide semiconductor may further include Ge. In each of the above semiconductor devices, the oxide semiconductor may have a polycrystalline structure.

Another embodiment of the present invention is a display device including the semiconductor device according to any one of the above embodiments and a display element. Another embodiment of the present invention is a display module including the display device and a touch sensor. Another embodiment of the present invention is an electronic device including the semiconductor device according to any one of the above embodiments, the display device according to the above embodiment, or the display module according to the above embodiment; and an operation key or a battery.

According to one embodiment of the present invention, the field-effect mobility of a semiconductor device can be improved, and the on-state current thereof can be increased. Additionally, the semiconductor device can have stable electrical characteristics. Furthermore, a leakage current of the semiconductor device in an off state can be reduced.

According to one embodiment of the present invention, a novel semiconductor device can be provided. According to one embodiment of the present invention, a novel display device can be provided.

Note that the description of these effects does not disturb the existence of other effects. One embodiment of the present invention does not necessarily achieve all the above effects. Other effects will be apparent from and can be derived from the description of the specification, the drawings, the claims, and the like.

DETAILED DESCRIPTION OF THE INVENTION

Figure 1A:
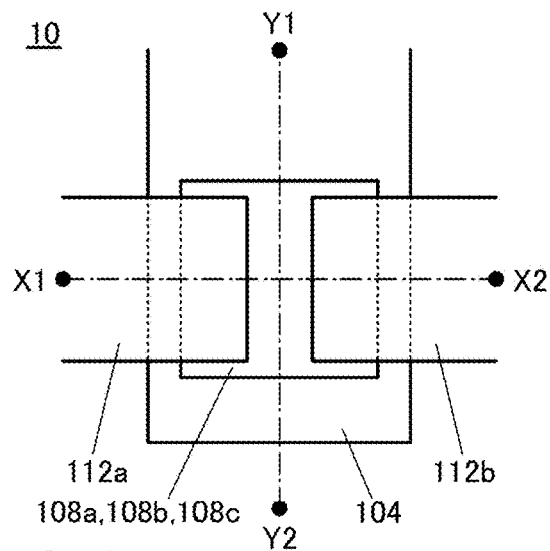
FIGS. 1A to 1D are a top view and cross-sectional views illustrating one embodiment of a semiconductor device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

Note that in this specification, terms for describing arrangement, such as "over" "above", "under", and "below", are used for convenience in describing a positional relation between components with reference to drawings. Furthermore, the positional relation between components is changed as appropriate in accordance with a direction in which each component is described. Thus, there is no limitation on terms used in this specification, and description can be made appropriately depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components; specific examples are hydrogen (included in water), lithium, sodium, silicon, boron, phosphorus, carbon, and nitrogen. In the case of an oxide semiconductor, an oxygen vacancy may be formed by entry of impurities such as hydrogen. Furthermore, when the semiconductor is silicon, examples of an impurity which changes the characteristics of the semiconductor include oxygen, Group 1 elements except hydrogen, Group 2 elements, Group 13 elements, and Group 15 elements.

Note that in this specification and the like, a silicon oxynitride film refers to a film in which the proportion of oxygen is higher than that of nitrogen. The silicon oxynitride film preferably contains oxygen, nitrogen, silicon, and hydrogen in the ranges of 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen in the ranges of 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

(Embodiment 1)

In this embodiment, a semiconductor device of one embodiment of the present invention and a method for manufacturing the semiconductor device are described with reference to FIGS. 1A to 1D, FIG. 2, FIGS. 3A to 3D, FIGS. 4A and 4B, FIGS. 5A to 5D, FIGS. 6A to 6C, FIGS. 7A to 7C, FIGS. 8A to 8C, FIGS. 9A and 9B, FIGS. 10A and 10B, and FIGS. 11A and 11B.

<Structural Example of Semiconductor Device>

Figure 1B:
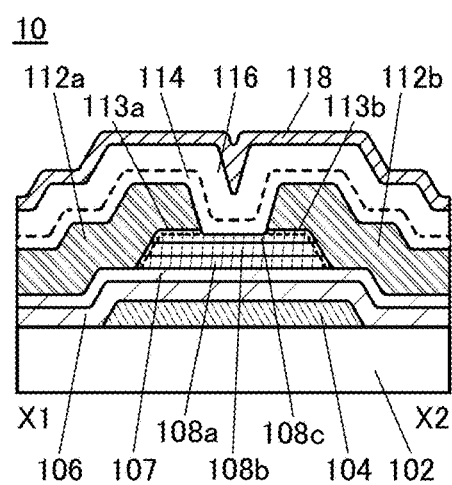
Figure 1C:
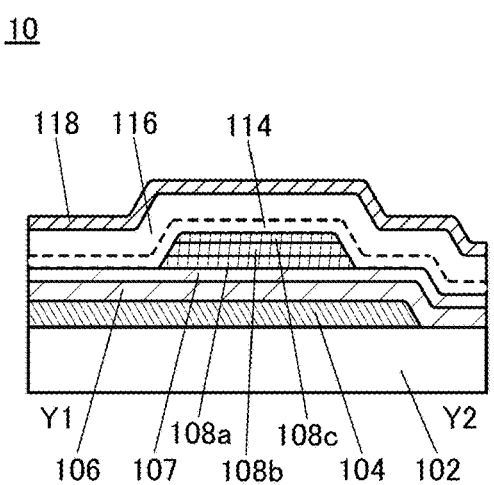

FIG. 1A is a top view of a transistor 10 that is a semiconductor device of one embodiment of the present invention. FIG. 1B is a cross-sectional view taken along a dashed dotted line X1-X2 in FIG. 1A, and FIG. 1C is a cross-sectional view taken along a dashed dotted line Y1-Y2 in FIG. 1A. Note that in FIG. 1A, some components of the transistor 10 (e.g., an insulating film serving as a gate insulating film) are not illustrated to avoid complexity. Furthermore, the direction of the dashed dotted line X1-X1 may be called a channel length direction, and the direction of the dashed dotted line Y1-Y2 may be called a channel width direction. As in FIG. 1A, some components are not illustrated in some cases in top views of transistors described below.

As illustrated in FIGS. 1A to 1C, the transistor 10 includes a conductor 104 formed over a substrate 102; an insulator 106 and an insulator 107 formed over the substrate 102; an oxide insulator 108a, an oxide semiconductor 108b, and an oxide insulator 108c which are formed over the insulator 107; and a conductor 112a and a conductor 112b which are formed in contact with at least part of the oxide insulator 108c. Furthermore, an insulator 114, an insulator 116, and an insulator 118 are formed over the oxide insulator 108c and the conductors 112a and 112b.

Here, each of the conductors 104, 112a, and 112b can be referred to as a conductive film or a conductive layer. Each of the insulators 106, 107, 114, 116, and 118 can also be referred to as an insulating film or an insulating layer. Each of the oxide insulators 108a and 108c can also be referred to as an oxide insulating layer or an oxide insulating film. The oxide semiconductor 108b can also be referred to as an oxide semiconductor layer or an oxide semiconductor film.

Note that as the details are described later, the oxide insulators 108a and 108c are sometimes formed using a substance that can function as a conductor, a semiconductor, or an insulator when the oxide insulators 108a and 108c are used alone. However, when the transistor is formed by stacking the oxide semiconductor 108b and the oxide insulators 108a and 108c, electrons flow in the oxide semiconductor 108b, in the vicinity of an interface between the oxide semiconductor 108b and the oxide insulator 108a, in the vicinity of an interface between the oxide semiconductor 108b and the oxide insulator 108c, and the like, and some regions of the oxide insulators 108a and 108c do not serve as a channel of the transistor. For that reason, in this specification and the like, the oxide insulators 108a and 108c are not referred to as oxide semiconductors but oxide insulators. Note that although details are described later, each of the oxide insulator 108a and the oxide insulator 108c can also be referred to as a metal oxide.

In the transistor 10, the conductor 104 serves as a gate electrode, the insulators 106 and 107 serve as a gate insulating film, the conductor 112a serves as one of a source electrode and a drain electrode, the conductor 112b serves as the other of the source electrode and the drain electrode, and the insulators 114, 116, and 118 serve as a protective insulating film of the transistor 10.

The conductor 104 is formed over the substrate 102, the insulator 106 is formed to cover the conductor 104, and the insulator 107 is formed over the insulator 106.

The oxide insulator 108a is formed over the insulator 107 to overlap with at least part of the conductor 104. The oxide semiconductor 108b is formed in contact with at least part of a top surface of the oxide insulator 108a. The oxide insulator 108c is formed in contact with at least part of a top surface of the oxide semiconductor 108b. In the transistor 10, a side edge portion of the oxide insulator 108a is substantially aligned with a side edge portion of the oxide semiconductor 108b, and the side edge portion of the oxide semiconductor 108b is substantially aligned with a side edge portion of the oxide insulator 108c. Note that the side edge portion of the oxide insulator 108a is an edge portion of the oxide insulator 108a in the direction of the dashed-dotted line X1-X2 in FIG. 1B. The same applies to the oxide semiconductor 108b and the oxide insulator 108c. Either the oxide insulator 108a or the oxide insulator 108c may not be formed.

As illustrated in FIG. 1B, a low-resistance region 113a and a low-resistance region 113b may be formed in regions of the oxide insulator 108a, the oxide semiconductor 108b, and the oxide insulator 108c, which are in contact with the conductors 112a or 112b.

The conductors 112a and 112b are spaced and are preferably formed to face each other so that the conductor 104 is positioned also between the conductors 112a and 112b as illustrated in FIG. 1A. In the transistor 10, the conductors 112a and 112b are in contact with part of a top surface of the oxide insulator 108c.

The insulator 114 is formed over the oxide insulator 108c and the conductors 112a and 112b, the insulator 116 is formed over the insulator 114, and the insulator 118 is formed over the insulator 116. Here, the insulator 114 is preferably in contact with a surface of the oxide insulator 108c, which is not in contact with the conductors 112a and 112b.

Next, the components of the transistor 10 illustrated in FIGS. 1A to 1D will be described in more detail.

<Oxide Semiconductor>

First, structures of the oxide insulator 108a, the oxide semiconductor 108b, and the oxide insulator 108c will be described in detail.

The oxide semiconductor 108b includes indium (In) and M (M is titanium (Ti), gallium (Ga), yttrium (Y), zirconium (Zr), lanthanum (La), cerium (Ce), neodymium (Nd), tin (Sn), or hafnium (Hf)). In the oxide semiconductor 108b, the content of In is preferably higher than the content of the element M; for example, the atomic ratio of metal elements of a sputtering target used for forming an In-M oxide is set to satisfy In >M The element M is an element having a high bonding energy with oxygen, such as an element whose bonding energy with oxygen is higher than that of indium. The element M is an element that can increase the energy gap of the oxide semiconductor, for example. Note that two or more of the above elements may be used in combination as the element M.

When the oxide semiconductor includes indium, the field-effect mobility of the transistor can be improved. Accordingly, the content of In is preferably higher than the content of the element M in the oxide semiconductor 108b, in which case the field-effect mobility of the transistor can be improved. The transistor having high field-effect mobility and high on-state current can be favorably used in a pixel circuit or a driving circuit of a high-definition display device typified by 4 k×2 k pixels (3840 pixels in the horizontal direction and 2048 pixels in the perpendicular direction) or 8 k×4 k pixels (7680 pixels in the horizontal direction and 4320 pixels in the perpendicular direction).

When the content of In is made higher than the content of the element M in the oxide semiconductor 108b, a polycrystalline structure may be formed in the oxide semiconductor 108b. Furthermore, the oxide semiconductor 108b may have a microcrystalline structure or include nanocrystal to be described later.

Alternatively, the oxide semiconductor 108b may include indium, the element M, and zinc (Zn). When the oxide semiconductor 108b includes zinc, the electron affinity of the oxide semiconductor 108b can be increased, so that the energy level of the conduction band minimum of the oxide semiconductor 108b can be lowered. Thus, the oxide semiconductor 108b can serve as a channel formation region more easily than the oxide insulators 108a and 108c. In addition, when the oxide semiconductor 108b includes zinc, CAAC-OS to be described later can be easily formed.

The oxide semiconductor 108b may include indium, the element M, and germanium (Ge). When the oxide semiconductor 108b includes germanium, the oxide semiconductor 108b is prevented from being polycrystalline, so that a grain boundary can be prevented from being formed in the oxide semiconductor 108b. Thus, the field-effect mobility of the oxide semiconductor 108b can be prevented from being lowered.

Typical examples of the atomic ratio of the metal elements of a sputtering target used for deposition of the oxide semiconductor 108b include In:M=2:1, In:M=19:1, In:M:Zn=2:1:1.5, In:M:Zn=2:1:2.3, In:M:Zn=2:1:3, In:M:Zn=3:1:2, In:M:Zn=4:2:4.1, and In:M:Ge=76:19:5. Note that when a sputtering target with an atomic ratio of In:Ga:Zn=4:2:4.1 is used, an atomic ratio of In:Ga:Zn in the oxide semiconductor 108b is 4:2:3 or in the vicinity of 4:2:3 in some cases.

Note that the thickness of the oxide semiconductor 108b is preferably greater than or equal to 3 nm and less than or equal to 200 nm, further preferably greater than or equal to 3 nm and less than or equal to 100 nm, still further preferably greater than or equal to 3 nm and less than or equal to 50 nm.

When the oxide semiconductor 108b does not include Zn or has a low content of Zn (for example, the content of Zn is lower than that of the element M), the resistance of the oxide semiconductor 108b to an acid-based etchant can be improved. Examples of an acid-based etchant include $H_2O_2$ and phosphoric-acetic-nitric acid (PAN) liquid. Thus, even when wet etching is performed to form the conductors 112a and 112b, the oxide semiconductor 108b can be prevented from being etched, and the oxide semiconductor 108b serving as a channel formation region can be mainly protected.

The oxide insulator 108c includes In, Zn, and M (M is Ti, Ga, Y, Zr, La, Ce, Nd, Sn, or Hf). The oxide insulator 108c may further include Ge. The oxide insulator 108c is preferably an oxide semiconductor including one or more elements, or two or more elements other than oxygen, which is included in the oxide semiconductor 108b, whereby a defect state is less likely to be formed at the interface between the oxide semiconductor 108b and the oxide insulator 108c.

When an In-M-Zn oxide is used for the oxide insulator 108c, the proportions of In and M, not taking Zn and O into consideration, is as follows: the atomic percentage of In is preferably less than or equal to 50 atomic % and the atomic percentage of M is greater than 50 atomic % and further preferably the atomic percentage of In is less than or equal to 25 atomic % and the atomic percentage of M is greater than 75 atomic %. With such atomic percentages, the oxide insulator 108c can have a larger energy gap and a smaller electron affinity. Furthermore, an oxygen vacancy is less likely to be generated in the oxide insulator in which the atomic ratio of Ti, Ga, Y, Zr, La, Ce, Nd, Sn, or Hf is higher than that of In because Ti, Ga, Y, Zr, La, Ce, Nd, Sn, and Hf each are a metal element that is strongly bonded to oxygen.

Typical examples of the atomic ratio of the metal elements of a sputtering target used for deposition of the oxide insulator 108c include In:M:Zn=1:1:1, In:M:Zn=1:1:1.2, In:M:Zn=1:2:4, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, and In:M:Zn=1:6:9. Note that when a sputtering target with an atomic ratio of In:Ga:Zn=1:1:1.2 is used, an atomic ratio of In:Ga:Zn in the oxide insulator 108c may be 1:1:1 or in the vicinity of 1:1:1.

The oxide insulator 108a includes Zn and M (M is Ti, Ga, Y, Zr, La, Ce, Nd, Sn, or Hf). The oxide insulator 108a may further include Ge. The oxide insulator 108a is preferably an oxide semiconductor including one or more elements, or two or more elements other than oxygen included in the oxide semiconductor 108b, in which case a defect state is less likely to be formed at the interface between the oxide semiconductor 108b and the oxide insulator 108a.

The oxide insulator 108a may include In. In that case, it is preferable that the content of In be lower than that of the element M and that the content of In be lower than that of Zn. For example, the atomic ratio of metal elements of a sputtering target used for deposition of an In-M-Zn oxide is set to satisfy In<M and In<Zn. It is further preferable that the oxide insulator 108a do not contain indium. In this case, for example, a Ga—Zn oxide or the like can be used for the oxide insulator 108a.

When such an oxide semiconductor having a low content of indium, preferably an oxide semiconductor including no indium is used for the oxide insulator 108a, less indium can diffuse from the oxide insulator 108a to the insulator 107 serving as the gate insulating film of the transistor 10. Here, if indium diffuses into the insulator 107 or to the interface between the insulator 107 and the oxide insulator 108a, an increase in leakage current of the transistor is induced. However, when the oxide insulator 108a which is an oxide semiconductor having a low content of indium, preferably an oxide semiconductor including no indium is provided between the oxide semiconductor 108b and the insulator 107, the amount of indium in the insulator 107 or at an interface between the insulator 107 and the oxide insulator 108a can be reduced, so that an increase in leakage current can be inhibited.

It is particularly preferable that the content of indium in the oxide semiconductor 108b be increased in order to improve the field-effect mobility of the transistor 10 described in this embodiment. When the oxide semiconductor 108b and the insulator 107 are in direct contact with each other, a large amount of indium is diffused into the insulator 107 serving as a gate insulating film. However, by provision of the oxide insulator 108a between the oxide semiconductor 108b and the insulator 107, while an increase in leakage current is inhibited, the field-effect mobility of the transistor 10 can be improved and the on-state current thereof can be increased.

When the content of indium in the oxide semiconductor 108b is increased as described above, a polycrystalline structure may be formed in the oxide semiconductor 108b. When a polycrystalline structure is formed in the oxide semiconductor 108b, the transistor may have unstable electrical characteristics. For example, in a graph showing drain current (Id)-gate voltage (Vg) characteristics (also referred to as Id-Vg characteristics) of the transistor, a hump curve may be observed in which the on-state current rises at a low Vg and then becomes stable, and rises again at a high Vg. As described above, diffusion of indium at the interface between the insulator 107 and the oxide insulator 108a is inhibited, whereby current flowing between a source and a drain when Vg is low can be reduced; thus such unstable electrical characteristics can be reduced.

When the oxide insulator 108a is an In-M-Zn oxide in which the atomic ratio of the element M (M is Ti, Ga, Y, Zr, La, Ce, Nd, Sn, or Hf) is higher than that of In, the energy gap of the oxide insulator 108a can be large and the electron affinity thereof can be small. Furthermore, an oxygen vacancy is less likely to be generated in the oxide insulator in which the atomic ratio of Ti, Ga, Y, Zr, La, Ce, Sn, Nd, or Hf is higher than that of In because Ti, Ga, Y, Zr, La, Ce, Sn, Nd, and Hf are each a metal element that is strongly bonded to oxygen.

Typical examples of the atomic ratio of the metal elements of a sputtering target used for deposition of the oxide insulator 108a include M:Zn=2:1, M:Zn=2:5, M:Zn=10:1, In:M:Zn=1:4:5, In:M:Zn=1:4.6, In:M:Zn=1:6:3, In:M:Zn=1:6:4, In:M:Zn=1:6.5, In:M:Zn=1:6.6, In:M:Zn=1:6.7, In:M:Zn=1:6.8, and In:M:Zn=1:6:9.

It is preferable that the oxide insulators 108a and 108c not have a spinel crystal structure. This is because if the oxide insulators 108a and 108c have a spinel crystal structure, a constituent element of the conductor 104, the conductors 112a and 112b, and the like might be diffused into the oxide semiconductor 108b at the interface between the spinel crystal structure and another region. Note that each of the oxide insulators 108a and 108c is preferably a CAAC-OS, which is described later, in which case a higher blocking property against constituent elements of the conductors 112a and 112b, for example, copper elements, is obtained.

The thickness of each of the oxide insulators 108a and 108c is greater than or equal to a thickness that is capable of inhibiting diffusion of the constituent element of the conductor 104, the conductors 112a and 112b, and the like to the oxide semiconductor 108b, and less than a thickness that inhibits supply of oxygen from the insulator 114 to the oxide semiconductor 108b. For example, when the thickness of each of the oxide insulators 108a and 108c is greater than or equal to 10 nm, the constituent elements of the conductors 112a and 112b can be prevented from diffusing into the oxide semiconductor 108b. When the thickness of each of the oxide insulators 108a and 108c is less than or equal to 100 nm, oxygen can be effectively supplied from the insulators 114 and 116 to the oxide semiconductor 108b.

The oxide semiconductor 108b is formed using, for example, an oxide with a wide energy gap. The energy gap of the oxide semiconductor 108b is, for example, 2.5 eV or larger and 4.2 eV or smaller, preferably 2.8 eV or larger and 3.8 eV or smaller, and further preferably 3 eV or larger and 3.5 eV or smaller. Here, the energy gap of the oxide insulator 108a is larger than that of the oxide semiconductor 108b. The energy gap of the oxide insulator 108c is larger than that of the oxide semiconductor 108b.

As the oxide semiconductor 108b, an oxide which has higher electron affinity than the oxide insulators 108a and 108c is preferably used. For example, as the oxide semiconductor 108b, an oxide having an electron affinity higher than those of the oxide insulators 108a and 108c by 0.07 eV or higher and 1.3 eV or lower, preferably 0.1 eV or higher and 0.7 eV or lower, and further preferably 0.15 eV or higher and 0.4 eV or lower is used. Note that the electron affinity refers to a difference between the vacuum level and the energy level at the conduction band minimum. In other words, the energy level of the conduction band minimum of the oxide insulator 108a is closer to the vacuum level than the energy level of the conduction band minimum of the oxide semiconductor 108b is. The energy level of the conduction band minimum of the oxide insulator 108c is closer to the vacuum level than the energy level of the conduction band minimum of the oxide semiconductor 108b is.

Here, in some cases, there is a mixed region of the oxide insulator 108a and the oxide semiconductor 108b between the oxide insulator 108a and the oxide semiconductor 108b. Furthermore, in some cases, there is a mixed region of the oxide semiconductor 108b and the oxide insulator 108c between the oxide semiconductor 108b and the oxide insulator 108c. The mixed region has a low density of defect states. For that reason, the stack including the oxide insulator 108a, the oxide semiconductor 108b, and the oxide insulator 108 has a band structure where energy is changed continuously at each interface and in the vicinity of the interface (continuous junction) (see FIG. 2). Note that boundaries of the oxide insulator 108a, the oxide semiconductor 108b, and the oxide insulator 108c are not clear in some cases.

At this time, electrons move mainly in the oxide semiconductor 108b, not in the oxide insulators 108a and 108c. As described above, when the density of defect states at the interface between the oxide insulator 108a and the oxide semiconductor 108b and the density of defect states at the interface between the oxide semiconductor 108b and the oxide insulator 108c are decreased, electron movement in the oxide semiconductor 108b is less likely to be inhibited and the on-sate current of the transistor can be increased.

The oxide insulator 108a, the oxide insulator 108c, and the insulator 106d are formed using a substance that can function as a conductor, a semiconductor, or an insulator when they are used alone. However, when the transistor is formed by stacking the oxide semiconductor 108b and the oxide insulators 108a and 108c, electrons flow in the oxide semiconductor 108b, in the vicinity of an interface between the oxide semiconductor 108b and the oxide insulator 108a, in the vicinity of an interface between the oxide semiconductor 108b and the oxide insulator 108c, and the like, and some regions of the oxide insulators 108a and 106c do not serve as a channel of the transistor. For that reason, in the present specification and the like, the oxide insulators 108a and 108c are not referred to as semiconductors but oxide insulators. Note that the reason why the oxide insulator 108a and the oxide insulator 108c are each referred to as an oxide insulator is because they are closer to an insulator than the oxide semiconductor 108b is in terms of their functions in a transistor, and the substance that can be used for the oxide semiconductor 108b is used for the oxide insulators 108a and 108c, and the insulator 106d in some cases. As described above, each of the oxide insulator 108a and the oxide insulator 108c is an oxide including a metal. Accordingly, each of the oxide insulator 108a and the oxide insulator 108c can also be referred to as a metal oxide.

To form a continuous junction between the oxide insulator 108a and the oxide semiconductor 108b and between the oxide semiconductor 108b and the oxide insulator 108c, it is necessary to form the films successively without exposure to the air by using a multi-chamber deposition apparatus (sputtering apparatus) provided with a load lock chamber.

The oxide semiconductor 108b described in this embodiment is an oxide semiconductor with a low impurity concentration and a low density of defect states (a small number of oxygen vacancies) and can be referred to as a highly purified intrinsic or substantially highly purified intrinsic oxide semiconductor. A highly purified intrinsic or substantially highly purified intrinsic oxide semiconductor has few carrier generation sources, and thus can have a low carrier density. Thus, a transistor in which a channel region is formed in the oxide semiconductor rarely has a negative threshold voltage (is rarely normally on). A highly purified intrinsic or substantially highly purified intrinsic oxide semiconductor has a low density of defect states and accordingly has low density of trap states in some cases. In addition, the highly purified intrinsic or substantially highly purified intrinsic oxide semiconductor has an extremely low off-state current; even when an element has a channel width of $1 \times 10^6$ μm and a channel length (L) of 10 μm, the off-state current can be less than or equal to the measurement limit of a semiconductor parameter analyzer, i.e., less than or equal to $1 \times 10^{-13}$ A, at a voltage (drain voltage) between a source electrode and a drain electrode of 1 V to 10 V.

Accordingly, the transistor in which the channel region is formed in the highly purified intrinsic or substantially highly purified intrinsic oxide semiconductor can have a small change in electrical characteristics and high reliability. Charges trapped by the trap states in the oxide semiconductor take a long time to be released and may behave like fixed charges. Thus, the transistor whose channel region is formed in the oxide semiconductor having a high density of trap states has unstable electrical characteristics in some cases. As examples of the impurities, hydrogen, nitrogen, alkali metal, alkaline earth metal, and the like are given.

Hydrogen contained in the oxide insulator 108a, the oxide semiconductor 108b, and the oxide insulator 108c reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor which contains hydrogen is likely to be normally on. Accordingly, the amount of hydrogen included in the oxide insulator 108a, the oxide semiconductor 108b, and the oxide insulator 108c is preferably as small as possible. Specifically, the hydrogen concentration of the oxide insulator 108a, the oxide semiconductor 108b, and the oxide insulator 108c, which is measured by secondary ion mass spectrometry (SIMS), is lower than or equal to $2 \times 10^{20}$ atoms/cm³, preferably lower than or equal to $5 \times 10^{19}$ atoms/cm³, further preferably lower than or equal to $1 \times 10^{19}$ atoms/cm³, still further preferably lower than or equal to $5 \times 10^{18}$ atoms/cm³, yet further preferably lower than or equal to $1 \times 10^{18}$ atoms/cm³, even further preferably lower than or equal to $5 \times 10^{17}$ atoms/cm³, or further preferably lower than or equal to $1 \times 10^{16}$ atoms/cm³.

When silicon or carbon that is one of elements belonging to Group 14 is contained in the oxide insulator 108a, the oxide semiconductor 108b, and the oxide insulator 108c, oxygen vacancies are increased in the oxide insulator 108a, the oxide semiconductor 108b, and the oxide insulator 108c, and the oxide insulator 108a, the oxide semiconductor 108b, and the oxide insulator 108c have n-type conductivity. Thus, the concentration of silicon or carbon (the concentration is measured by SIMS) in the oxide insulator 108a, the oxide semiconductor 108b, and the oxide insulator 108c or the concentration of silicon or carbon (the concentration is measured by SIMS) in the vicinity of an interface with the oxide insulator 108a or the oxide insulator 108c is set to be lower than or equal to $2 \times 10^{18}$ atoms/cm³, preferably lower than or equal to $2 \times 10^{17}$ atoms/cm³.

In addition, the concentration of alkali metal or alkaline earth metal of the oxide insulator 108a, the oxide semiconductor 108b, and the oxide insulator 108c, which is measured by SIMS, is lower than or equal to $1 \times 10^{18}$ atoms/cm³, preferably lower than or equal to $2 \times 10^{16}$ atoms/cm³. Alkali metal and alkaline earth metal might generate carriers when bonded to an oxide semiconductor, in which case the off-state current of the transistor might be increased. Thus, it is preferable to reduce the concentration of alkali metal or alkaline earth metal in the oxide insulator 108a, the oxide semiconductor 108b, and the oxide insulator 108c.

Further, when containing nitrogen, the oxide insulator 108a, the oxide semiconductor 108b, and the oxide insulator 108c easily become n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set, for example, lower than or equal to $5 \times 10^{18}$ atoms/cm³.

Note that an oxide semiconductor which can be used for the oxide insulator 108a, the oxide semiconductor 108b, and the oxide insulator 108c will be described in detail in Embodiment 2.

Figure 1D:
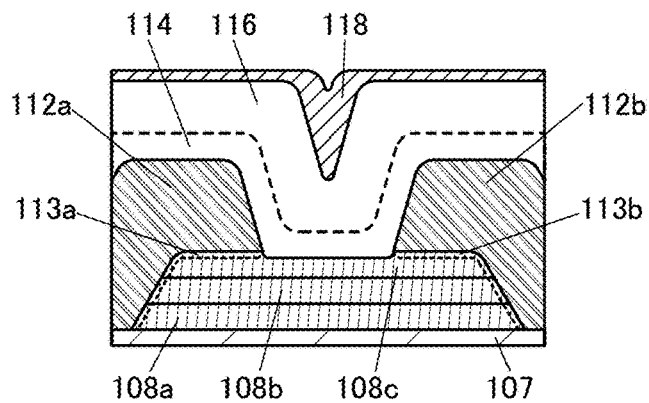
Figure 2:
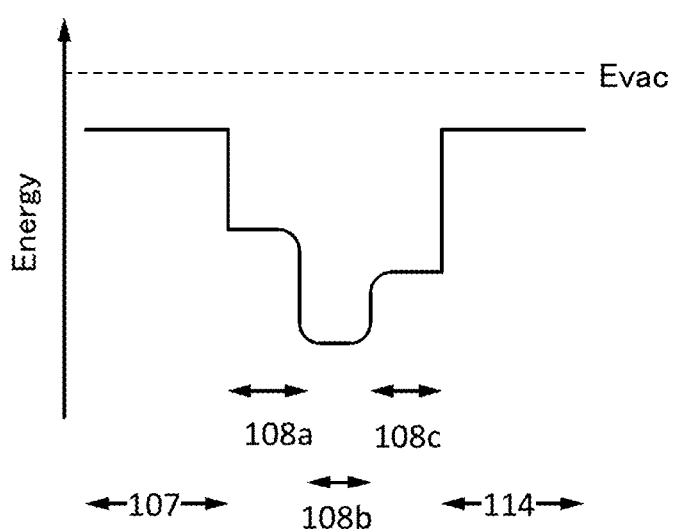
FIG. 2 shows a band structure.

FIG. 1D is an enlarged cross-sectional view illustrating the middle portion of the oxide insulator 108a, the oxide semiconductor 108b, and the oxide insulator 108c and the vicinity of the middle portion. As illustrated in FIGS. 1B and 1D, in regions of the oxide insulator 108a, the oxide semiconductor 108b, and the oxide insulator 108c, which are in contact with the conductors 112a and 112b, (a region surrounded by a dotted line in FIGS. 1B and 1D), the low-resistance regions 113a and 113b are formed in some cases. The low-resistance regions 113a and 113b are mainly formed when oxygen is extracted by the conductors 112a and 112b that are in contact with the oxide insulator 108a, the oxide semiconductor 108b, and the oxide insulator 108c or when a conductive material in the conductor 112a and 112b is bonded to an element in the oxide insulator 108a, the oxide semiconductor 108b, and the oxide insulator 108c. The formation of the low-resistance regions 113a and 113b leads to a reduction in contact resistance between the conductors 112a or 112b and the oxide insulator 108a, between the conductors 112a or 112b and the oxide semiconductor 108b, and between the conductors 112a or 112b and the oxide insulator 108c, whereby the on-state current of the transistor 10 can be increased.

Here, as illustrated in FIG. 1D, the oxide insulator 108c might have a smaller thickness in a region between the conductor 112a and the conductor 112b than in regions overlapping with the conductor 112a and the conductor 112b. This is because part of the top surface of the oxide insulator 108c is removed at the time of the formation of the conductor 112a and the conductor 112b. In formation of the conductor to be the conductor 112a and the conductor 112b, a region with low resistance like the low-resistance regions 113a and 113b is formed on the top surface of the insulator 106c in some cases. By removal of a region of the top surface of the oxide insulator 108c that is positioned between the conductor 112a and the conductor 112b, the channel can be prevented from being formed in the low-resistance region on the top surface of the oxide insulator 108c. With this structure, a change in electrical characteristics of the transistor can be suppressed. In the drawings, even when a thin region is not drawn in an enlarged view or the like, such a thin region might be formed.

With the above structure, the semiconductor device described in this embodiment can have higher field-effect mobility and higher on-state current. The semiconductor device described in this embodiment can also have stable electrical characteristics. Furthermore, in the semiconductor device described in this embodiment, a leakage current in an off state can be reduced.

<Substrate>

There is no particular limitation on the property of a material and the like of the substrate 102 as long as the material has heat resistance enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used as the substrate 102. Still alternatively, any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 102, and the transistor 10 may be provided directly on the flexible substrate. Alternatively, a separation layer may be provided between the substrate 102 and the transistor 10. The separation layer can be used when part or the whole of a semiconductor device formed over the separation layer is separated from the substrate 102 and transferred onto another substrate. In such a case, the transistor 10 can be transferred to a substrate having low heat resistance or a flexible substrate as well.

<Conductor>

The conductor 104 functioning as a gate electrode and the conductors 112a and 112b functioning as a source electrode and a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these elements; a nitride including any of these metal elements; or the like.

Furthermore, the conductors 104, 112a, and 112b may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The conductors 104, 112a, and 112b can be formed using a light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112a, and 112b. Use of a Cu—X alloy film enables the manufacturing cost to be reduced because wet etching process can be used in the processing.

<Insulator>

As each of the insulators 106 and 107 functioning as a gate insulating film of the transistor 10, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulators 106 and 107, an insulating film of a single layer formed using a material selected from the above or an insulating film of three or more layers may be used.

Note that the insulator 107 that is in contact with the oxide insulator 108a in the transistor 10 is preferably an oxide insulating film and preferably includes a region including oxygen in excess of the stoichiometric composition (oxygen excess region). In other words, the insulator 107 is preferably an insulating film capable of releasing oxygen. In order to provide the oxygen excess region in the insulator 107, the insulator 107 is formed in an oxygen atmosphere, for example. Alternatively, the oxygen excess region may be formed by introduction of oxygen into the insulator 107 after the deposition. As a method for introducing oxygen, an ion implantation method, an ion doping method, a plasma immersion ion implantation method, plasma treatment, or the like may be employed.

In the case where hafnium oxide is used for the insulator 107, the following effect is attained. Hafnium oxide has a higher dielectric constant than silicon oxide and silicon oxynitride. Therefore, the insulator 107 using hafnium oxide can have a larger thickness than the insulator 107 using silicon oxide; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

In this embodiment, a silicon nitride film is formed as the insulator 106, and a silicon oxide film is formed as the insulator 107. The silicon nitride film has a higher dielectric constant than a silicon oxide film and needs a larger thickness for capacitance equivalent to that of the silicon oxide film. Thus, when the silicon nitride film is included in the gate insulating film of the transistor, the physical thickness of the insulating film can be increased. Thus, the electrostatic breakdown of the transistor 10 can be prevented by inhibiting a reduction in the withstand voltage of the transistor 10 and improving the withstand voltage of the transistor 10.

The insulators 114, 116, and 118 function as a protective insulating film. The insulators 114 and 116 include oxygen, and the insulator 118 includes nitrogen. Furthermore, the insulator 114 is an insulating film that allows oxygen to pass through. Note that the insulator 114 has a function of relieving damage to the oxide insulator 108c when the insulator 116 is formed.

The insulators 114 and 116 each include a region containing oxygen in excess of that in the stoichiometric composition (oxygen excess region). In other words, the insulators 114 and 116 are each an insulating film capable of releasing oxygen. Note that the oxygen excess region is formed in each of the insulators 114 and 116 in such a manner that oxygen is added to the insulators 114 and 116 after the deposition, for example. An ion implantation method, an ion doping method, a plasma immersion ion implantation method, plasma treatment, or the like can be used as a method for adding oxygen. Note that for the above plasma treatment, an apparatus with which an oxygen gas is made to be plasma by high-frequency power (also referred to as a plasma etching apparatus or a plasma ashing apparatus) is preferably used.

The amount of released oxygen can be found by measuring an insulating film by thermal desorption spectroscopy (TDS). For example, the amount of released oxygen molecules from the insulators 114 and 116 is more than or equal to $8.0\times10^{14}/cm^2$, preferably more than or equal to $1.0\times10^{15}/cm^2$, and further preferably more than or equal to $1.5\times10^{15}/cm^2$ by TDS. Note that the surface temperature of the films in TDS is higher than or equal to 100° C. and lower than or equal to 700° C., preferably higher than or equal to 100° C. and lower than or equal to 500° C.

A silicon oxide film or a silicon oxynitride film with a thickness greater than or equal to 5 nm and less than or equal to 150 nm, preferably greater than or equal to 5 nm and less than or equal to 50 nm can be used as the insulator 114.

Further, it is preferable that the amount of defects in the oxide insulator 114 be small; as a typical example, the spin density of a signal that appears at g=2.001 due to a dangling bond of silicon is preferably lower than or equal to $3\times10^{17}$ spins/cm$^3$ by electron spin resonance (ESR) measurement. This is because if the density of defects in the insulator 114 is high, oxygen is bonded to the defects and the amount of oxygen that passes through the insulator 114 is decreased.

Note that all oxygen entering the insulator 114 from the outside does not move to the outside of the insulator 114 and some oxygen remains in the insulator 114. In addition, oxygen enters the insulator 114 and oxygen contained in the insulator 114 is moved to the outside of the insulator 114, whereby movement of oxygen in the insulator 114 occurs in some cases. When an oxide insulating film that allows oxygen to pass through is formed as the insulator 114, oxygen released from the insulator 116 provided over the insulator 114 can be moved to the oxide insulator 108a, the oxide semiconductor 108b, and the oxide insulator 108c through the insulator 114.

Note that the insulator 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases a small amount of nitrogen oxide is a film of which the amount of released ammonia is larger than the amount of released nitrogen oxide in thermal desorption spectroscopy analysis; the amount of released ammonia is typically greater than or equal to $1\times10^{18}/cm^3$ and less than or equal to $5\times10^{19}/cm^3$. Note that the amount of released ammonia is the amount of ammonia released by heat treatment with which the surface temperature of the film becomes a temperature higher than or equal to 50° C. and lower than or equal to 650° C., or preferably higher than or equal to 50° C. and lower than or equal to 550° C.

Nitrogen oxide (NO$_x$; x is greater than or equal to 0 and less than or equal to 2, preferably greater than or equal to 1 and less than or equal to 2), typically NO$_2$ or NO, forms levels in the insulator 114, for example. The level is positioned in the energy gap of the oxide semiconductor. Therefore, when nitrogen oxide is diffused to the vicinity of the interface between the insulator 114 and the oxide insulator 108c, an electron is in some cases trapped by the level on the insulator 114 side. As a result, the trapped electron remains in the vicinity of the interface between the insulator 114 and the oxide insulator 108c; thus, the threshold voltage of the transistor is shifted in the positive direction.

Nitrogen oxide reacts with ammonia and oxygen in heat treatment. Since nitrogen oxide contained in the insulator 114 reacts with ammonia contained in the insulator 116 in heat treatment, nitrogen oxide contained in the insulator 114 is reduced. Therefore, an electron is hardly trapped at the vicinity of the interface between the oxide insulator 114 and the oxide insulator 108c.

By using such an oxide insulating film, the insulator 114 can reduce the shift in the threshold voltage of the transistor, which leads to a smaller change in the electrical characteristics of the transistor.

Note that heat treatment of a manufacturing process of the transistor, typically heat treatment at a temperature higher than or equal to 300° C. and lower than the strain point of the substrate, allows the insulator 114 to give a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 in an ESR spectrum at 100 K or lower. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and smaller than or equal to 2.039, the second signal that appears at a g-factor of greater than or equal to 2.001 and smaller than or equal to 2.003, and the third signal that appears at a g-factor of greater than or equal to 1.964 and smaller than or equal to 1.966 correspond to signals attributed to nitrogen oxide (NO$_x$; is greater than or equal to 0 and smaller than or equal to 2, preferably greater than or equal to 1 and smaller than or equal to 2). Typical examples of nitrogen oxide include nitrogen monoxide and nitrogen dioxide. In other words, the lower the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the smaller amount of nitrogen oxide the oxide insulating film contains.

The concentration of nitrogen of the above oxide insulating film measured by SIMS is lower than or equal to $6 \times 10^{20}$ atoms/cm$^3$.

The above oxide insulating film is formed by a PECVD method at a substrate temperature higher than or equal to 220° C., higher than or equal to 280° C., or higher than or equal to 350° C. using silane and dinitrogen monoxide, whereby a dense and hard film can be formed.

A silicon oxide film or a silicon oxynitride film with a thickness greater than or equal to 30 nm and less than or equal to 500 nm, preferably greater than or equal to 50 nm and less than or equal to 400 nm can be used as the insulator 116.

It is preferable that the number of defects in the insulator 116 be small, and typically the spin density corresponding to a signal which appears at g=2.001 due to a dangling bond of silicon be lower than $1.5 \times 10^{18}$ spins/cm$^3$, or further preferably lower than or equal to $1 \times 10^{18}$ spins/cm$^3$ by ESR measurement. Note that the insulator 116 is provided more apart from the oxide insulator 108a, the oxide semiconductor 108b, and the oxide insulator 108c than the insulator 114 is; thus, the insulator 116 may have higher defect density than the insulator 114.

Further, the insulators 114 and 116 can be formed using insulating films formed of the same kinds of materials; thus, a boundary between the insulators 114 and 116 cannot be clearly observed in some cases. Thus, in this embodiment, the boundary between the insulators 114 and 116 is shown by a dashed line. Although a two-layer structure of the insulators 114 and 116 is described in this embodiment, the present invention is not limited to this structure. For example, a single-layer structure of either one of the insulators 114 and 116 may be employed.

The insulator 118 includes nitrogen. Alternatively, the insulator 118 includes nitrogen and silicon. The insulator 118 has a function of blocking oxygen, hydrogen, water, alkali metal, alkaline earth metal, or the like. It is possible to prevent outward diffusion of oxygen from the oxide insulator 108a, the oxide semiconductor 108b, and the oxide insulator 108c, outward diffusion of oxygen included in the insulators 114 and 116, and entry of hydrogen, water, or the like into the oxide insulator 108a, the oxide semiconductor 108b, and the oxide insulator 108c from the outside by providing the insulator 118. A nitride insulating film, for example, can be used as the insulator 118. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

Note that the above-described various films such as the conductive films, the insulating films, and the oxide semiconductor film can be formed by a sputtering method, a chemical vapor deposition (CVD) method, a vacuum evaporation method, a pulsed laser deposition (PLD) method, or the like. Alternatively, the above-described various films can be formed by a plasma enhanced chemical vapor deposition (PECVD) method, a thermal CVD method, or an atomic layer deposition (ALD) method. As an example of a thermal CVD method, a metal organic chemical vapor deposition (MOCVD) method can be given. Further alternatively, the above-described various films can be formed by a coating method or a printing method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor film, and the metal oxide film in this embodiment can be formed by an ALD method or a thermal CVD method such as an MOCVD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor compound (hafnium alkoxide or hafnium amide such as tetrakis(dimethylamide) hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced a plurality of times to form an initial tungsten film, and then a $WF_6$ gas and an $H_2$ gas are alternately introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed with a deposition apparatus using an ALD method, an $In(CH_3)_3$ gas and an $O_3$ gas are sequentially introduced plural times to form an In—O layer, a $Ga(CH_3)_3$ gas and an $O_3$ gas are sequentially introduced plural times to form a GaO layer, and then a $Zn(CH_3)_2$ gas and an $O_3$ gas are sequentially introduced plural times to form a ZnO layer. Note that the order of these layers is not limited to this example. A mixed compound layer such as an In—Ga—O layer, an In—Zn—O layer, or a Ga—Zn—O layer may be formed by mixing these gases. Note that although an $H_2O$ gas which is obtained by bubbling water with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

<Modified Example of Semiconductor Device>

Next, modification examples of the transistor 10 are described below with reference to FIGS. 3A to 3D, FIG. 4, and FIGS. 5A to 5D. FIGS. 3A to 3D, FIGS. 4A and 4B, and FIGS. 5A to 5D are cross-sectional views of transistors in the channel length direction and those in the channel width direction like FIGS. 1B and 1C.

Figure 3A:
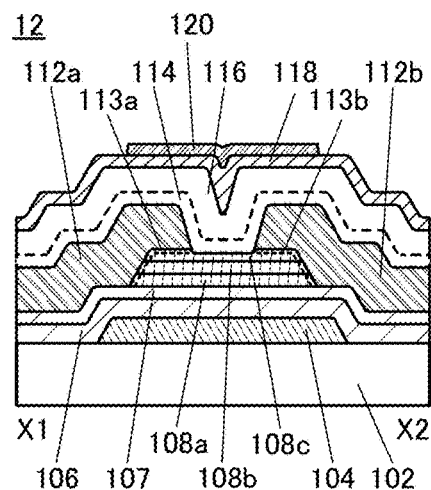
FIGS. 3A to 3D are cross-sectional views illustrating embodiments of a semiconductor device.
Figure 3B:
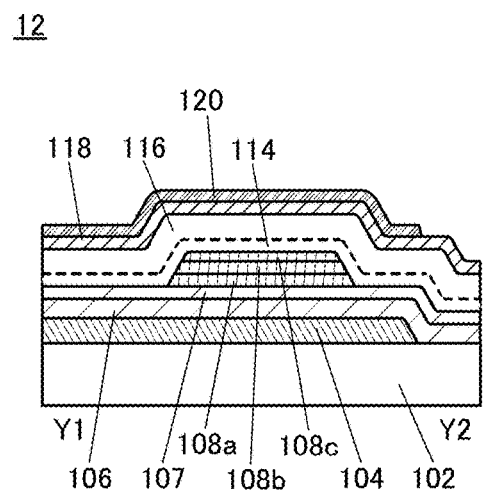

A transistor 12 illustrated in FIGS. 3A and 3B differs from the transistor 10 in that a conductor 120 is formed over the insulator 118 to overlap with at least part of the oxide insulator 108c. Note that the conductor 120 serves as a second gate electrode (also referred to as a back gate electrode) of the transistor 12. The conductor 120 can control the threshold voltage of the transistor 12. The insulators 114, 116, and 118 serves as a second gate insulating film of the transistor 12. The conductor 120 can be formed using a conductor used for the conductor 104.

Figure 3C:
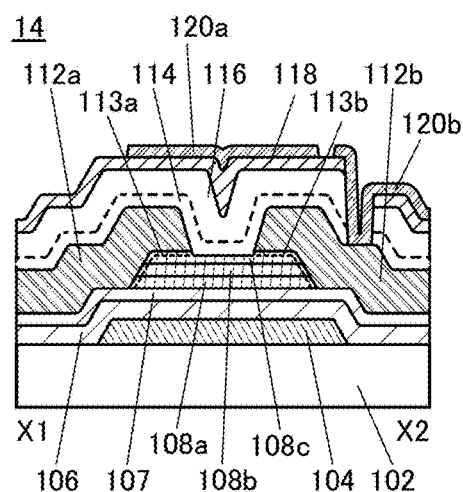
Figure 3D:
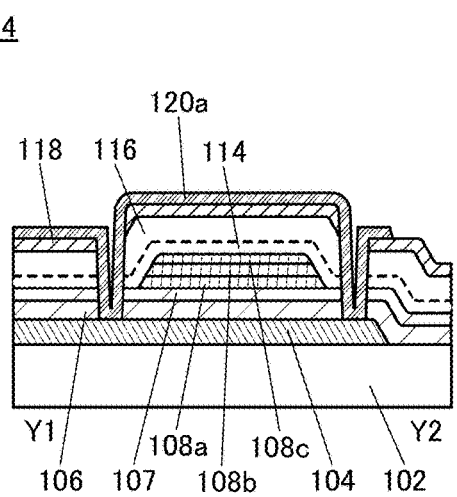

A transistor 14 illustrated in FIGS. 3C and 3D differs from the transistor 10 in that a conductor 120a is formed over the insulator 118 to overlap with at least part of the oxide insulator 108c and in that a conductor 120b is formed over the insulator 118. The conductor 120a is connected to the conductor 104 through an opening formed in the insulators 106, 107, 114, 116, and 118. The conductor 120a and the conductor 104 are supplied with the same potential. The conductor 120b is connected to the conductor 112b through an opening formed in the insulators 114, 116, and 118.

Here, the conductor 120a functions as a second gate electrode (also referred to as a back gate electrode) of the transistor 14. The insulators 114, 116, and 118 function as a second gate insulating film of the transistor 14. The conductor 120b functions as, for example, a pixel electrode used in a display device.

Note that although a structure in which two openings are formed on both sides of the oxide insulator 108a, the oxide semiconductor 108b, and the oxide insulator 108c in a channel width direction to connect the conductor 120a and the conductor 104 to each other in the transistor 14 is exemplified, one embodiment of the present invention is not limited thereto. For example, one of the openings may be formed to connect the conductor 120a and the conductor 104 to each other.

The oxide insulator 108a, the oxide semiconductor 108b, and the oxide insulator 108c are positioned to face the conductor 104 serving as a first gate electrode and the conductor 120a serving as the second gate electrode and interposed between the two conductive films each serving as the gate electrode. It is preferable that the lengths of the conductor 120a serving as the second gate electrode in the channel length direction and the channel width direction be substantially the same as or larger than those of each of the oxide insulator 108a, the oxide semiconductor 108b, and the oxide insulator 108c. Furthermore, it is preferable that side surfaces of the oxide insulator 108a, the oxide semiconductor 108b, and the oxide insulator 108c in the channel width direction face the conductor 120a serving as the second gate electrode with the insulators 114, 116, and 118 interposed therebetween. That is, it is preferable that the top surfaces of the oxide insulator 108a, the oxide semiconductor 108b, and the oxide insulator 108c and the side surfaces thereof in the channel width direction be surrounded by the conductor 120a.

With this structure, the oxide insulator 108a, the oxide semiconductor 108b, and the oxide insulator 108c can be electrically surrounded by electric fields of the conductor 104 serving as the first gate electrode and the conductor 120a serving as the second gate electrode. A device structure of a transistor, like that of the transistor 14, in which electric fields of the first gate electrode and the second gate electrode electrically surround an oxide semiconductor film where a channel region is formed can be referred to as a surrounded channel (s-channel) structure.

Since the transistor 14 has the s-channel structure, electric fields for inducing a channel can be effectively applied to the oxide insulator 108a, the oxide semiconductor 108b, and the oxide insulator 108c by the conductive film 104 serving as the first gate electrode and the conductor 120a serving as the second gate electrode; therefore, the current drive capability of the transistor 14 can be improved and high on-state current characteristics can be obtained.

Figure 4A:
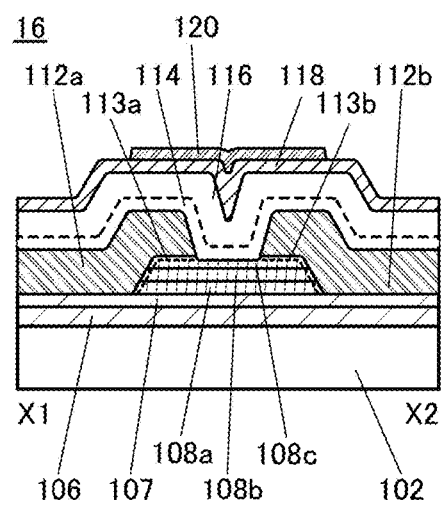
FIGS. 4A and 4B are cross-sectional views illustrating one embodiment of a semiconductor device.
Figure 4B:
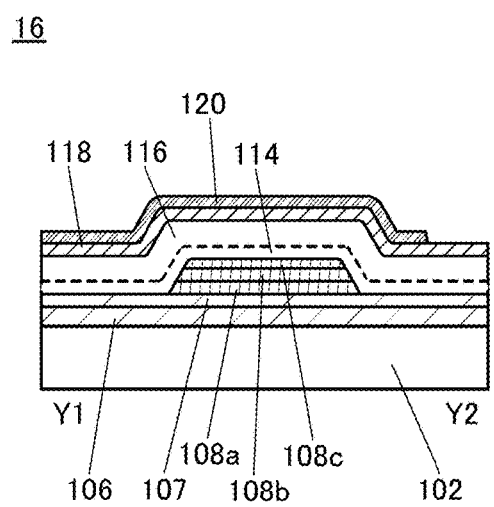

A transistor 16 illustrated in FIGS. 4A and 4B differs from the transistor 12 in that the conductor 104 is not provided. In this case, the conductor 120 serves as a gate electrode of the transistor 16, and the insulators 114, 116, and 118 serve as a gate insulating film of the transistor 16. That is, the transistor 16 is a top-gate transistor having a single-gate structure. Although the oxide insulator 108a, the oxide semiconductor 108b, and the oxide insulator 108c are stacked in this order in FIGS. 4A and 4B, the oxide insulator 108c, the oxide semiconductor 108b, and the oxide insulator 108a may be stacked in this order.

Although the side edge portions of the oxide insulator 108a and the oxide semiconductor 108b are substantially aligned with each other and the side edge portions of the oxide semiconductor 108b and the oxide insulator 108c are substantially aligned with each other in the transistor 10, the structure of any of the transistors in this embodiment is not limited thereto. A transistor 18 illustrated in FIGS. 5A and 5B differs from the transistor 10 in that the side edge portions of the oxide insulator 108c are positioned on an inner side than those of the oxide semiconductor 108b and in that the conductors 112a and 112b are in contact with part of top surfaces of the oxide semiconductor 108b and the oxide insulator 108c. With this structure, the conductors 112a and 112b are in direct contact with at least part of the top surface of the oxide semiconductor 108b, so that on-state current of the transistor 18 can be increased.

Although the conductors 112a and 112b are in contact with part of the top surface of the oxide insulator 108c in the transistor 10, the structure of any of the transistors in this embodiment is not limited thereto. A transistor 20 illustrated in FIGS. 5C and 5D differs from the transistor 10 in that at least part of a bottom surface of the oxide insulator 108c is in contact with the conductors 112a and 112b and in that the conductors 112a and 112b are in contact with at least part of the top surface of the oxide semiconductor 108b. With this structure, the conductors 112a and 112b are in direct contact with at least part of the top surface of the oxide semiconductor 108b, so that on-state current of the transistor 20 can be increased.

In the transistor 20, a region of the oxide semiconductor 108b between the conductors 112a and 112b may have a smaller thickness than a region of the oxide semiconductor 108b, which overlaps with the conductors 112a and 112b. With this structure, a channel can be prevented from being formed in a low-resistance region of the top surface of the oxide semiconductor 108b, so that a change in electrical characteristics of the transistor can be suppressed.

Figure 5A:
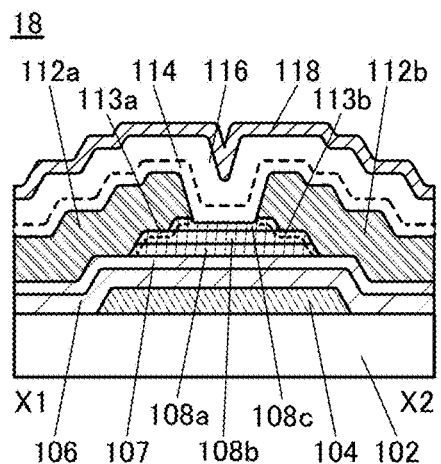
FIGS. 5A to 5D are cross-sectional views illustrating embodiments of a semiconductor device.
Figure 5B:
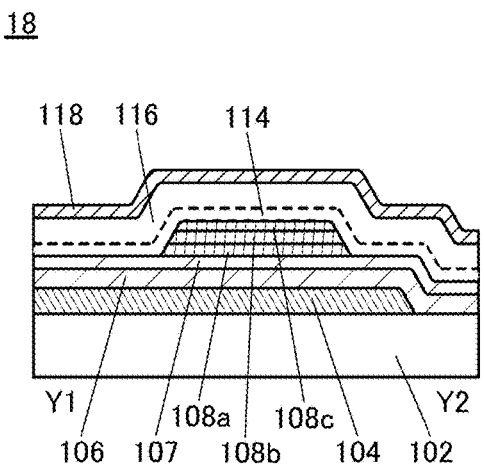
Figure 5C:
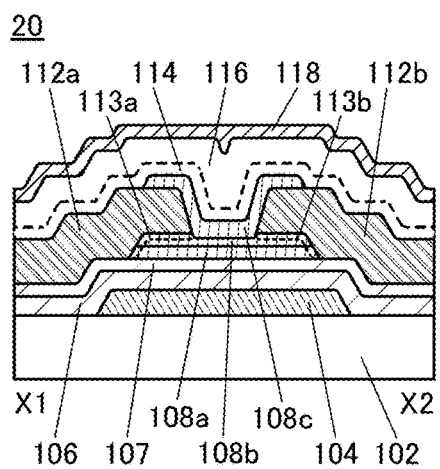
Figure 5D:
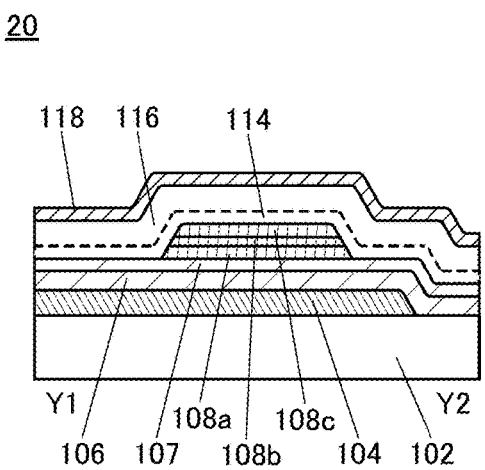

Note that although the oxide insulator 108c is patterned to substantially overlap with the oxide semiconductor 108b in the transistor 20 illustrated in FIGS. 5C and 5D, the structure of the transistor 20 is not limited thereto. For example, the oxide insulator 108c may cover the conductors 112a and 112b. This structure can inhibit extraction of oxygen from the insulator 114 at the top surfaces of the conductors 112a and 112b. Accordingly, the conductors 112a and 112b can be prevented from being partly oxidized to have increased resistivity, and oxygen can be effectively supplied from the insulator 114 to the oxide insulator 108a, the oxide semiconductor 108b, and the oxide insulator 108c.

Note that the structure of each transistor described above can be combined with each other as appropriate.

With the above structure, the semiconductor device described in this embodiment can have higher field-effect mobility and higher on-state current. The semiconductor device described in this embodiment can also have stable electrical characteristics. Furthermore, in the semiconductor device described in this embodiment, a leakage current in an off state can be reduced.

<Method for Manufacturing Semiconductor Device>

Next, a method for manufacturing the transistor 10 which is a semiconductor device of an embodiment of the present invention will be described with reference to FIGS. 6A to 6C, FIGS. 7A to 7C, FIGS. 8A to 8C, and FIGS. 9A and 9B. Note that FIGS. 6A to 6C, FIGS. 7A to 7C, FIGS. 8A to 8C, and FIGS. 9A and 9B are cross-sectional views illustrating a method for manufacturing the semiconductor device and correspond to cross sections in the channel length direction of the transistor 10 as in FIG. 1B.

Figure 6A:
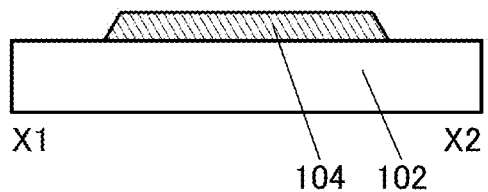
FIGS. 6A to 6C are cross-sectional views illustrating an example of a manufacturing process of a semiconductor device.

First, a conductor is formed over the substrate 102 and processed through a lithography process and an etching process, whereby the conductor 104 functioning as a gate electrode is formed (see FIG. 6A).

In this embodiment, a glass substrate is used as the substrate 102, and as the conductor 104 functioning as a gate electrode, a 100-nm-thick tungsten film can be formed by a sputtering method.

Figure 6B:
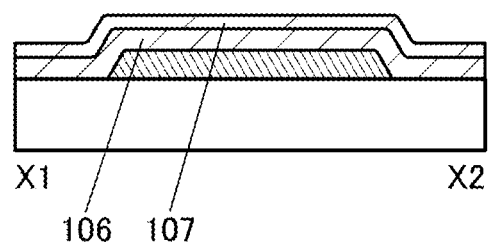

Then, the insulators 106 and 107 functioning as a gate insulating film are formed over the conductor 104 (see FIG. 6B).

In this embodiment, for example, a 400-nm-thick silicon nitride film as the insulator 106 and a 50-nm-thick silicon oxynitride film as the insulator 107 can be formed by a PECVD method.

The insulator 106 has a stacked-layer structure of silicon nitride films. Specifically, the insulator 106 can have a three-layer stacked-layer structure of a first silicon nitride film, a second silicon nitride film, and a third silicon nitride film. An example of the three-layer stacked-layer structure is as follows.

For example, the first silicon nitride film can be formed to have a thickness of 50 nm under the condition where silane at a flow rate of 200 sccm, nitrogen at a flow rate of 2000 sccm, and an ammonia gas at a flow rate of 100 sccm are supplied as a source gas to a reaction chamber of a PE-CVD apparatus; the pressure in the reaction chamber is controlled to 100 Pa, and a power of 2000 W is supplied using a 27.12 MHz high-frequency power source.

The second silicon nitride film can be formed to have a thickness of 300 nm under the condition where silane at a flow rate of 200 sccm, nitrogen at a flow rate of 2000 sccm, and an ammonia gas at a flow rate of 2000 sccm are supplied as a source gas to the reaction chamber of the PECVD apparatus; the pressure in the reaction chamber is controlled to 100 Pa, and a power of 2000 W is supplied using a 27.12 MHz high-frequency power source.

The third silicon nitride film can be formed to have a thickness of 50 nm under the condition where silane at a flow rate of 200 sccm and nitrogen at a flow rate of 5000 sccm are supplied as a source gas to the reaction chamber of the PECVD apparatus; the pressure in the reaction chamber is controlled to 100 Pa, and a power of 2000 W is supplied using a 27.12 MHz high-frequency power source.

Note that the first silicon nitride film, the second silicon nitride film, and the third silicon nitride film can be each formed at a substrate temperature of 350° C.

When the insulator 106 has the three-layer structure of silicon nitride films, for example, in the case where a conductive film including copper (Cu) is used as the conductor 104, the following effect can be obtained.

The first silicon nitride film can inhibit diffusion of a copper (Cu) element from the conductor 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

The insulator 107 is preferably an insulating film including oxygen to improve characteristics of an interface with the oxide insulator 108a formed later.

Figure 6C:
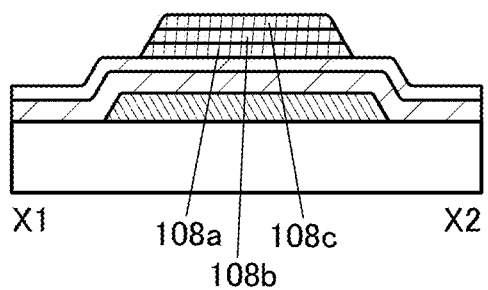
Figure 7A:
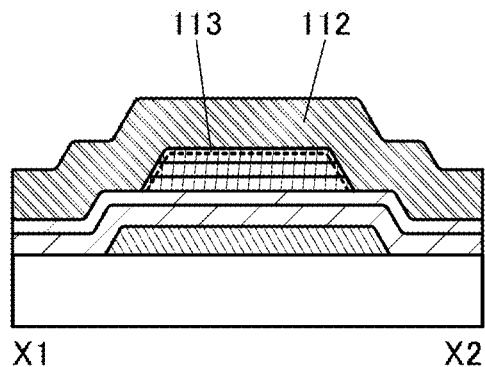
FIGS. 7A to 7C are cross-sectional views illustrating an example of a manufacturing process of a semiconductor device.
Figure 7B:
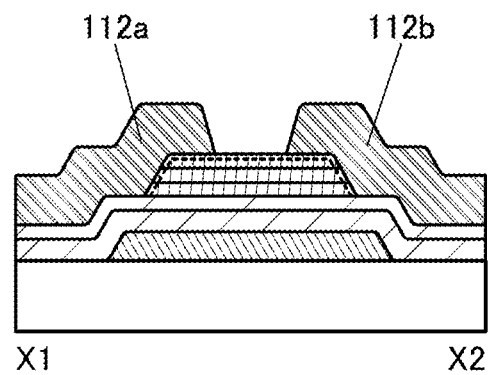
Figure 7C:
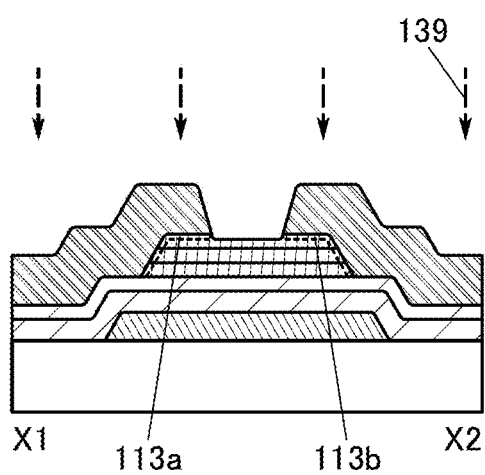

Next, an oxide semiconductor which is to be the oxide semiconductor 108b and oxide insulators which are to be the oxide insulator 108a and the oxide insulator 108c are formed over the insulator 107 and processed through a lithography process and an etching process to form the oxide insulator 108a, the oxide semiconductor 108b, and the oxide insulator 108c (see FIG. 6C).

In this embodiment, for example, an oxide insulator which is to be the oxide insulator 108a is formed using a Ga—Zn metal oxide target with an atomic ratio of Ga:Zn=2:1 by a sputtering method, an oxide semiconductor which is to be the oxide semiconductor 108b is formed using an In—Ga metal oxide target with an atomic ratio of In:Ga=2:1 by a sputtering method, and an oxide insulator which is to be the oxide insulator 108c is formed using an In—Ga—Zn metal oxide target with an atomic ratio of In:Ga:Zn=1:1:1.2 by a sputtering method.

Note that although the oxide semiconductor which is to be the oxide semiconductor 108b and the oxide insulators which are to be the oxide insulators 108a and 108c are formed successively and processed to form the oxide insulator 108a, the oxide semiconductor 108b, and the oxide insulator 108c at a time in the above, a method for manufacturing a semiconductor device in this embodiment is not limited thereto, and deposition, a lithography process, and etching may be performed on the oxide semiconductor and the oxide insulators as appropriate. For example, in the case of forming the transistor 20 illustrated in FIGS. 5C and 5D, an oxide insulator which is to be the oxide insulator 108a and an oxide semiconductor which is to be the oxide semiconductor 108b are formed successively and processed to form the oxide insulator 108a and the oxide semiconductor 108b, and the conductors 112a and 112b are formed, and then an oxide insulator which is to be the oxide insulator 108c is formed and processed to form the oxide insulator 108c.

In the case where the oxide semiconductor film or the like is formed by a sputtering method, a rare gas (typically argon), oxygen, or a mixed gas of a rare gas and oxygen is used as a sputtering gas, as appropriate. In the case of using the mixed gas of a rare gas and oxygen, the proportion of oxygen to a rare gas is preferably increased. In addition, increasing the purity of a sputtering gas is necessary. For example, as an oxygen gas or an argon gas used for a sputtering gas, a gas that is highly purified to have a dew point of −60° C. or lower, further preferably −100° C. or lower is used, whereby entry of moisture or the like into the oxide insulator 108a, the oxide semiconductor 108b, and the oxide insulator 108c can be minimized.

When the oxide insulator 108a, the oxide semiconductor 108b, and the oxide insulator 108c are formed by a sputtering method, each chamber of a sputtering apparatus is preferably evacuated to a high vacuum (to the degree of approximately $5\times10^{-7}$ Pa to $1\times10^{-4}$ Pa) by an adsorption vacuum pump such as a cryopump so that water and the like acting as impurities for the oxide insulator 108a, the oxide semiconductor 108b, and the oxide insulator 108c are removed as much as possible. Alternatively, a turbo molecular pump and a cold trap are preferably combined so as to prevent a backflow of a gas, especially a gas containing carbon or hydrogen from an exhaust system to the inside of the chamber.

After the oxide insulator 108a, the oxide semiconductor 108b, and the oxide insulator 108c are formed, heat treatment may be performed at a temperature higher than or equal to 150° C. and lower than the strain point of the substrate, preferably higher than or equal to 200° C. and lower than or equal to 450° C., further preferably higher than or equal to 300° C. and lower than or equal to 450° C. The heat treatment performed here serves as one kind of treatment for increasing the purity of the oxide semiconductor film and can reduce hydrogen, water, and the like contained in the oxide insulator 108a, the oxide semiconductor 108b, and the oxide insulator 108c. Note that the heat treatment for the purpose of reducing hydrogen, water, and the like may be performed before the oxide insulator 108a, the oxide semiconductor 108b, and the oxide insulator 108c are processed into island shapes.

A gas baking furnace, an electric furnace, an RTA apparatus, or the like can be used for the heat treatment performed on the oxide insulator 108a, the oxide semiconductor 108b, and the oxide insulator 108c. With the use of an RTA apparatus, the heat treatment can be performed at a temperature higher than or equal to the strain point of the substrate if the heating time is short. Therefore, the heat treatment time can be shortened.

The heat treatment performed on the oxide insulator 108a, the oxide semiconductor 108b, and the oxide insulator 108c may be performed in an atmosphere of nitrogen gas, oxygen gas, clean dry air (also referred to as CDA, which is an air with a water content of 20 ppm or less, preferably 1 ppm or less, further preferably 10 ppb or less), or rare gas (e.g., argon or helium). The atmosphere of nitrogen gas, oxygen gas, CDA, or rare gas preferably does not contain hydrogen, water, and the like.

The purity of the nitrogen gas, the oxygen gas, or CDA is preferably increased, for example. Specifically, the purity of the nitrogen gas, the oxygen gas, or CDA is preferably 6N (99.9999%) or 7N (99.99999%). When a gas which is highly purified to have a dew point of −60° C. or lower, preferably −100° C. or lower, is used as the nitrogen gas, the oxygen gas, or CDA, entry of moisture and the like into the oxide insulator 108a, the oxide semiconductor 108b, and the oxide insulator 108c can be minimized.

Furthermore, the oxide insulator 108a, the oxide semiconductor 108b, and the oxide insulator 108c may be subjected to another heat treatment in an oxygen atmosphere or a CDA atmosphere after the heat treatment in a nitrogen atmosphere or a rare gas atmosphere. As a result, hydrogen, water, and the like can be released from the oxide insulator 108a, the oxide semiconductor 108b, and the oxide insulator 108c and oxygen can be supplied to the oxide insulator 108a, the oxide semiconductor 108b, and the oxide insulator 108c at the same time. Consequently, the amount of oxygen vacancies in the oxide insulator 108a, the oxide semiconductor 108b, and the oxide insulator 108c can be reduced.

Here, thermal profiles of heat treatment performed on the oxide insulator 108a, the oxide semiconductor 108b, and the oxide insulator 108c in a gas baking furnace will be described with reference to FIGS. 10A and 10B and FIGS. 11A and 11B. FIGS. 10A and 10B and FIGS. 11A and 11B each show a thermal profile of heat treatment in a gas baking furnace.

Note that each of FIGS. 10A and 10B and FIGS. 11A and 11B is a thermal profile showing the temperature raised to a predetermined temperature (here, 450° C.; hereinafter referred to as a first temperature) and dropped to a predetermined temperature (here, higher than or equal to room temperature and lower than or equal to 150° C.; hereinafter referred to as a second temperature).

Figure 10A:
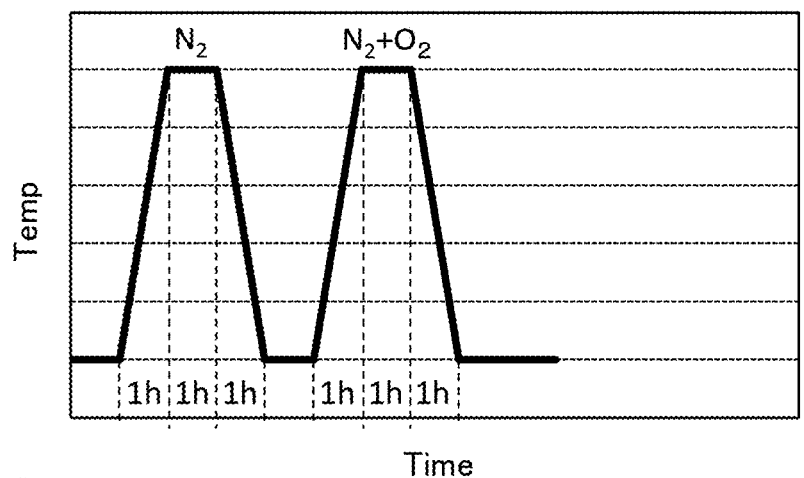
FIGS. 10A and 10B each show a thermal profile of heat treatment in a gas baking furnace.

When the oxide insulator 108a, the oxide semiconductor 108b, and the oxide insulator 108c are subjected to heat treatment, the treatment can be divided into two steps using two kinds of gases as shown in FIG. 10A. In the heat treatment on the oxide insulator 108a, the oxide semiconductor 108b, and the oxide insulator 108c, as shown in FIG. 10A, the oxide insulator 108a, the oxide semiconductor 108b, and the oxide insulator 108c can be processed in two steps using two kinds of gases. For example, a nitrogen gas is introduced into a gas baking furnace in the first step. Then, the temperature is raised to the first temperature over one hour, and the heat treatment is performed at the first temperature for another one hour. After that, the temperature is dropped to the second temperature over the next one hour. In the second step, the nitrogen gas is replaced by a mixed gas of nitrogen and oxygen. Then, the temperature is raised to the first temperature over one hour, and the heat treatment is performed at the first temperature for another one hour. After that, the temperature is dropped to the second temperature over the next one hour.

Figure 10B:
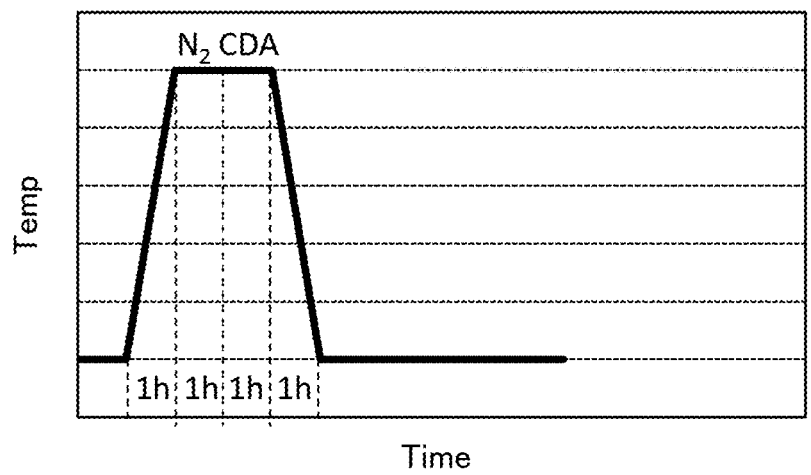

Alternatively, when the oxide insulator 108a, the oxide semiconductor 108b, and the oxide insulator 108c are subjected to heat treatment, the treatment can be performed in one step using two kinds of gases as shown in FIG. 10B. For example, at first, a nitrogen gas is introduced into a gas baking furnace. Then, the temperature is raised to the first temperature over one hour, and the heat treatment is performed at the first temperature for another one hour. After that, the gas is changed from the nitrogen gas to CDA. After the gas change, the heat treatment is performed for another one hour, and the temperature is dropped to the second temperature over the next one hour.

The thermal profile of the heat treatment in the gas baking furnace shown in FIG. 10B requires less processing time than the thermal profile of the heat treatment in the gas baking furnace shown in FIG. 10A; accordingly, semiconductor devices can be provided with higher productivity.

Figure 11A:
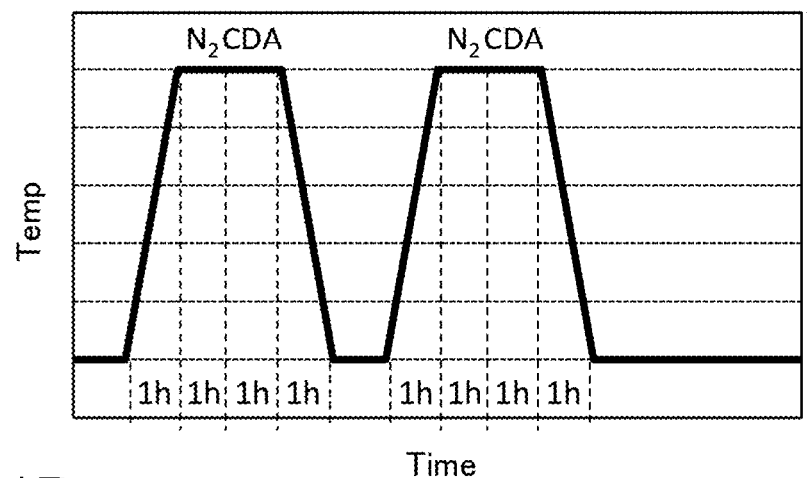
FIGS. 11A and 11B each show a thermal profile of heat treatment in a gas baking furnace.

Alternatively, when the oxide insulator 108a, the oxide semiconductor 108b, and the oxide insulator 108c are subjected to heat treatment, the treatment can be performed in two steps using two kinds of gases as shown in FIG. 11A. For example, first, a nitrogen gas is introduced into a gas baking furnace in the first step. Then, the temperature is raised to the first temperature over one hour, and the heat treatment is performed at the first temperature for another one hour. After that, the gas is changed from the nitrogen gas to CDA. After the gas change, the heat treatment is performed for another one hour, and the temperature is dropped to the second temperature over the next one hour. In the second step, CDA is replaced by a nitrogen gas. Then, the temperature is raised to the first temperature over one hour, and the heat treatment is performed at the first temperature for another one hour. After that, the gas is changed from the nitrogen gas to CDA. After the gas change, the heat treatment is performed for another one hour, and the temperature is dropped to the second temperature over the next one hour.

Figure 11B:
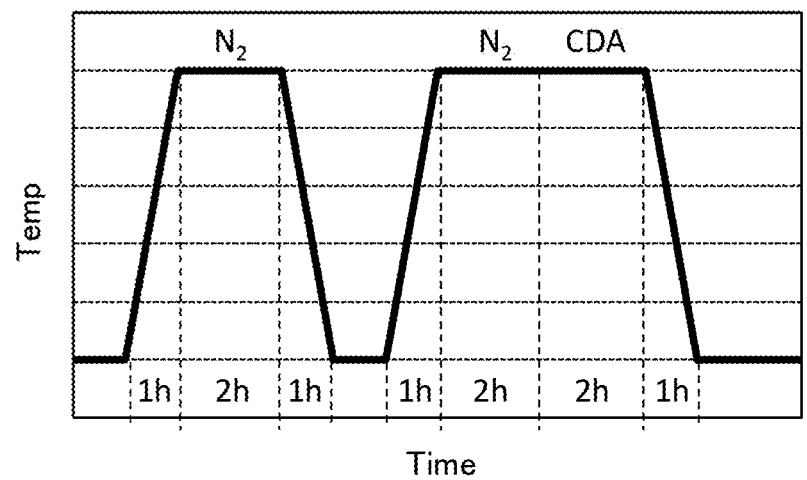

Alternatively, when the oxide insulator 108a, the oxide semiconductor 108b, and the oxide insulator 108c are subjected to heat treatment, the treatment can be performed in two steps using two kinds of gases as shown in FIG. 11B. For example, first, a nitrogen gas is introduced into a gas baking furnace in the first step. Then, the temperature is raised to the first temperature over one hour, and the heat treatment is performed at the first temperature for two hours. After that, the temperature is dropped to the second temperature over the next one hour. In the second step, the temperature is raised to the first temperature over one hour, and the heat treatment is performed at the first temperature for two hours. After that, the gas is changed from the nitrogen gas to CDA. After the gas change, the heat treatment is performed for another two hours, and then the temperature is dropped to the second temperature over the next one hour.

As far as the thermal profiles of heat treatment performed on the oxide insulator 108a, the oxide semiconductor 108b, and the oxide insulator 108c in a gas baking furnace are concerned, it is preferable that the oxide insulator 108a, the oxide semiconductor 108b, and the oxide insulator 108c be first heated in a nitrogen gas as shown in FIGS. 10A and 10B and FIGS. 11A and 11B.

When the oxide insulator 108a, the oxide semiconductor 108b, and the oxide insulator 108c are first heated in a nitrogen gas, oxygen, which is one of the principal components of the oxide insulator 108a, the oxide semiconductor 108b, and the oxide insulator 108c, and hydrogen in the oxide insulator 108a, the oxide semiconductor 108b, and the oxide insulator 108c react with each other to form an OH group. Then, the OH group is released from the surfaces of the oxide insulator 108a, the oxide semiconductor 108b, and the oxide insulator 108c as $H_2O$. In other words, owing to the first nitrogen gas, hydrogen in the oxide insulator 108a, the oxide semiconductor 108b, and the oxide insulator 108c can be captured.

However, heating the oxide insulator 108a, the oxide semiconductor 108b, and the oxide insulator 108c with only a nitrogen gas makes oxygen be released from the oxide insulator 108a, the oxide semiconductor 108b, and the oxide insulator 108c as $H_2O$, whereby oxygen vacancies are formed in the oxide insulator 108a, the oxide semiconductor 108b, and the oxide insulator 108c in some cases. Thus, the nitrogen gas is replaced by either a mixed gas of nitrogen and oxygen or CDA as shown in FIGS. 10A and 10B and FIGS. 11A and 11B, in which case oxygen contained in the gas can fill the oxygen vacancies in the oxide insulator 108a, the oxide semiconductor 108b, and the oxide insulator 108c.

Note that although the heat treatment is performed for one or two consecutive hours after the temperature becomes stable at the predetermined temperature in FIGS. 10A and 10B and FIGS. 11A and 11B, one embodiment of the present invention is not limited thereto. For example, the processing time of heat treatment in the nitrogen gas in the first step in FIG. 11B may be one to 10 hours inclusive. As the processing time of the first step in FIG. 11B is increased, a larger amount of hydrogen can be released from the oxide insulator 108a, the oxide semiconductor 108b, and the oxide insulator 108c, which is preferable.

In addition, time for baking with the use of either a mixed gas of nitrogen and oxygen or CDA may be set longer (e.g., one to 10 hours inclusive) as necessary. Increasing the heating time in an oxygen-containing atmosphere makes it possible to favorably fill the oxygen vacancies formed in the oxide insulator 108a, the oxide semiconductor 108b, and the oxide insulator 108c.

Next, the conductor 112 is formed over the insulator 107, the oxide insulator 108a, the oxide semiconductor 108b, and the oxide insulator 108c. Note that a low-resistance region 113 is formed in the vicinity of the surfaces of the oxide insulator 108a, the oxide semiconductor 108b, and the oxide insulator 108c when the conductor 112 is formed (see FIG. 7A).

The low-resistance region 113 is a region of the oxide insulator 108a, the oxide semiconductor 108b, and the oxide insulator 108c, which has many oxygen vacancies. Note that for example, in the case where the conductor 112 is formed by a sputtering method, the low-resistance region 113 is formed in the vicinity of the surfaces of the oxide insulator 108a, the oxide semiconductor 108b, and the oxide insulator 108c by damage due to sputtering, damage due to recoil argon in sputtering, or collision of atoms or molecules of a material used for the conductor 112 in sputtering. Accordingly, the conductor 112 is particularly preferably formed by a sputtering method or a PLD method. Electric power used in a sputtering apparatus is supplied from, for example, a direct-current (DC) power source, a radio-frequency (RF) source, an alternating-current (AC) power source, or the like. It is particularly preferable to use a DC power source or an AC power source for sputtering because high productivity can be achieved.

In this embodiment, as the conductor 112, a stacked film including a 50-nm-thick tungsten film, a 400-nm-thick aluminum film, and a 100-nm-thick titanium film can be formed by a sputtering method. Note that deposition power for the conductor 112 is important in formation of the low-resistance region 113. For example, when the power density in sputtering is greater than or equal to 1 $W/cm^2$ and less than or equal to 4 $W/cm^2$, the low-resistance region 113 having a thickness less than or equal to 5 nm can be formed.

Next, a resist mask is formed in a desired region over the conductor 112, and the conductor 112 is processed to form the conductors 112a and 112b serving as a source electrode and a drain electrode. After the conductors 112a and 112b are formed, the resist mask is removed (see FIG. 7B).

Next, part of the low-resistance region 113, which is between the conductors 112a and 112b, is removed with an etchant 139 supplied from above the conductors 112a and 112b. By removal of the part of the low-resistance region 113, the low-resistance regions 113a and 113b in contact with the conductors 112a and 112b are formed in the oxide insulator 108a, the oxide semiconductor 108b, and the oxide insulator 108c (see FIG. 7C).

As the etchant 139, a chemical solution or an etching gas that can remove the low-resistance region 113 is used. It is particularly preferable to use a chemical solution as the etchant 139 because damage to the surface of the oxide insulator 108c can be reduced. In this embodiment, the part of the low-resistance region 113 is removed using a phosphoric acid solution as the etchant 139. Note that in the step of etching, the oxide insulator 108c may partly have a depression.

Through the above steps, the transistor 10 is formed.

Next, over the transistor 10, specifically, over the oxide insulator 108c and the conductors 112a and 112b, the insulators 114 and 116 functioning as a protective insulating film of the transistor 10 are formed. By heat treatment at the time of forming the insulators 114 and 116 or after formation of the insulators 114 and 116, oxygen vacancies in the oxide insulator 108a, the oxide semiconductor 108b, and the oxide insulator 108c are filled (see FIG. 8A).

Note that after the insulator 114 is formed, the insulator 116 is preferably formed in succession without exposure to the air. After the insulator 114 is formed, the insulator 116 is formed in succession by adjusting at least one of the flow rate of a source gas, pressure, a high-frequency power, and a substrate temperature without exposure to the air, whereby the concentration of impurities attributed to the atmospheric component at the interface between the insulator 114 and the insulator 116 can be reduced and oxygen in the insulators 114 and 116 can be moved to the oxide insulator 108a, the oxide semiconductor 108b, and the oxide insulator 108c; accordingly, the amount of oxygen vacancies in the oxide insulator 108a, the oxide semiconductor 108b, and the oxide insulator 108c can be reduced.

For example, as the insulator 114, a silicon oxynitride film is formed by a PECVD method. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small number of defects can be formed as the insulator 114 by a PECVD method under the conditions where the flow rate of the oxidizing gas is higher than 20 times and lower than 100 times, preferably higher than or equal to 40 times and lower than or equal to 80 times, that of the deposition gas; and the pressure in a treatment chamber is lower than 100 Pa, preferably lower than or equal to 50 Pa.

In this embodiment, for example, a silicon oxynitride film is formed as the insulator 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ $W/cm^2$ as the power density) is supplied to parallel-plate electrodes.

For example, a silicon oxide film or a silicon oxynitride film can be formed as the insulator 116 under the following conditions: the substrate placed in a treatment chamber of the PECVD apparatus that is vacuum-evacuated is held at a temperature higher than or equal to 180° C. and lower than or equal to 280° C., preferably higher than or equal to 200° C. and lower than or equal to 240° C.; the pressure is greater than or equal to 100 Pa and less than or equal to 250 Pa, preferably greater than or equal to 100 Pa and less than or equal to 200 Pa with introduction of a source gas into the treatment chamber; and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulator 116, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulator 116 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, it is possible to form an oxide insulating film which contains oxygen at a higher proportion than the stoichiometric composition and from which part of oxygen is released by heating.

Note that in the step of forming the insulator 116, the insulator 114 serves as a protective film of the oxide insulator 108a, the oxide semiconductor 108b, and the oxide insulator 108c. Consequently, the insulator 116 can be formed using the high-frequency power having a high power density while damage to the oxide insulator 108a, the oxide semiconductor 108b, and the oxide insulator 108c is reduced.

Note that in the deposition conditions of the insulator 116, when the flow rate of the deposition gas containing silicon with respect to the oxidizing gas is increased, the amount of defects in the insulator 116 can be reduced. Typically, it is possible to form an oxide insulating layer in which the amount of defects is small, i.e., the spin density of a signal which appears at g=2.001 originating from a dangling bond of silicon is lower than 6×10$^{17}$ spins/cm$^3$, preferably lower than or equal to 3×10$^{17}$ spins/cm$^3$, further preferably lower than or equal to 1.5×10$^{17}$ spins/cm$^3$ by ESR measurement. As a result, the reliability of the transistor can be improved.

Heat treatment may be performed after the insulators 114 and 116 are formed. The heat treatment can reduce nitrogen oxide contained in the insulators 114 and 116. By the heat treatment, part of oxygen contained in the insulators 114 and 116 can be moved to the oxide insulator 108a, the oxide semiconductor 108b, and the oxide insulator 108c, so that the amount of oxygen vacancies can be reduced.

The temperature of the heat treatment performed on the insulators 114 and 116 is typically higher than or equal to 150° C. and lower than or equal to 400° C., preferably higher than or equal to 300° C. and lower than or equal to 400° C., and further preferably higher than or equal to 320° C. and lower than or equal to 370° C. The heat treatment may be performed under an atmosphere of nitrogen, oxygen, CDA, or a rare gas (argon, helium, and the like). Note that a gas baking furnace, an electric furnace, an RTA apparatus, or the like can be used for the heat treatment, in which it is preferable that hydrogen, water, and the like not be included in the nitrogen, oxygen, ultra-dry air, or a rare gas.

In this embodiment, the heat treatment is performed at 350° C. for one hour in an atmosphere of nitrogen and oxygen, for example.

Figure 8A:
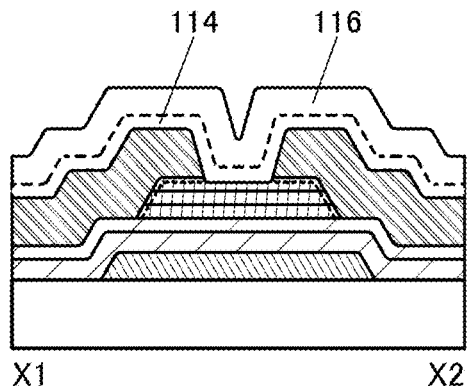
FIGS. 8A to 8C are cross-sectional views illustrating an example of a manufacturing process of a semiconductor device.
Figure 8B:
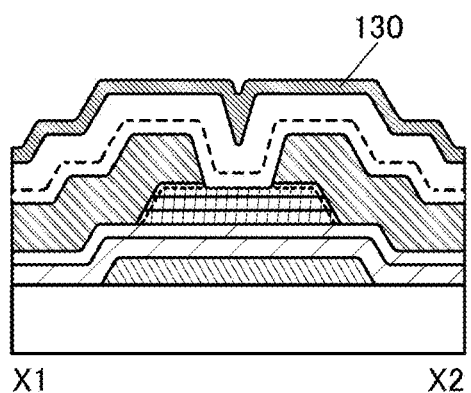

Next, the protective film 130 that inhibits release of oxygen is formed over the insulator 116 (see FIG. 8B).

The protective film 130 can be formed using a conductive film including indium or a semiconductor film including indium. In this embodiment, as the protective film 130, a 5-nm-thick ITSO film is formed with a sputtering apparatus. Note that the thickness of the protective film 130 is preferably greater than or equal to 1 nm and less than or equal to 20 nm or greater than or equal to 2 nm and less than or equal to 10 nm, in which case oxygen is favorably transmitted and release of oxygen can be inhibited.

For the protective film 130 having a function of inhibiting release of oxygen, for example, indium (In) and a material including one of zinc (Zn), tin (Sn), tungsten (W), titanium (Ti), and silicon (Si) can be used. As the protective film 130, a conductive film including indium or a semiconductor film including indium is particularly preferable. For the conductive film containing indium, a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide containing silicon oxide (ITSO) can be used. Among the above-described materials, ITSO is particularly preferably used in the protective film 130 having a function of inhibiting release of oxygen because it can be deposited over an insulating film having roughness or the like with favorable coverage.

Figure 8C:
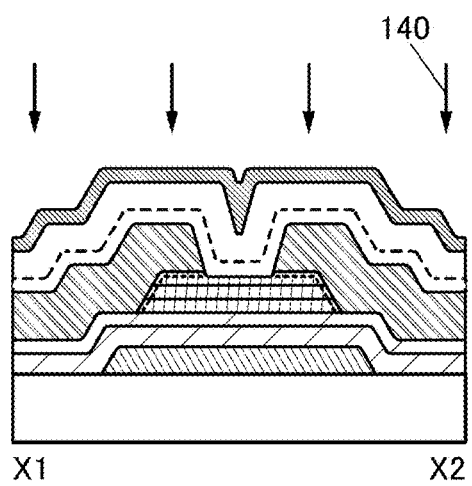

Next, oxygen 140 is added to the insulators 114 and 116 through the protective film 130 (see FIG. 8C).

Examples of a method for adding the oxygen 140 to the insulators 114 and 116 through the protective film 130 include an ion doping method, an ion implantation method (e.g. ion implantation, plasma-based ion implantation, plasma immersion ion implantation, or plasma source ion implantation), and a plasma treatment method. In the case of the plasma treatment method, high-density plasma may be generated by exciting a halogen element and oxygen with a microwave.

By application of a bias voltage to the substrate side when the oxygen 140 is added, the oxygen 140 can be effectively added to the insulators 114 and 116. As the bias voltage, an ashing apparatus is used, for example, and the power density of the bias voltage applied to the substrate side of the ashing apparatus can be greater than or equal to 0.5 W/cm$^2$ and less than or equal to 5 W/cm$^2$. The substrate temperature during addition of the oxygen 140 is higher than or equal to room temperature and lower than or equal to 300° C., preferably higher than or equal to 100° C. and lower than or equal to 250° C., whereby the oxygen can be added efficiently to the insulators 114 and 116.

In this embodiment, an ashing apparatus is used, for example. An oxygen gas is introduced into the ashing apparatus and a bias is applied to the substrate side, so that the oxygen 140 is added to the insulators 114 and 116.

When the protective film 130 is provided over the insulator 116 and then oxygen is added, the protective film 130 functions as a protective film for inhibiting release of oxygen from the insulator 116. Thus, a larger amount of oxygen can be added to the insulators 114 and 116.

Figure 9A:
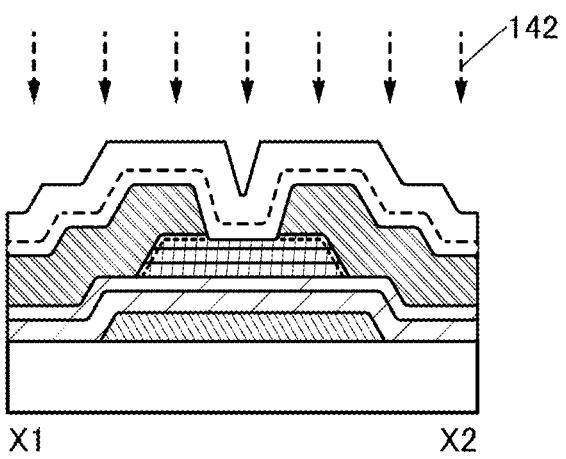
FIGS. 9A and 9B are cross-sectional views illustrating an example of a manufacturing process of a semiconductor device.

Then, the protective film 130 is removed using an etchant 142 (see FIG. 9A).

As the etchant 142, a chemical solution or an etching gas that can remove the protective film 130 is used. In this embodiment, an oxalic acid solution containing an oxalic acid at a concentration of 5% is used as the etchant 142. As the etchant 142, after the oxalic acid solution containing an oxalic acid at a concentration of 5% is used, a hydrofluoric acid solution containing a hydrofluoric acid at a concentration of 0.5% may be used. With the use of the hydrofluoric acid solution containing a hydrofluoric acid at a concentration of 0.5%, the protective film 130 that inhibits release of oxygen can be favorably removed.

Figure 9B:
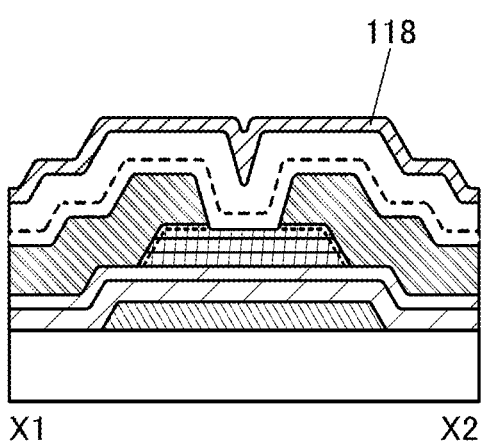

Next, the insulator 118 is formed over the insulator 116, whereby the transistor 10 in FIGS. 1A to 1D is formed (see FIG. 9B).

In the case where the insulator 118 is formed by a PECVD method, the substrate temperature is preferably set to higher than or equal to 300° C. and lower than or equal to 400° C., and further preferably higher than or equal to 320° C. and lower than or equal to 370° C., so that a dense film can be formed.

For example, in the case where a silicon nitride film is formed by a PECVD method as the insulator 118, a deposition gas containing silicon, nitrogen, and ammonia are preferably used as a source gas. As the source gas, ammonia whose amount is smaller than the amount of nitrogen is used, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, in a source gas, the flow ratio of the nitrogen to the ammonia is set to be preferably greater than or equal to 5 and less than or equal to 50, and further preferably greater than or equal to 10 and less than or equal to 50.

In this embodiment, as the nitride insulator 118, a 50-nm-thick silicon nitride film is formed with a PECVD apparatus using silane, nitrogen, and ammonia as a source gas. Here, the flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to parallel-plate electrodes with a 27.12 MHz high-frequency power source. Note that the PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

In the case where the insulator 118 is formed by thermal deposition, it is preferable that preheating be not performed before formation of the insulator 118. For example, in the case where preheating is performed before formation of the insulator 118, excess oxygen in the insulators 114 and 116 is released to the outside in some cases. Therefore, when the insulator 118 is formed, excess oxygen in the insulators 114 and 116 can be prevented from being released to the outside without preheating by, specifically, forming the insulator 118 over the insulator 116 within preferably three minutes and further preferably within one minute after the substrate is transferred to a heated chamber.

Note that heat treatment may be performed before or after the formation of the insulator 118, so that excess oxygen included in the insulators 114 and 116 can be diffused to the oxide insulator 108a, the oxide semiconductor 108b, and the oxide insulator 108c, especially, to the oxide semiconductor 108b, to fill oxygen vacancies. Alternatively, the insulator 118 may be deposited by heating, so that excess oxygen included in the insulators 114 and 116 can be diffused to the oxide insulator 108a, the oxide semiconductor 108b, and the oxide insulator 108c, especially, to the oxide semiconductor 108b, to fill oxygen vacancies. The temperature of the heat treatment that can be performed before or after the formation of the insulator 118 is typically higher than or equal to 150° C. and lower than or equal to 400° C., preferably higher than or equal to 300° C. and lower than or equal to 400° C. and further preferably higher than or equal to 320° C. and lower than or equal to 370° C.

Through the above steps, the transistor 10 illustrated in FIGS. 1A to 1D can be fabricated.

The structure and method described in this embodiment can be implemented by being combined as appropriate with any of the other structures and methods described in the other embodiments.

(Embodiment 2)

In this embodiment, an oxide semiconductor included in a semiconductor device of one embodiment of the present invention is described below in detail.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 12A:
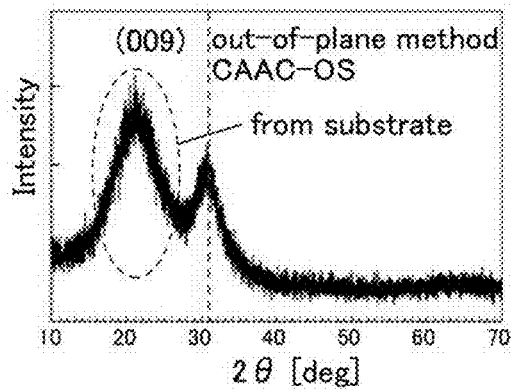
FIGS. 12A to 12E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 12A. This peak is derived from the (009)

plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 12B:
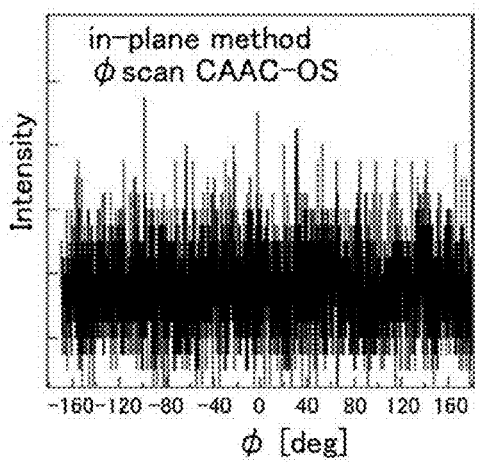
Figure 12C:
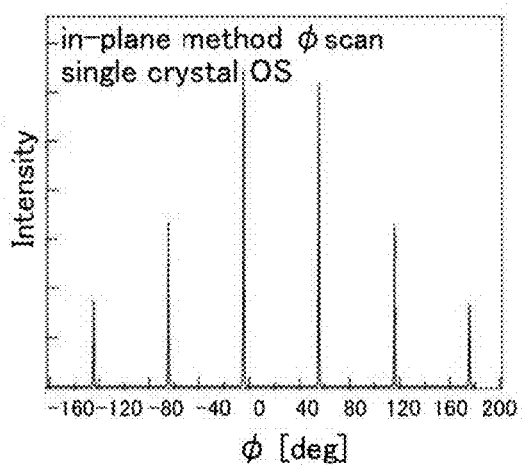

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 12B, a peak is not clearly observed. In contrast, in the case where single crystal InGaZnO$_4$ is subjected to φ scan with 2θ fixed at around 56°, as shown in FIG. 12C, six peaks which are derived from crystal planes equivalent to the (110) plane are observed. Accordingly, the structural analysis using XRD shows that the directions of a-axes and b-axes are irregularly oriented in the CAAC-OS.

Figure 12D:
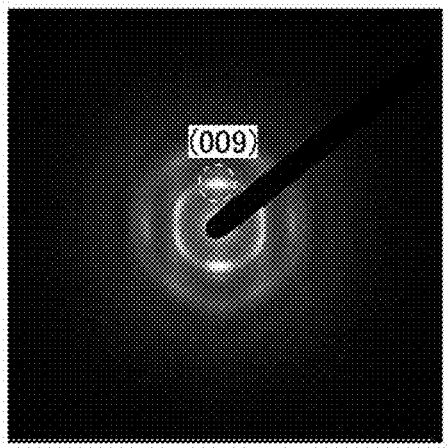
Figure 12E:
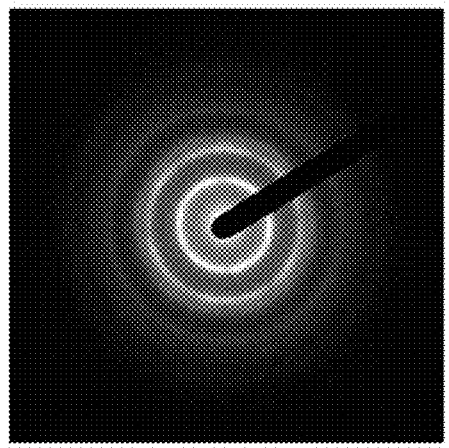

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 12D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 12E shows a diffraction pattern obtained in such a manner that an electron beam with a probe diameter of 300 nm is incident on the same sample in a direction perpendicular to the sample surface. As shown in FIG. 12E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 12E is considered to be derived from the (010) plane, the (100) plane, and the like of the InGaZnO$_4$ crystal. The second ring in FIG. 12E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 13A:
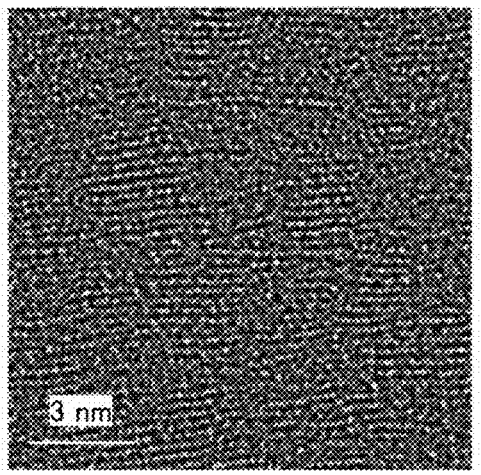
FIGS. 13A to 13E show a cross-sectional TEM image and plan-view TEM images of a CAAC-OS and images obtained through analysis thereof.

FIG. 13A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 13A shows pellets in which metal atoms are arranged in a layered manner. FIG. 13A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 13B:
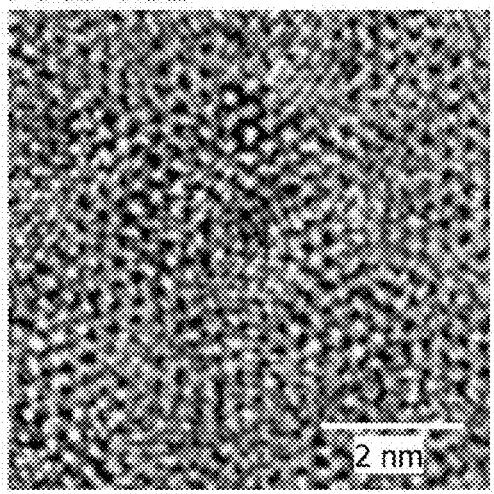
Figure 13C:
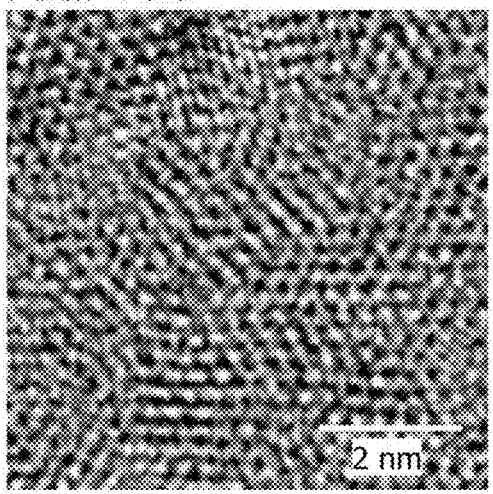
Figure 13D:
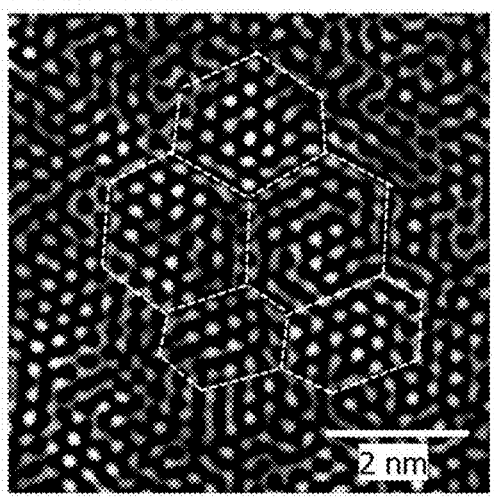
Figure 13E:
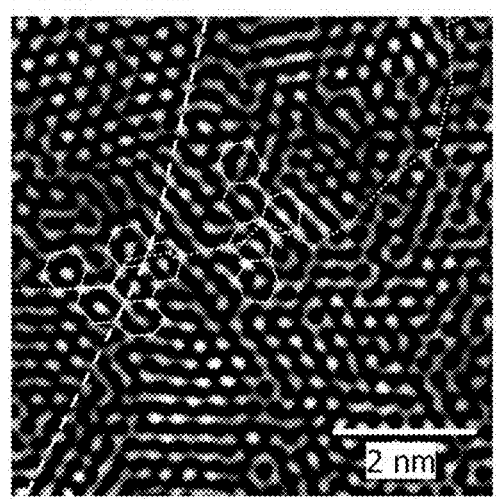

FIGS. 13B and 13C show Cs-corrected high-resolution TEM images of a plane of the CAAC-OS observed from a direction substantially perpendicular to the sample surface. FIGS. 13D and 13E are images obtained through image processing of FIGS. 13B and 13C. The method of image processing is as follows. The image in FIG. 13B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 13D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 13E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, an oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density (specifically, lower than $8 \times 10^{11}/cm^3$, preferably lower than $1 \times 10^{11}/cm^3$, further preferably lower than $1 \times 10^{10}/cm^3$, and is higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 14A:
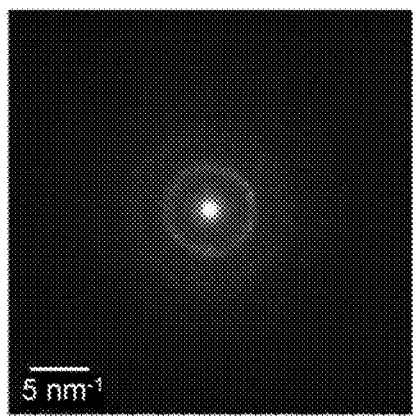
FIGS. 14A to 14D show electron diffraction patterns and a cross-sectional TEM image of an nc-OS.
Figure 14B:
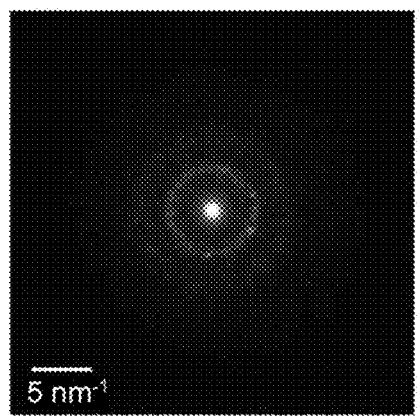

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 14A is observed. FIG. 14B shows a diffraction pattern obtained when an electron beam with a probe diameter of 1 nm is incident on the same sample. As shown in FIG. 14B, a plurality of spots are observed in a ring-like region. In other words, ordering in an nc-OS is not observed with an electron beam with a probe diameter of 50 nm but is observed with an electron beam with a probe diameter of 1 nm.

Figure 14C:
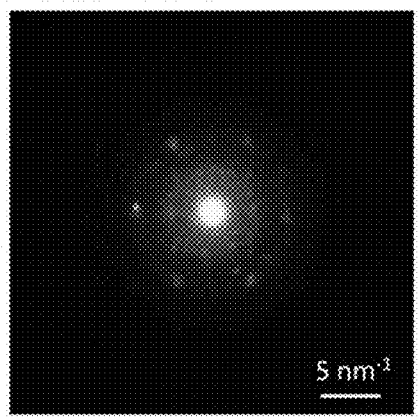

Furthermore, an electron diffraction pattern in which spots are arranged in an approximately hexagonal shape is observed in some cases as shown in FIG. 14C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 14D:
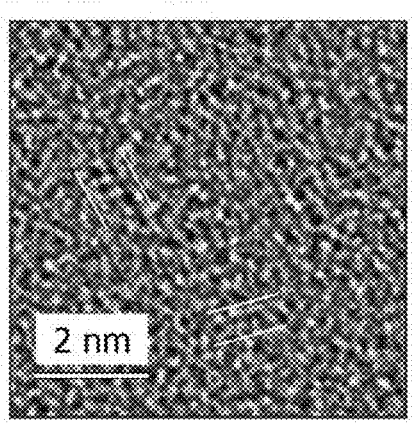

FIG. 14D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 14D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

Figure 15A:
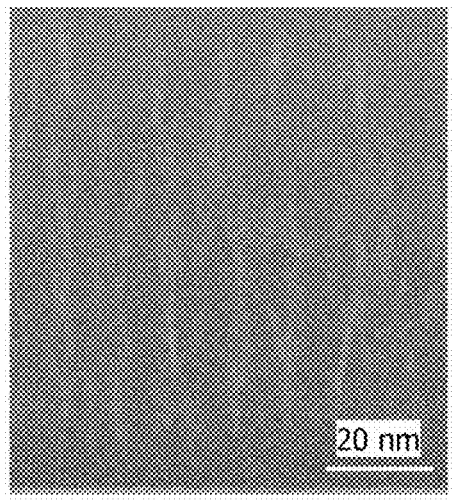
FIGS. 15A and 15B show cross-sectional TEM images of an a-like OS.
Figure 15B:
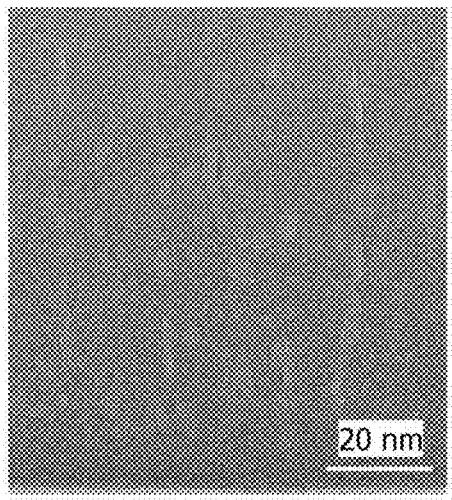

FIGS. 15A and 15B are high-resolution cross-sectional TEM images of an a-like OS. FIG. 15A is the high-resolution cross-sectional TEM image of the a-like OS at the start of the electron irradiation. FIG. 15B is the high-resolution cross-sectional TEM image of a-like OS after the electron (e$^-$) irradiation at $4.3 \times 10^8$ e$^-$/nm$^2$. FIGS. 15A and 15B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 16:
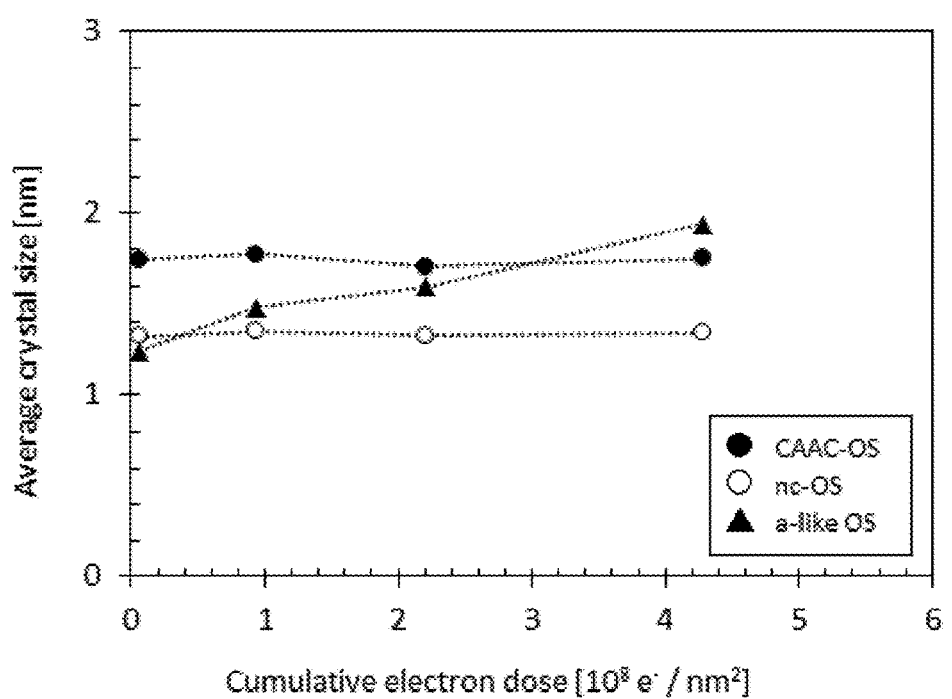
FIG. 16 shows a change in the crystal part of an In—Ga—Zn oxide induced by electron irradiation.

FIG. 16 shows change in the average size of crystal parts (at 22 points to 30 points) in each sample. Note that the crystal part size corresponds to the length of a lattice fringe. FIG. 16 indicates that the crystal part size in the a-like OS increases with an increase in the cumulative electron dose in obtaining TEM images, for example. As shown in FIG. 16, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 16, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Formation Method of CAAC-OS Film and nc-OS Film>

Next, an example of a method for forming a CAAC-OS film will be described below.

Figure 17A:
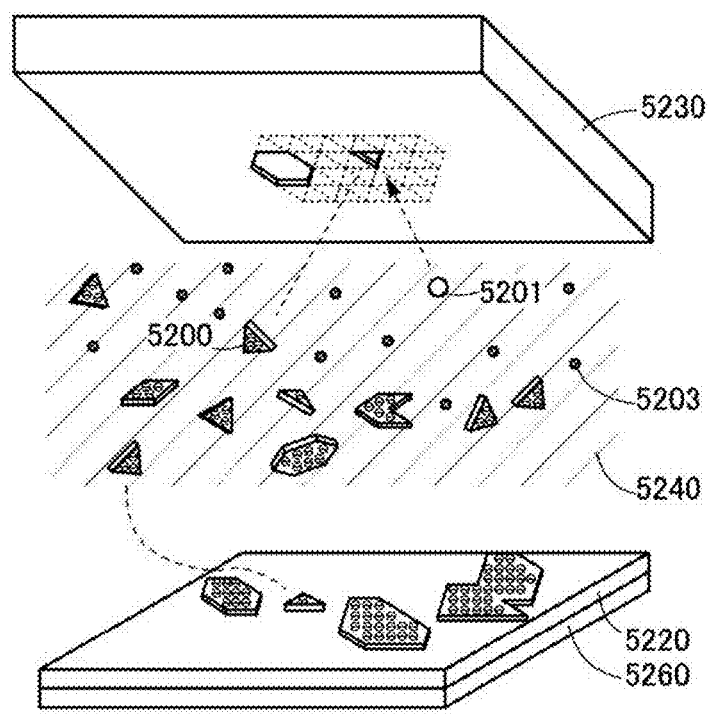
FIGS. 17A to 17D are diagrams illustrating a deposition mechanism of a CAAC-OS.

FIG. 17A is a schematic diagram illustrating the inside of a deposition chamber. The CAAC-OS film can be formed by a sputtering method.

As shown in FIG. 17A, a substrate 5220 and a target 5230 are arranged to face each other. Plasma 5240 is generated between the substrate 5220 and the target 5230. A heating mechanism 5260 is under the substrate 5220. The target 5230 is attached to a backing plate (not illustrated in the drawing). A plurality of magnets is arranged to face the target 5230 with the backing plate positioned therebetween. A sputtering method in which the deposition speed is increased by utilizing a magnetic field of magnets is referred to as a magnetron sputtering method.

Although the case where film formation is performed with a parallel plate sputtering device is exemplified in FIG. 17A, a device used for film formation is not limited thereto. For example, a facing-target-type sputtering apparatus may be used. In a facing-target-type sputtering apparatus, plasma is confined between two facing targets, and the pressure of a deposition gas can be set relatively low; therefore, damage to a substrate due to sputtering can be reduced. Furthermore, film step coverage can be improved because an incident angle of a sputtered particle to the substrate can be made smaller depending on the inclination of the target.

The distance d between the substrate 5220 and the target 5230 (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5230, and the plasma 5240 is observed. The magnetic field forms a high-density plasma region in the vicinity of the target 5230. In the high-density plasma region, the deposition gas is ionized, so that an ion 5201 is generated. Examples of the ion 5201 include an oxygen cation ($O^+$) and an argon cation ($Ar^+$).

Figure 18:
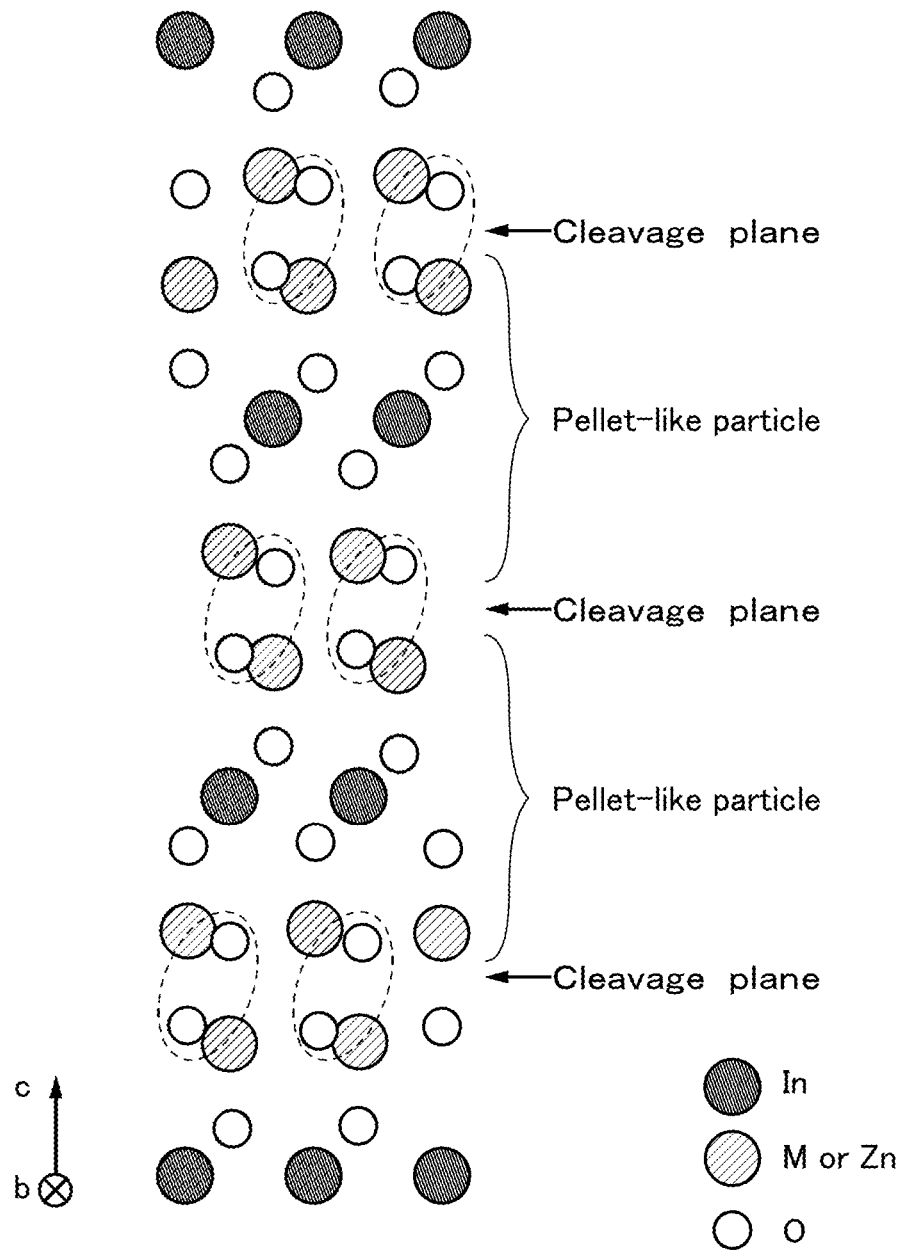
FIG. 18 illustrates a crystal of $InMZnO_4$.

Here, the target 5230 has a polycrystalline structure which includes a plurality of crystal grains and in which a cleavage plane exists in any of the crystal grains. FIG. 18 shows a crystal structure of $InMZnO_4$ (the element M is Ga or Sn, for example) included in the target 5230 as an example. Note that the crystal structure shown in FIG. 18 is $InMZnO_4$ observed from a direction parallel to a b-axis. In the crystal of $InMZnO_4$, oxygen atoms are negatively charged, whereby repulsive force is generated between the two adjacent M-Zn—O layers. Thus, the $InMZnO_4$ crystal has a cleavage plane between the two adjacent M-Zn—O layers.

The ion 5201 generated in the high-density plasma region is accelerated toward the target 5230 side by an electric field, and then collides with the target 5230. At this time, a pellet 5200 which is a flat-plate-like or pellet-like sputtered particles is separated from the cleavage plane (FIG. 17A).

Figure 17B:
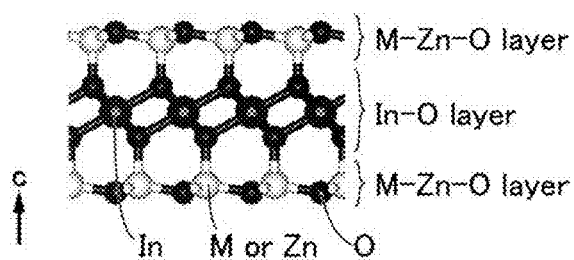
Figure 17C:
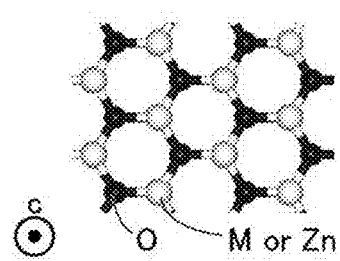
Figure 17D:
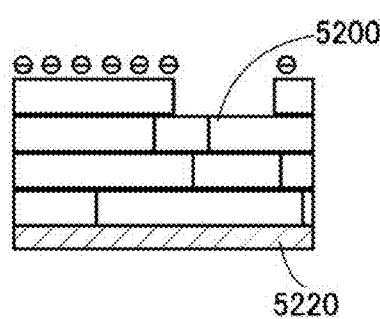

The pellet 5200 is between the two cleavage planes shown in FIG. 18. Thus, when the pellet 5200 is observed, the cross-section thereof is as shown in FIG. 17B, and the top surface thereof is as shown in FIG. 17C. Note that the structure of the pellet 5200 may be distorted by an impact of collision of the ion 5201. Note that along with the separation of the pellet 5200, a particle 5203 is also sputtered from the target 5230. The particle 5203 has an atom or an aggregate of several atoms. Therefore, the particle 5203 can be referred to as an atomic particle.

The pellet 5200 is a flat-plate-like (pellet-like) sputtered particle having a triangle plane, e.g., regular triangle plane.

Alternatively, the pellet 5200 is a flat-plate-like (pellet-like) sputtered particle having a hexagon plane, e.g., regular hexagon plane. However, the shape of a flat plane of the pellet 5200 is not limited to a triangle or a hexagon. For example, the flat plane may have a shape formed by combining two or more triangles. For example, a quadrangle (e.g., rhombus) may be formed by combining two triangles (e.g., regular triangles).

The thickness of the pellet 5200 is determined depending on the kind of the deposition gas and the like. For example, the thickness of the pellet 5200 is greater than or equal to 0.4 nm and less than or equal to 1 nm, preferably greater than or equal to 0.6 nm and less than or equal to 0.8 nm. In addition, for example, the width of the pellet 5200 is greater than or equal to 1 nm and less than or equal to 3 nm, preferably greater than or equal to 1.2 nm and less than or equal to 2.5 nm. For example, the ion 5201 collides with the target 5230 including the In-M-Zn oxide. Then, the pellet 5200 including three layers of an M-Zn—O layer, an In—O layer, and an M-Zn—O layer is separated. Note that along with the separation of the pellet 5200, a particle 5203 is also sputtered from the target 5230. The particle 5203 has an atom or an aggregate of several atoms. Therefore, the particle 5203 can be referred to as an atomic particle.

The pellet 5200 may receive a charge when passing through the plasma 5240, so that surfaces thereof are negatively or positively charged. For example, the pellet 5200 receives a negative charge from $O^{2-}$ in the plasma 5240. As a result, oxygen atoms on the surfaces of the pellet 5200 may be negatively charged. In addition, when passing through the plasma 5240, the pellet 5200 is sometimes combined with indium, the element M, zinc, oxygen, or the like in the plasma 5240 to grow up.

The pellet 5200 and the particle 5203 that have passed through the plasma 5240 reach a surface of the substrate 5220. Note that part of the particles 5203 is discharged to the outside by a vacuum pump or the like because the particle 5203 is small in mass.

Next, deposition of the pellet 5200 and the particle 5203 on the surface of the substrate 5220 is described with reference to FIGS. 19A to 19E.

Figure 19A:
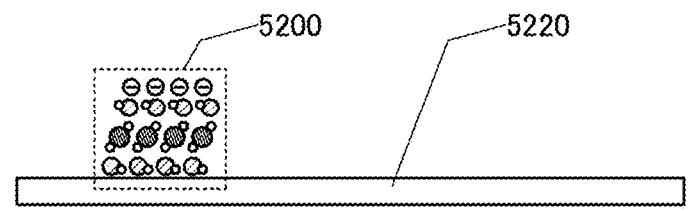
FIGS. 19A to 19E are diagrams illustrating a deposition mechanism of a CAAC-OS.

First, a first of the pellets 5200 is deposited over the substrate 5220. Since the pellet 5200 has a flat-plate-like shape, it is deposited so that the flat plane faces to the surface of the substrate 5220 (FIG. 19A). Here, a charge on a surface of the pellet 5200 on the substrate 5220 side is lost through the substrate 5220.

Figure 19B:
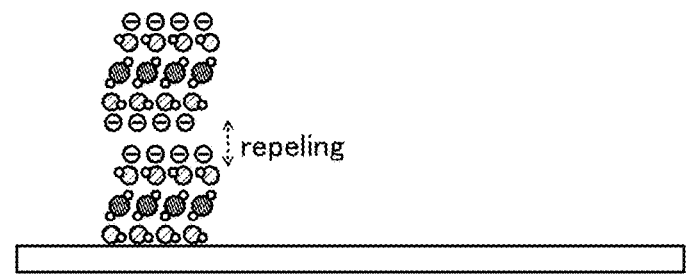

Next, a second of the pellets 5200 reaches the substrate 5220. Here, since another surface of the first of the pellets 5200 and surfaces of the second of the pellets 5200 are charged, they repel each other (FIG. 19B).

Figure 19C:
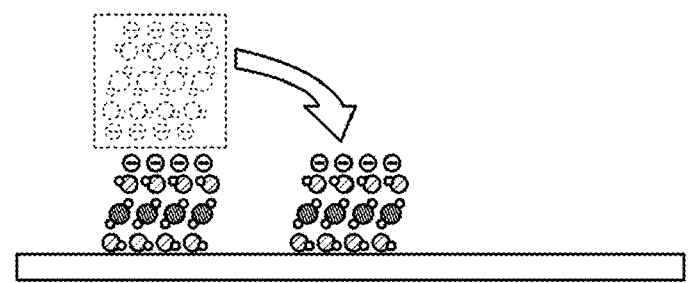

As a result, the second of the pellets 5200 avoids being deposited over the first of the pellets 5200, and is deposited over the surface of the substrate 5220 so as to be a little distance away from the first of the pellets 5200 (FIG. 19C). With repetition of this, millions of the pellets 5200 are deposited over the surface of the substrate 5220 to have a thickness of one layer. A region where any pellet 5200 is not deposited is generated between adjacent pellets 5200.

Figure 19D:
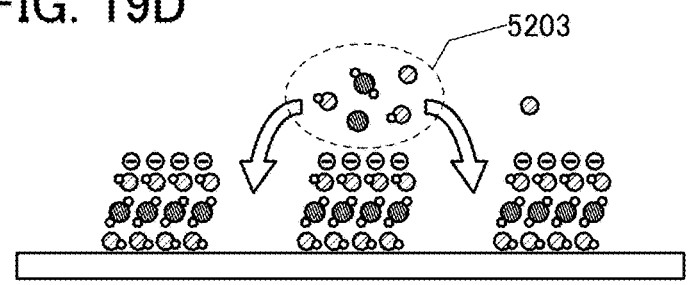

Next, the particle 5203 reaches the surface of the substrate 5220 (FIG. 19D).

The particle 5203 cannot be deposited over an active region such as the surface of the pellet 5200. Therefore, the particle 5203 is deposited so as to fill a region where the pellets 5200 are not deposited. The particles 5203 grow in the horizontal (lateral) direction between the pellets 5200, thereby connecting the pellets 5200. In this way, the particles 5203 are deposited until they fill regions where the pellets 5200 are not deposited. This mechanism is similar to a deposition mechanism of the ALD method.

Figure 19E:
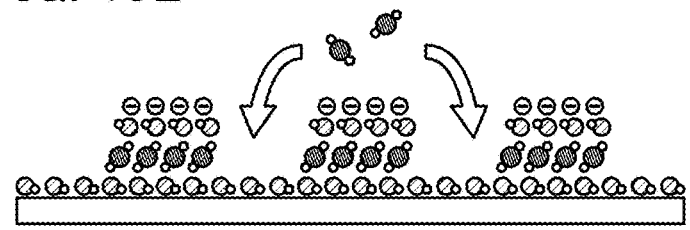

Note that there can be several mechanisms for the lateral growth of the particles 5203 between the pellets 5200. For example, as shown in FIG. 19E, the pellets 5200 can be connected from side surfaces of the first M-Zn—O layers. In this case, after the first M-Zn—O layers make connection, the In—O layers and the second M-Zn—O layers are connected in this order (the first mechanism).

Figure 20A:
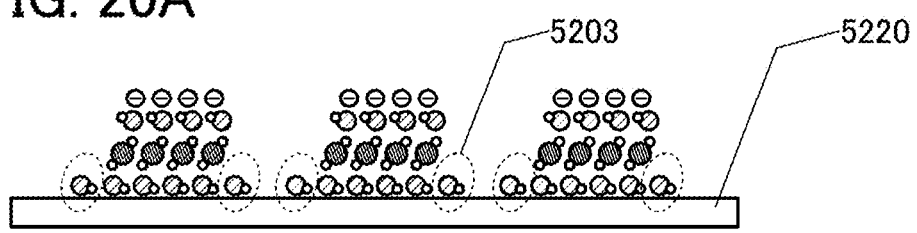
FIGS. 20A to 20C are diagrams illustrating a deposition mechanism of a CAAC-OS.
Figure 20B:
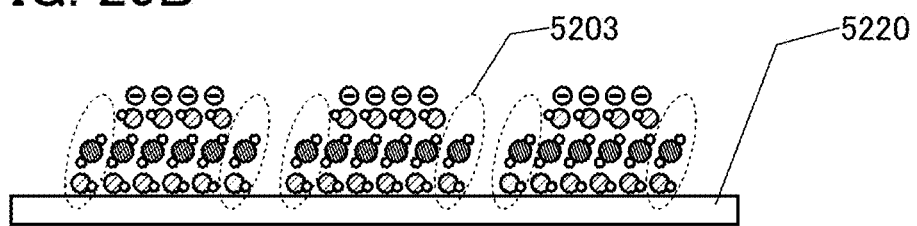

Alternatively, as shown in FIG. 20A, first, the particles 5203 are connected to the sides of the first M-Zn—O layers so that each side of the first M-Zn—O layer has one particle 5203. Then, as shown in FIG. 20B, the particle 5203 is connected to each side of the In—O layers. After that, as shown in FIG. 20C, the particle 5203 is connected to each side of the second M-Zn—O layers (the second mechanism).

Figure 20C:
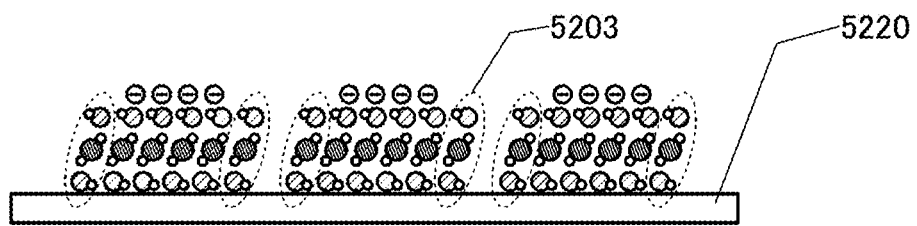

Note that the connection can also be made by the simultaneous occurrence of the deposition in FIGS. 20A, 20B, and 20C (the third mechanism).

As shown in the above, the above three mechanisms are considered as the mechanisms of the lateral growth of the particles 5203 between the pellets 5200. However, the particles 5203 may grow up laterally between the pellets 5200 by other mechanisms.

Therefore, even when the orientations of a plurality of pellets 5200 are different from each other, generation of crystal boundaries can be suppressed since the particles 5203 laterally grow to fill gaps between the plurality of pellets 5200. In addition, as the particles 5203 make smooth connection between the plurality of pellets 5200, a crystal structure different from a single crystal and a polycrystal is formed. In other words, a crystal structure including distortion between minute crystal regions (pellets 5200) is formed. The regions filling the gaps between the crystal regions are distorted crystal regions, and thus, it will be not appropriate to say that the regions have an amorphous structure.

When the particles 5203 completely fill the regions between the pellets 5200, a first layer with a thickness almost the same as that of the pellet 5200 is formed. Then, a new first of the pellets 5200 is deposited over the first layer, and a second layer is formed. With repetition of this cycle, the stacked-layer thin film structure is formed.

A deposition way of the pellets 5200 changes depending on the surface temperature of the substrate 5220 or the like. For example, if the surface temperature of the substrate 5220 is high, migration of the pellets 5200 occurs over the substrate 5220. As a result, a proportion of the pellets 5200 that are directly connected with each other without the particles 5203 increases, whereby a CAAC-OS with high orientation is made. The surface temperature of the substrate 5220 for formation of the CAAC-OS is higher than or equal to 100° C. and less than 500° C., preferably higher than or equal to 140° C. and less than 450° C., or further preferably higher than or equal to 170° C. and less than 400° C. Therefore, even when a large-sized substrate of the 8th generation or more is used as the substrate 5220, a warp or the like hardly occur.

Figure 21:
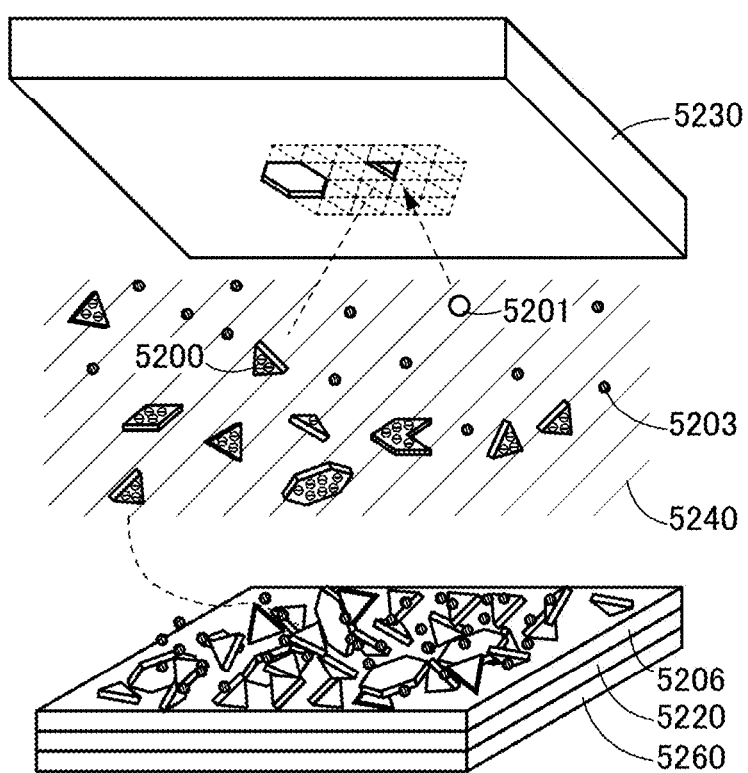
FIG. 21 is a diagram illustrating a deposition mechanism of an nc-OS.

On the other hand, if the surface temperature of the substrate 5220 is low, the migration of the pellets 5200 over the substrate 5220 does not easily occur. As a result, the pellets 5200 are stacked to form an nc-OS or the like with low orientation (see FIG. 21). In the nc-OS, the pellets 5200 are possibly deposited with certain gaps since the pellets 5200 are negatively charged. Therefore, the nc-OS film has low orientation but some regularity, and thus it has a denser structure than an amorphous oxide semiconductor.

When spaces between the pellets are extremely small in a CAAC-OS, the pellets may form a large pellet. The inside of the large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above.

According to such a model, the pellets 5200 are considered to be deposited on the substrate 5220. Thus, a CAAC-OS can be deposited even when a formation surface does not have a crystal structure; therefore, a growth mechanism in this case is different from epitaxial growth. In addition, a uniform film of a CAAC-OS or an nc-OS can be formed even over a large-sized glass substrate or the like. For example, even when the surface of the substrate 5220 (formation surface) has an amorphous structure (e.g., such as amorphous silicon oxide), a CAAC-OS can be formed.

In addition, even when the surface of the substrate 5220 (formation surface) has an uneven shape, the pellets 5200 are aligned along the shape.

The structure and method described in this embodiment can be implemented by being combined as appropriate with any of the other structures and methods described in the other embodiments.

(Embodiment 3)

In this embodiment, a display device that includes a semiconductor device of one embodiment of the present invention is described with reference to FIGS. 22A to 22C.

<Display Device>

The display device illustrated in FIG. 22A includes a region including pixels of display elements (hereinafter the region is referred to as a pixel portion 1502), a circuit portion provided outside the pixel portion 1502 and including a circuit for driving the pixels (hereinafter the portion is referred to as a driver circuit portion 1504), circuits each having a function of protecting an element (hereinafter the circuits are referred to as protection circuits 1506), and a terminal portion 1507. Note that the protection circuits 1506 are not necessarily provided.

A part or the whole of the driver circuit portion 504 is preferably formed over a substrate over which the pixel portion 1502 is formed, in which case the number of components and the number of terminals can be reduced. When a part or the whole of the driver circuit portion 1504 is not formed over the substrate over which the pixel portion 502 is formed, the part or the whole of the driver circuit portion 504 can be mounted by COG or tape automated bonding (TAB).

The pixel portion 1502 includes a plurality of circuits for driving display elements arranged in X rows (X is a natural number of 2 or more) and Y columns (Y is a natural number of 2 or more) (hereinafter, such circuits are referred to as pixel circuits 1501). The driver circuit portion 1504 includes driver circuits such as a circuit for supplying a signal (scan signal) to select a pixel (hereinafter, the circuit is referred to as a gate driver 1504a) and a circuit for supplying a signal (data signal) to drive a display element in a pixel (hereinafter, the circuit is referred to as a source driver 1504b).

The gate driver 1504a includes a shift register or the like. The gate driver 1504a receives a signal for driving the shift register through the terminal portion 1507 and outputs a signal. For example, the gate driver 1504a receives a start pulse signal, a clock signal, or the like and outputs a pulse signal. The gate driver 1504a has a function of controlling the potentials of wirings supplied with scan signals (hereinafter, such wirings are referred to as scan lines GL_1 to GL_X). Note that a plurality of gate drivers 1504a may be provided to control the scan lines GL_1 to GL_X separately. Alternatively, the gate driver 1504a has a function of supplying an initialization signal. Without being limited thereto, the gate driver 1504a can supply another signal.

The source driver 1504b includes a shift register or the like. The source driver 1504b receives a signal (image signal) from which a data signal is derived, as well as a signal for driving the shift register, through the terminal portion 1507. The source driver 1504b has a function of generating a data signal to be written to the pixel circuit 501 which is based on the image signal. In addition, the source driver 1504b has a function of controlling output of a data signal in response to a pulse signal produced by input of a start pulse signal, a clock signal, or the like. Furthermore, the source driver 1504b has a function of controlling the potentials of wirings supplied with data signals (hereinafter such wirings are referred to as data lines DL_1 to DL_Y). Alternatively, the source driver 1504b has a function of supplying an initialization signal. Without being limited thereto, the source driver 1504b can supply another signal.

The source driver 1504b includes a plurality of analog switches or the like, for example. The source driver 1504b can output, as the data signals, signals obtained by time-dividing the image signal by sequentially turning on the plurality of analog switches. The source driver 1504b may include a shift register or the like.

A pulse signal and a data signal are input to each of the plurality of pixel circuits 1501 through one of the plurality of scan lines GL supplied with scan signals and one of the plurality of data lines DL supplied with data signals, respectively. Writing and holding of the data signal to and in each of the plurality of pixel circuits 1501 are controlled by the gate driver 1504a. For example, to the pixel circuit 1501 in the m-th row and the n-th column (m is a natural number of less than or equal to X, and n is a natural number of less than or equal to Y), a pulse signal is input from the gate driver 1504a through the scan line GL_m, and a data signal is input from the source driver 1504b through the data line DL_n in accordance with the potential of the scan line GL_m.

Figure 22A:
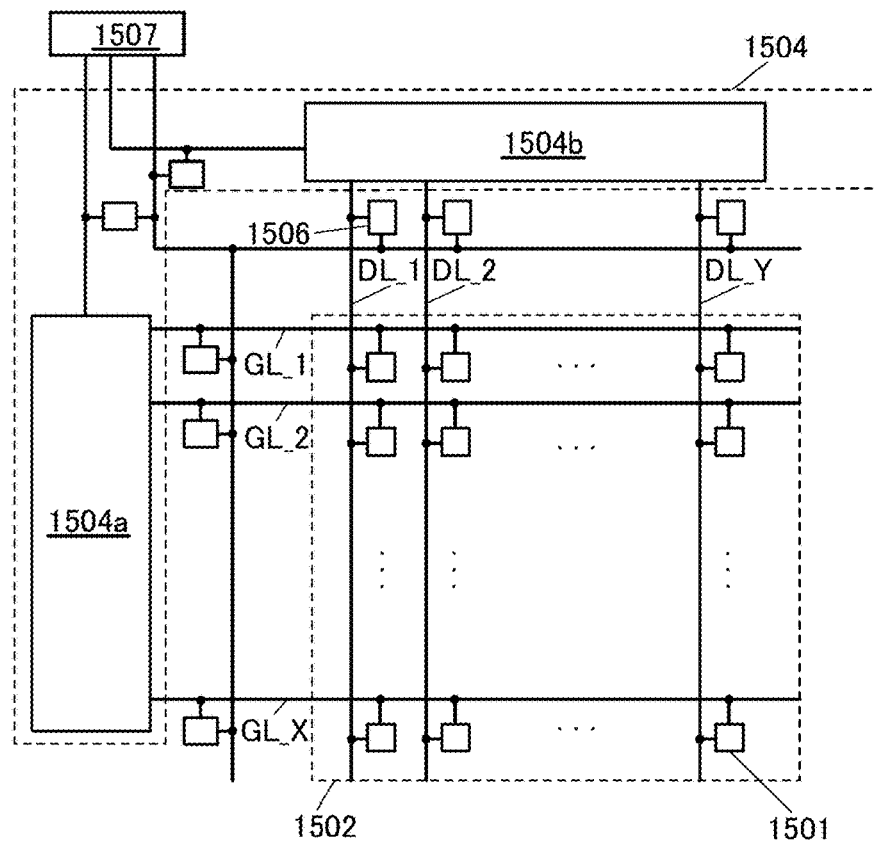
FIGS. 22A to 22C are a block diagram and circuit diagrams illustrating a display device.

The protection circuit 1506 shown in FIG. 22A is connected to, for example, the scan line GL between the gate driver 1504a and the pixel circuit 1501. Alternatively, the protection circuit 1506 is connected to the data line DL between the source driver 1504b and the pixel circuit 1501. Alternatively, the protection circuit 1506 can be connected to a wiring between the gate driver 1504a and the terminal portion 1507. Alternatively, the protection circuit 1506 can be connected to a wiring between the source driver 1504b and the terminal portion 1507. Note that the terminal portion 1507 means a portion having terminals for inputting power, control signals, and image signals to the display device from external circuits.

The protection circuit 1506 is a circuit that electrically connects a wiring connected to the protection circuit to another wiring when a potential out of a certain range is applied to the wiring connected to the protection circuit.

As illustrated in FIG. 22A, the protection circuits 1506 are provided for the pixel portion 1502 and the driver circuit portion 1504, so that the resistance of the display device to overcurrent generated by electrostatic discharge (ESD) or the like can be improved. Note that the configuration of the protection circuits 1506 is not limited to that, and for example, the protection circuit 1506 may be configured to be connected to the gate driver 1504a or the protection circuit 1506 may be configured to be connected to the source driver

1504b. Alternatively, the protection circuit 1506 may be configured to be connected to the terminal portion 1507.

In FIG. 22A, an example in which the driver circuit portion 1504 includes the gate driver 1504a and the source driver 1504b is shown; however, the structure is not limited thereto. For example, only the gate driver 1504a may be formed and a separately prepared substrate where a source driver circuit is formed (e.g., a driver circuit substrate formed with a single crystal semiconductor film or a polycrystalline semiconductor film) may be mounted.

Figure 22B:
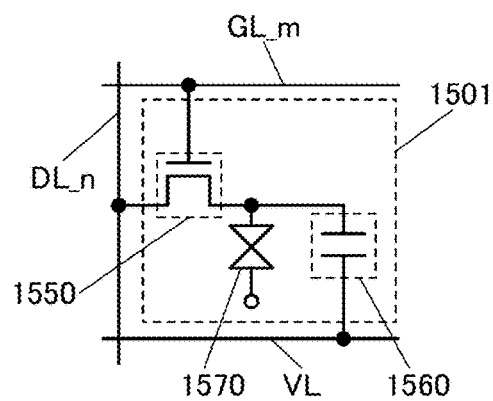

Each of the plurality of pixel circuits 1501 in FIG. 22A can have the structure illustrated in FIG. 22B, for example.

The pixel circuit 1501 illustrated in FIG. 22B includes a liquid crystal element 1570, a transistor 1550, and a capacitor 1560. As the transistor 1550, any of the transistors described in the above embodiment can be used.

The potential of one of a pair of electrodes of the liquid crystal element 1570 is set in accordance with the specifications of the pixel circuit 1501 as appropriate. The alignment state of the liquid crystal element 1570 depends on written data. A common potential may be supplied to one of the pair of electrodes of the liquid crystal element 1570 included in each of the plurality of pixel circuits 1501. Furthermore, the potential supplied to one of the pair of electrodes of the liquid crystal element 1570 in the pixel circuit 1501 in one row may be different from the potential supplied to one of the pair of electrodes of the liquid crystal element 1570 in the pixel circuit 1501 in another row.

As a driving method of the display device including the liquid crystal element 1570, any of the following modes can be used, for example: a twisted nematic (TN) mode, a super-twisted nematic (STN) mode, a vertical alignment (VA) mode, a multi-domain vertical alignment (MVA) mode, a patterned vertical alignment (PVA) mode, an in-plane-switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, an FFS mode, a transverse bend alignment (TBA) mode, and the like.

Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 1501 in the m-th row and the n-th column, one of a source electrode and a drain electrode of the transistor 1550 is electrically connected to the data line DL_n, and the other is electrically connected to the other of the pair of electrodes of the liquid crystal element 1570. A gate electrode of the transistor 1550 is electrically connected to the scan line GL_m. The transistor 1550 has a function of controlling whether to write a data signal by being turned on or off.

One of a pair of electrodes of the capacitor 1560 is electrically connected to a wiring to which a potential is supplied (hereinafter referred to as a potential supply line VL), and the other is electrically connected to the other of the pair of electrodes of the liquid crystal element 1570. The potential of the potential supply line VL is set in accordance with the specifications of the pixel circuit 1501 as appropriate. The capacitor 1560 functions as a storage capacitor for storing written data.

For example, in the display device including the pixel circuit 1501 in FIG. 22B, the pixel circuits 1501 are sequentially selected row by row by the gate driver 1504a illustrated in FIG. 22A, whereby the transistors 1550 are turned on and a data signal is written.

When the transistors 1550 are turned off, the pixel circuits 1501 in which the data has been written are brought into a holding state. This operation is sequentially performed row by row; thus, an image can be displayed.

Figure 22C:
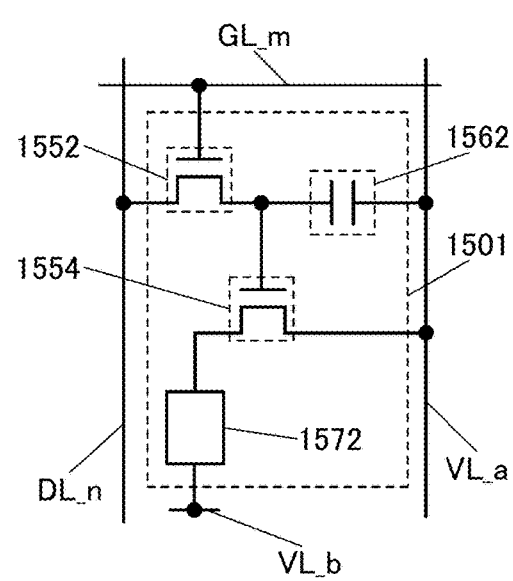

Alternatively, each of the plurality of pixel circuits 1501 in FIG. 22A can have the structure illustrated in FIG. 22C, for example.

The pixel circuit 1501 illustrated in FIG. 22C includes transistors 1552 and 1554, a capacitor 1562, and a light-emitting element 1572. Any of the transistors described in the above embodiment can be used as one or both of the transistors 1552 and 1554.

One of a source electrode and a drain electrode of the transistor 1552 is electrically connected to a wiring to which a data signal is supplied (hereinafter referred to as a signal line DL_n). A gate electrode of the transistor 1552 is electrically connected to a wiring to which a gate signal is supplied (hereinafter referred to as a scan line GL_m).

The transistor 1552 has a function of controlling whether to write a data signal by being turned on or off.

One of a pair of electrodes of the capacitor 1562 is electrically connected to a wiring to which a potential is supplied (hereinafter referred to as a potential supply line VL_a), and the other is electrically connected to the other of the source electrode and the drain electrode of the transistor 1552.

The capacitor 1562 functions as a storage capacitor for storing written data.

One of a source electrode and a drain electrode of the transistor 1554 is electrically connected to the potential supply line VL_a. Furthermore, a gate electrode of the transistor 1554 is electrically connected to the other of the source electrode and the drain electrode of the transistor 1552.

One of an anode and a cathode of the light-emitting element 1572 is electrically connected to a potential supply line VL_b, and the other is electrically connected to the other of the source electrode and the drain electrode of the transistor 1554.

As the light-emitting element 1572, an organic electroluminescent element (also referred to as an organic EL element) or the like can be used, for example. Note that the light-emitting element 1572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 1501 in FIG. 22C, the pixel circuits 1501 are sequentially selected row by row by the gate driver 1504a illustrated in FIG. 22A, whereby the transistors 1552 are turned on and a data signal is written.

When the transistors 1552 are turned off, the pixel circuits 1501 in which the data has been written are brought into a holding state. Furthermore, the amount of current flowing between the source electrode and the drain electrode of the transistor 1554 is controlled in accordance with the potential of the written data signal. The light-emitting element 1572 emits light with a luminance corresponding to the amount of flowing current. This operation is sequentially performed row by row; thus, an image can be displayed.

Although the structures including the liquid crystal element 1570 or the light-emitting element 1572 as a display element of the display device are described in this embodiment, one embodiment of the present invention is not limited to these structures and a variety of elements may be included in the display device.

For example, the display device includes at least one of a liquid crystal element, an EL element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element using a carbon nanotube, and the like. Alternatively, the display device may include a display medium whose contrast, luminance, reflectivity, transmittance, or the like is changed by electrical or magnetic effect. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

A progressive type display, an interlace type display, or the like can be employed as the display type of the display device of this embodiment. Further, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Further, the size of a display region may be different depending on respective dots of the color elements. Embodiments of the disclosed invention are not limited to a display device for color display; the disclosed invention can also be applied to a display device for monochrome display.

White light (W) may be emitted from a backlight (e.g., an organic EL element, an inorganic EL element, an LED, or a fluorescent lamp) in the display device. Furthermore, a coloring layer (also referred to as a color filter) may be provided in the display device. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using self-luminous elements such as organic EL elements or inorganic EL elements, the elements may emit light of their respective colors R, G, B, Y, and W. By using self-luminous elements, power consumption can be further reduced as compared to the case of using the coloring layer in some cases.

The structure described in this embodiment can be combined as appropriate with any of the structures described in the other embodiments.

(Embodiment 4)

In this embodiment, a display device including a semiconductor device of one embodiment of the present invention and an electronic device in which the display device is provided with an input device will be described with reference to FIGS. 23A and 23B, FIGS. 24A and 24B, FIG. 25, FIGS. 26A and 26B, FIGS. 27A and 27B, and FIG. 28.

<Touch Panel>

In this embodiment, a touch panel 2000 including a display device and an input device will be described as an example of an electronic device. In addition, an example in which a touch sensor is used as an input device will be described.

Figure 23A:
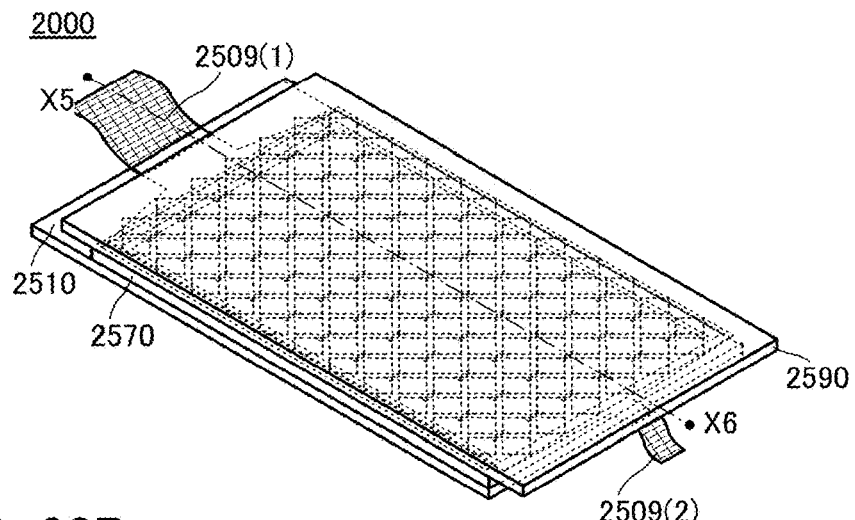
FIGS. 23A and 23B are perspective views illustrating an example of a touch panel.
Figure 23B:
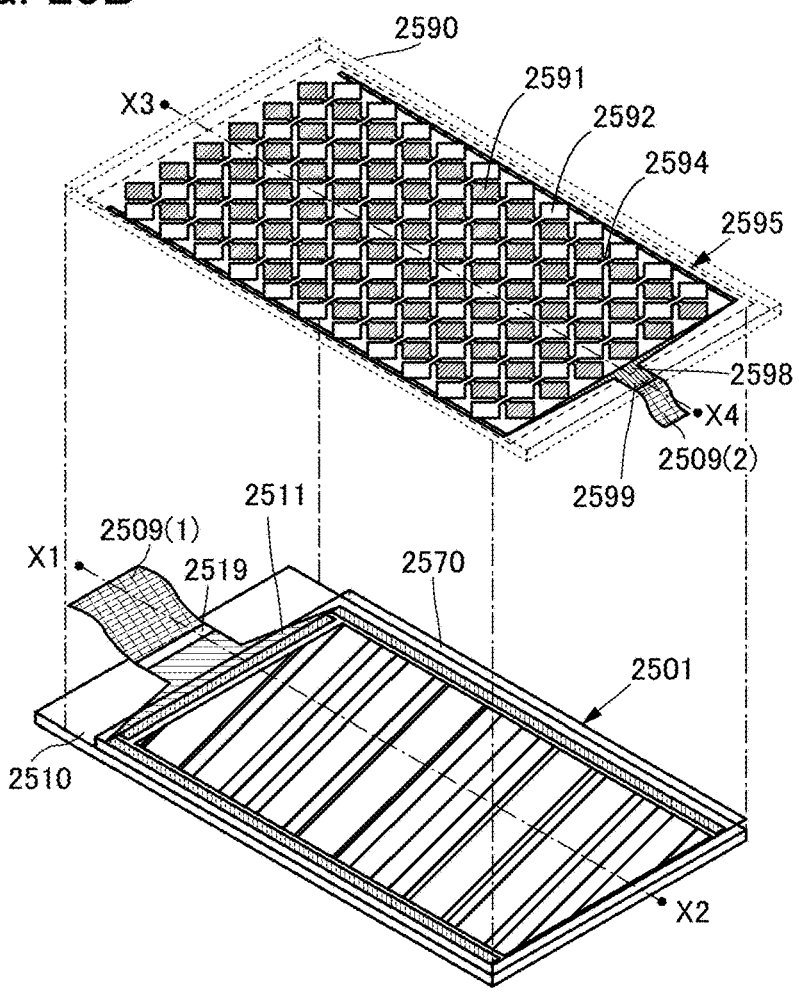

FIGS. 23A and 23B are perspective views of the touch panel 2000. Note that FIGS. 23A and 23B illustrate only main components of the touch panel 2000 for simplicity.

The touch panel 2000 includes a display device 2501 and a touch sensor 2595 (see FIG. 23B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 23B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 23B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 23A and 23B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

Note that as a material of the conductive films used for the electrodes 2591, the electrodes 2592, and the wirings 2598, that is, wirings and electrodes forming the touch panel, a transparent conductive film containing indium oxide, tin oxide, zinc oxide, or the like (e.g., ITO) can be given. For example, a low-resistance material is preferably used as a material that can be used as the wirings and electrodes forming the touch panel. For example, silver, copper, aluminum, a carbon nanotube, graphene, or a metal halide (such as a silver halide) may be used. Alternatively, a metal nanowire including a plurality of conductors with an extremely small width (for example, a diameter of several nanometers) may be used. Further alternatively, a net-like metal mesh with a conductor may be used. For example, an Ag nanowire, a Cu nanowire, an Al nanowire, an Ag mesh, a Cu mesh, or an Al mesh may be used. For example, in the case of using an Ag nanowire as the wirings and electrodes forming the touch panel, a visible light transmittance of 89% or more and a sheet resistance of 40 $\Omega/cm^2$ or more and 100 $\Omega/cm^2$ or less can be achieved. Since the above-described metal nanowire, metal mesh, carbon nanotube, graphene, and the like, which are examples of the material that can be used as the wirings and electrodes forming the touch panel, have high visible light transmittances, they may be used as electrodes of display elements (e.g., a pixel electrode or a common electrode).

<Display Device>

Figure 24A:
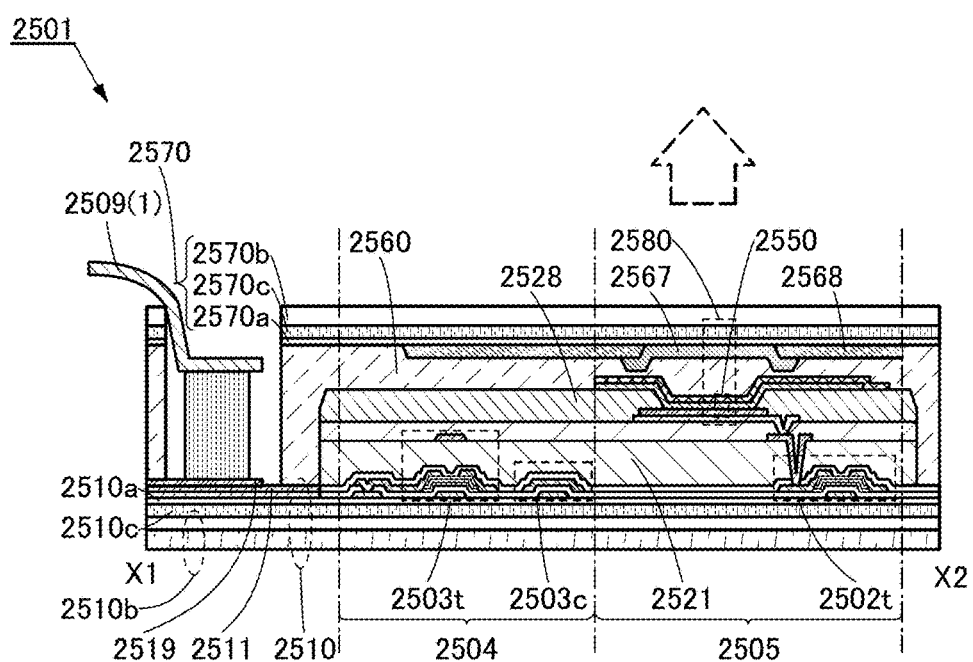
FIGS. 24A and 24B are cross-sectional views illustrating examples of a display device.
Figure 24B:
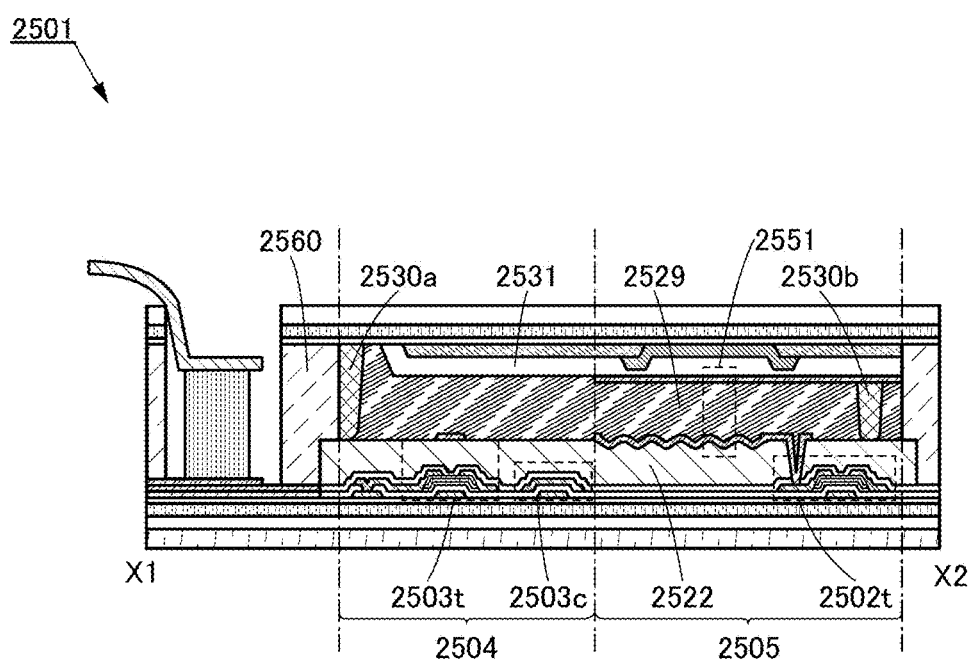

Next, the display device 2501 will be described in detail with reference to FIGS. 24A and 24B. FIGS. 24A and 24B correspond to cross-sectional views taken along dashed-dotted line X1-X2 in FIG. 23B.

The display device 2501 includes a plurality of pixels arranged in a matrix. Each of the pixels includes a display element and a pixel circuit for driving the display element.

(Structure with EL Element as Display Element)

First, a structure that uses an EL element as a display element will be described below with reference to FIG. 24A. In the following description, an example of using an EL element that emits white light will be described; however, the EL element is not limited to this element. For example, EL elements that emit light of different colors may be included so that the light of different colors can be emitted from adjacent pixels.

For the substrate 2510 and the substrate 2570, for example, a flexible material with a vapor permeability of lower than or equal to $10^{-5}$ g/(m²·day), preferably lower than or equal to $10^{-6}$ g/(m²·day) can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer 2510a for preventing impurity diffusion into the EL element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the EL element, a flexible substrate 2570b, and an adhesive layer 2570c for attaching the insulating layer 2570a and the flexible substrate 2570b to each other.

For the adhesive layer 2510c and the adhesive layer 2570c, for example, materials that include polyester, polyolefin, polyamide (e.g., nylon, aramid), polyimide, polycarbonate, polyurethane, an acrylic resin, an epoxy resin, or a resin having a siloxane bond such as silicone can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 24A, the sealing layer 2560 can also serve as an optical element.

A sealant may be formed in the peripheral portion of the sealing layer 2560. With the use of the sealant, an EL element 2550 can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like. For example, an epoxy-based resin or a glass frit is preferably used as the sealant. As a material used for the sealant, a material which does not transmit moisture or oxygen is preferably used.

The display device 2501 illustrated in FIG. 24A includes a pixel 2505. The pixel 2505 includes a light-emitting module 2580, the EL element 2550, and a transistor 2502t that can supply electric power to the EL element 2550. Note that the transistor 2502t functions as part of the pixel circuit.

The light-emitting module 2580 includes the EL element 2550 and a coloring layer 2567. The EL element 2550 includes a lower electrode, an upper electrode, and an EL layer between the lower electrode and the upper electrode.

In the case where the sealing layer 2560 is provided on the light extraction side, the sealing layer 2560 is in contact with the EL element 2550 and the coloring layer 2567.

The coloring layer 2567 is positioned in a region overlapping with the EL element 2550. Accordingly, part of light emitted from the EL element 2550 passes through the coloring layer 2567 and is emitted to the outside of the light-emitting module 2580 as indicated by an arrow in FIG. 24A.

The display device 2501 includes a light-blocking layer 2568 on the light extraction side. The light-blocking layer 2568 is provided so as to surround the coloring layer 2567.

The coloring layer 2567 is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t and the like. Note that the insulating layer 2521 has a function of covering the roughness caused by the pixel circuit to provide a flat surface. The insulating layer 2521 may have a function of suppressing impurity diffusion. This can prevent the reliability of the transistor 2502t or the like from being lowered by impurity diffusion.

The EL element 2550 is formed over the insulating layer 2521. A partition 2528 is provided so as to overlap with an end portion of the lower electrode of the EL element 2550. Note that a spacer for controlling the distance between the substrate 2510 and the substrate 2570 may be formed over the partition 2528.

A scan line driver circuit 2504 includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Any of the transistors described in the above embodiments may be used as one or both of the transistors 2502t and 2503t. The transistors used in this embodiment each include an oxide semiconductor film which is highly purified and in which formation of oxygen vacancies is suppressed. In the transistors, the current in an off state (off-state current) can be made small. Accordingly, an electrical signal such as an image signal can be held for a longer period, and a writing interval can be set longer in an on state. Accordingly, the frequency of refresh operation can be reduced, which leads to an effect of suppressing power consumption. In addition, the transistors used in this embodiment can have relatively high field-effect mobility and thus are capable of high speed operation. For example, with such transistors which can operate at high speed used for the display device 2501, a switching transistor of a pixel circuit and a driver transistor in a driver circuit portion can be formed over one substrate. That is, a semiconductor device formed using a silicon wafer or the like is not additionally needed as a driver circuit, by which the number of components of the semiconductor device can be reduced. In addition, by using a transistor which can operate at high speed in a pixel circuit, a high-quality image can be provided.

(Structure with Liquid Crystal Element as Display Element)

Next, a structure including a liquid crystal element as a display element is described below with reference to FIG. 24B. In the description below, a reflective liquid crystal display device that performs display by reflecting external light is described; however, one embodiment of the present invention is not limited to this type of liquid crystal display device. For example, a light source (e.g., a back light or a side light) may be provided to form a transmissive liquid crystal display device or a transflective liquid crystal display device.

The display device 2501 illustrated in FIG. 24B has the same structure as the display device 2501 illustrated in FIG. 24A except the following points.

The pixel 2505 in the display device 2501 illustrated in FIG. 24B includes a liquid crystal element 2551 and the transistor 2502t that can supply electric power to the liquid crystal element 2551.

The liquid crystal element 2551 includes a lower electrode (also referred to as a pixel electrode), an upper electrode, and a liquid crystal layer 2529 between the lower electrode and the upper electrode. By the application of a voltage between the lower electrode and the upper electrode, the alignment state of the liquid crystal layer 2529 in the liquid crystal element 2551 can be changed. Furthermore, in the liquid crystal layer 2529, a spacer 2530a and a spacer 2530b are provided. Although not illustrated in FIG. 24B, an alignment film may be provided on each of the upper electrode and the lower electrode on the side in contact with the liquid crystal layer 2529.

As the liquid crystal layer 2529, thermotropic liquid crystal, low-molecular liquid crystal, high-molecular liquid crystal, polymer dispersed liquid crystal, ferroelectric liquid crystal, or anti-ferroelectric liquid crystal can be used. Such a liquid crystal material exhibits a cholesteric phase, a smectic phase, a cubic phase, a chiral nematic phase, an isotropic phase, or the like depending on conditions. In the case of employing a horizontal electric field mode liquid crystal display device, liquid crystal exhibiting a blue phase for which an alignment film is unnecessary may be used. In the case where a liquid crystal exhibiting a blue phase is used, an alignment film is not necessarily provided, so that rubbing treatment is also unnecessary. Accordingly, electrostatic discharge damage caused by the rubbing treatment can be prevented and defects and damage of the liquid crystal display device in the manufacturing process can be reduced.

The spacers 2530a and 2530b are formed by selectively etching an insulating film. The spacers 2530a and 2530b are provided in order to control the distance between the substrate 2510 and the substrate 2570 (the cell gap). Note that the spacers 2530a and 2530b may have different sizes from each other and are preferably have a columnar or spherical shape. Although the spacers 2530a and 2530b are provided on the substrate 2570 side in the non-limiting structure in FIG. 24B, they may be provided on the substrate 2510 side.

The upper electrode of the liquid crystal element 2551 is provided on the substrate 2570 side. An insulating layer 2531 is provided between the upper electrode and the coloring layer 2567 and the light-blocking layer 2568. The insulating layer 2531 has a function of covering the roughness caused by the coloring layer 2567 and the light-blocking layer 2568 to provide a flat surface. As the insulating layer 2531, an organic resin film may be used, for example. The lower electrode of the liquid crystal element 2551 functions as a reflective electrode. The display device 2501 illustrated in FIG. 24B is of a reflective type which performs display by reflecting external light at the lower electrode and making the light pass through the coloring layer 2567. Note that in the case of forming a transmissive liquid crystal display device, a transparent electrode is provided as the lower electrode.

The display device 2501 illustrated in FIG. 24B includes an insulating layer 2522. The insulating layer 2522 covers the transistor 2502t and the like. The insulating layer 2522 has a function of covering the roughness caused by the pixel circuit to provide a flat surface and a function of forming roughness on the lower electrode of the liquid crystal element. In this way, roughness can be formed on the surface of the lower electrode. Therefore, when external light is incident on the lower electrode, the light is reflected diffusely at the surface of the lower electrode, whereby visibility can be improved. Note that in the case of forming a transmissive liquid crystal display device, a structure without such roughness may be employed.

<Touch Sensor>

Figure 25:
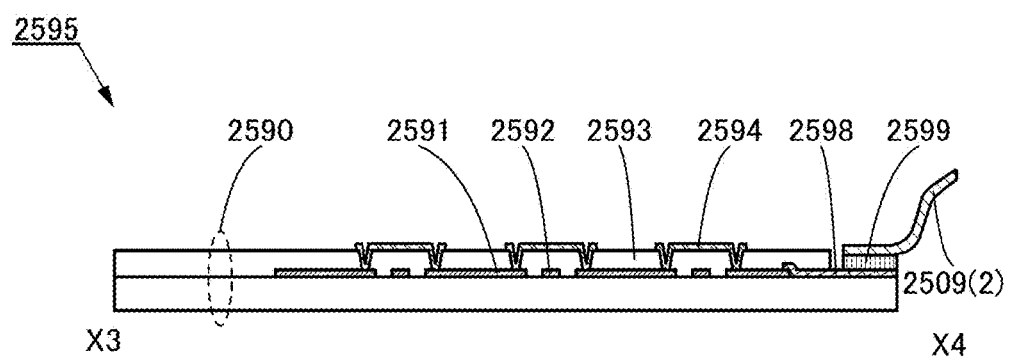
FIG. 25 is a cross-sectional view illustrating an example of a touch sensor.

Next, the touch sensor 2595 will be described in detail with reference to FIG. 25. FIG. 25 corresponds to a cross-sectional view taken along dashed-dotted line X3-X4 in FIG. 23B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film containing graphene may be used as well. The film containing graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various pattern forming techniques such as photolithography.

Examples of a material for the insulating layer 2593 are a resin such as an acrylic resin or an epoxy resin, a resin having a siloxane bond such as silicone, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<Touch Panel>

Figure 26A:
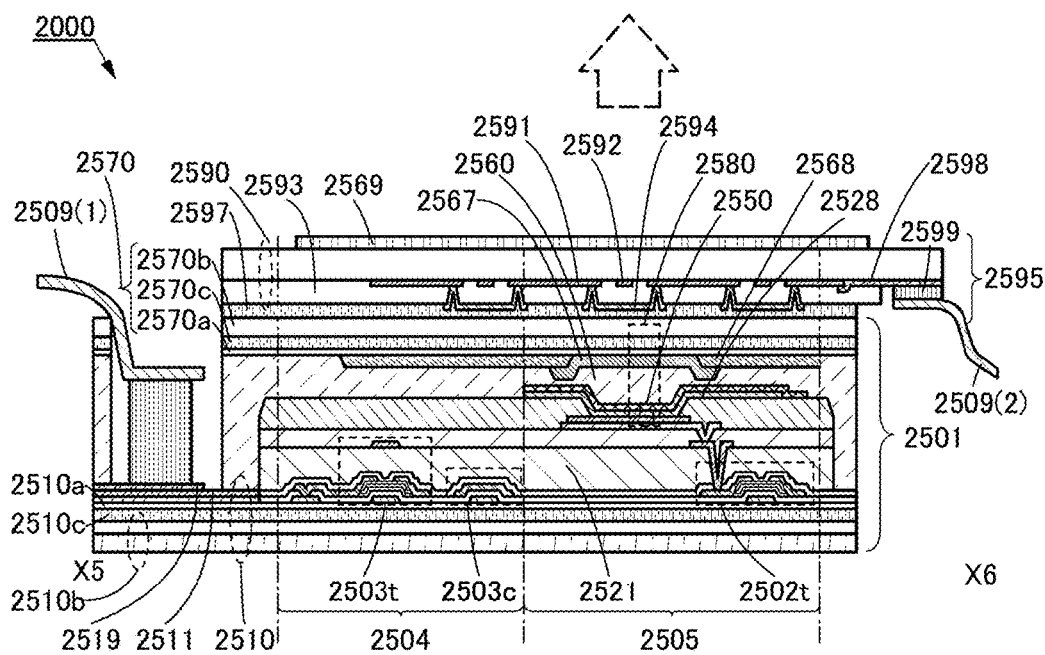
FIGS. 26A and 26B are cross-sectional views illustrating examples of a touch panel.

Next, the touch panel 2000 will be described in detail with reference to FIG. 26A. FIG. 26A corresponds to a cross-sectional view taken along dashed-dotted line X5-X6 in FIG. 23A.

In the touch panel 2000 illustrated in FIG. 26A, the display device 2501 described with reference to FIG. 23A and the touch sensor 2595 described with reference to FIG. 25 are attached to each other.

The touch panel 2000 illustrated in FIG. 26A includes an adhesive layer 2597 and an anti-reflective layer 2569 in addition to the components described with reference to FIG. 24A.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2569 is positioned in a region overlapping with pixels. As the anti-reflective layer 2569, a circularly polarizing plate can be used, for example.

Next, a touch panel having a structure different from that illustrated in FIG. 26A will be described with reference to FIG. 26B.

Figure 26B:
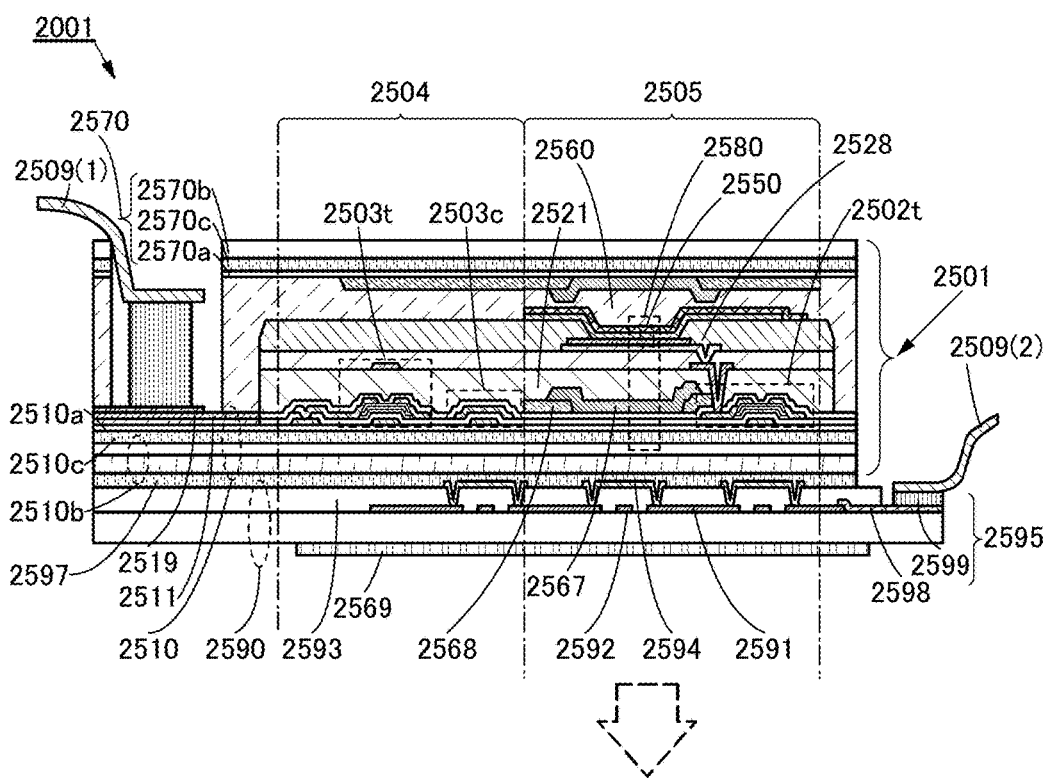

FIG. 26B is a cross-sectional view of a touch panel 2001. The touch panel 2001 illustrated in FIG. 26B differs from the touch panel 2000 illustrated in FIG. 26A in the position of the touch sensor 2595 relative to the display device 2501. Different parts are described in detail below, and the above description of the touch panel 2000 is referred to for the other similar parts.

The coloring layer 2567 is positioned under the EL element 2550. The EL element 2550 illustrated in FIG. 26B emits light to the side where the transistor 2502t is provided. Accordingly, part of light emitted from the EL element 2550 passes through the coloring layer 2567 and is emitted to the outside of the light-emitting module 2580 as indicated by an arrow in FIG. 26B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 26A or FIG. 26B, light may be emitted from the light-emitting element to one or both of upper and lower sides of the substrate.

<Driving Method of Touch Panel>

Next, an example of a method for driving a touch panel will be described with reference to FIGS. 27A and 27B.

Figure 27A:
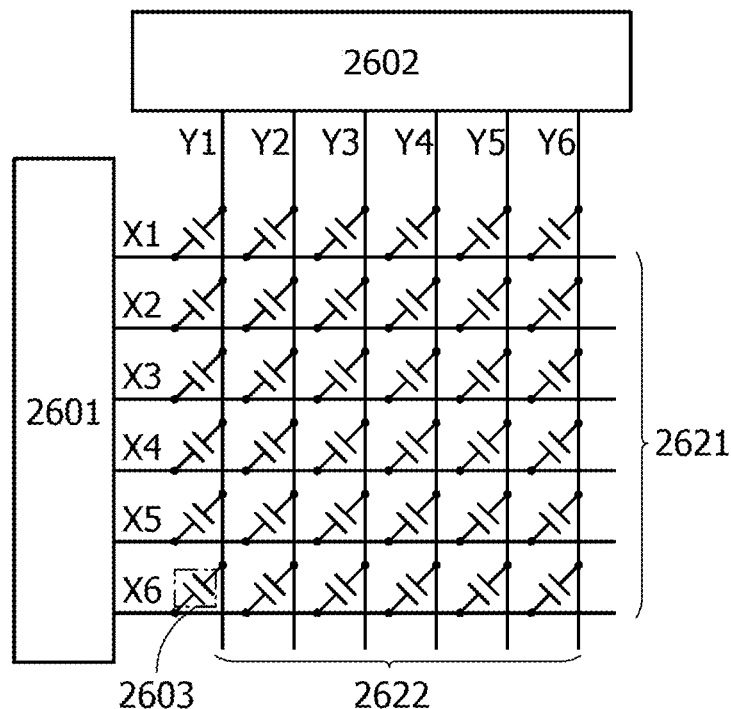
FIGS. 27A and 27B are a block diagram and a timing chart of a touch sensor.

FIG. 27A is a block diagram illustrating the structure of a mutual capacitive touch sensor. FIG. 27A illustrates a pulse voltage output circuit 2601 and a current sensing circuit 2602. Note that in FIG. 27A, six wirings X1 to X6 represent the electrodes 2621 to which a pulse voltage is applied, and six wirings Y1 to Y6 represent the electrodes 2622 that detect changes in current. FIG. 27A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 27B:
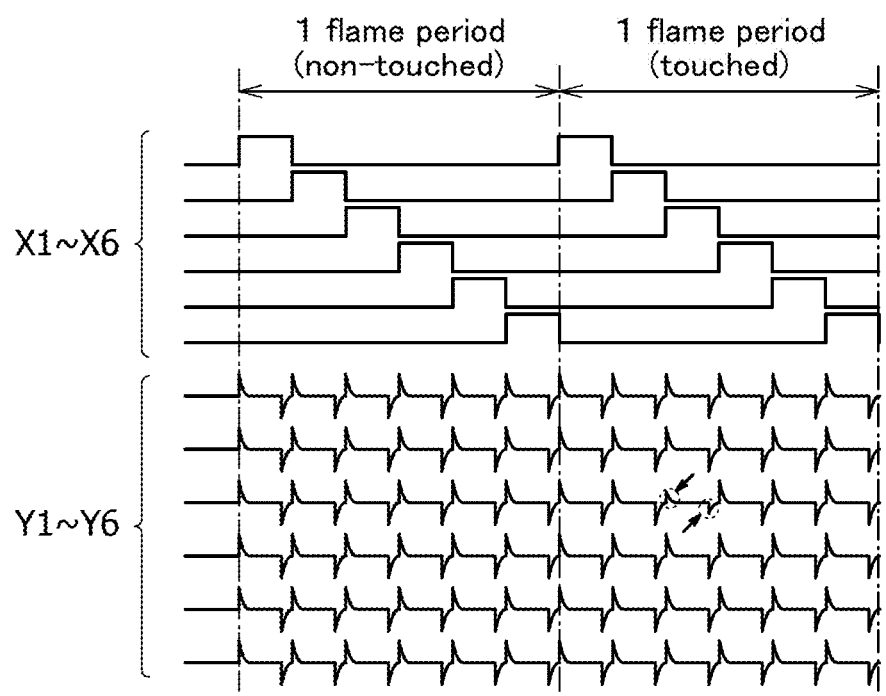

FIG. 27B is a timing chart showing input and output waveforms in the mutual capacitive touch sensor illustrated in FIG. 27A. In FIG. 27B, sensing of a sensing target is performed in all the rows and columns in one frame period. FIG. 27B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

<Sensor Circuit>

Figure 28:
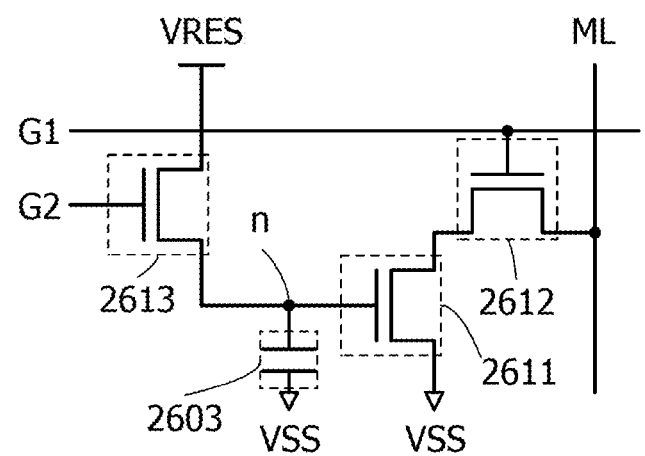
FIG. 28 is a circuit diagram of a touch sensor.

Although FIG. 27A illustrates a passive matrix type touch sensor in which only the capacitor 2603 is provided at the intersection of wirings as a touch sensor, an active matrix type touch sensor including a transistor and a capacitor may be used. FIG. 28 illustrates an example of a sensor circuit included in an active matrix type touch sensor.

The sensor circuit in FIG. 28 includes the capacitor 2603 and transistors 2611, 2612, and 2613.

A signal G2 is applied to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is applied to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 28 will be described. First, a potential for turning on the transistor 2613 is supplied to the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied to the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, any of the transistors described in the above embodiments can be used. In particular, it is preferable to use any of the transistors described in the above embodiments as the transistor 2613 because the potential of the node n can be held for a long time and the frequency of operation of resupplying VRES to the node n (refresh operation) can be reduced.

The structure described in this embodiment can be combined as appropriate with any of the structures described in the other embodiments.

(Embodiment 5)

Figure 29A:
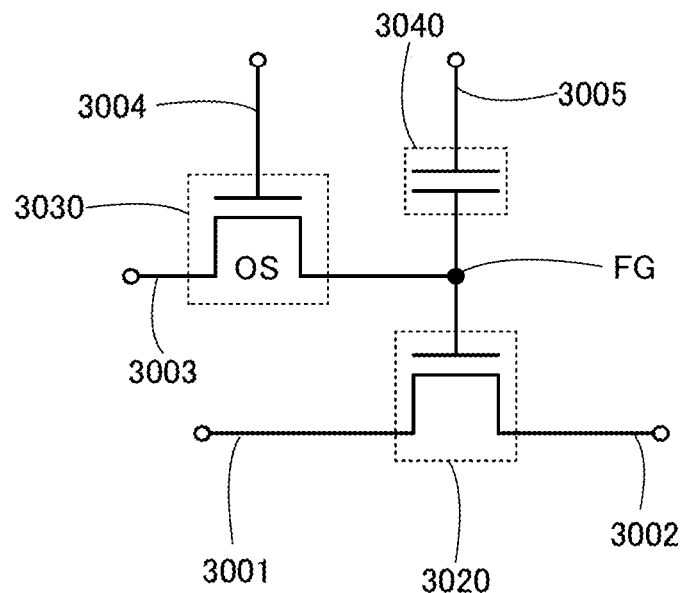
FIGS. 29A and 29B illustrate circuit structures in a semiconductor device.
Figure 29B:
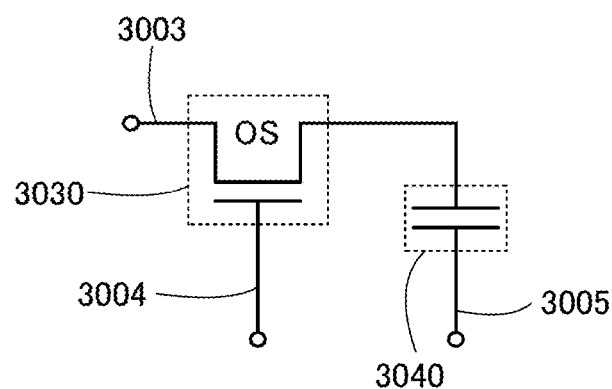

In this embodiment, an example of a semiconductor device (memory device) which includes any of the transistors of one embodiment of the present invention, which can retain stored data even when not powered, and which has an unlimited number of write cycles is shown in FIGS. 29A and 29B.

<Circuit Configuration 1>

The semiconductor device illustrated in FIG. 29A includes a transistor 3020 using a first semiconductor, a transistor 3030 using a second semiconductor, and a capacitor 3040. Note that any of the transistors described in the above embodiment can be used as the transistor 3030.

Note that the transistor 3030 is preferably a transistor with a low off-state current. For example, a transistor using an oxide semiconductor can be used as the transistor 3030. Since the off-state current of the transistor 3030 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 29A, a first wiring 3001 is electrically connected to a source of the transistor 3020. A second wiring 3002 is electrically connected to a drain of the transistor 3020. A third wiring 3003 is electrically connected to one of the source and the drain of the transistor 3030. A fourth wiring 3004 is electrically connected to the gate of the transistor 3030. The gate of the transistor 3020 and the other of the source and the drain of the transistor 3030 are electrically connected to the one electrode of the capacitor 3040. A fifth wiring 3005 is electrically connected to the other electrode of the capacitor 3040.

The semiconductor device in FIG. 29A has a feature that the potential of the gate of the transistor 3020 can be retained, and thus enables writing, retaining, and reading of data as follows.

Writing and retaining of data are described. First, the potential of the fourth wiring 3004 is set to a potential at which the transistor 3030 is on, so that the transistor 3030 is turned on. Accordingly, the potential of the third wiring 3003 is supplied to a node FG where the gate of the transistor 3020 and the one electrode of the capacitor 3040 are electrically connected to each other. That is, a predetermined electric charge is supplied to the gate of the transistor 3020 (writing). Here, one of two kinds of electric charges providing different potential levels (hereinafter referred to as a low-level electric charge and a high-level electric charge) is supplied. After that, the potential of the fourth wiring 3004 is set to a potential at which the transistor 3030 is off, so that the transistor 3030 is turned off. Thus, the electric charge is held at the node FG (retaining).

Since the off-state current of the transistor 3030 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3020 is lower than an apparent threshold voltage $V_{th\_L}$ at the time when the low-level electric charge is given to the gate of the transistor 3020. Here, an apparent threshold voltage refers to the potential of the fifth wiring 3005 which is needed to make the transistor 3020 be in "on state." Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ ($>V_{th\_H}$), the transistor 3020 is brought into "on state." In the case where the low-level electric charge is supplied to the node FG in writing, even when the potential of the fifth wiring 3005 is $V_0$ ($<V_{th\_L}$), the transistor 3020 still remains in "off state." Thus, the data retained in the node FG can be read by determining the potential of the second wiring 3002.

Note that in the case where memory cells are arrayed, it is necessary that data of a desired memory cell be read in read operation. In the case where data of the other memory cells is not read, a configuration in which only data of a desired memory cell can be read by supplying a potential at which the transistor 3020 is in "off state" regardless of the electric charge supplied to the node FG, that is, a potential lower than $V_{th\_H}$ to the fifth wiring 3005 of memory cells from which data is not read may be employed. Alternatively, a configuration in which only data of a desired memory cell can be read by supplying a potential at which the transistor 3020 is brought into "on state" regardless of the electric charge supplied to the node FG, that is, a potential higher than $V_{th\_L}$ to the fifth wiring 3005 of memory cells from which data is not read may be employed.

Although an example in which two kinds of electric charges are retained in the node FG is described above, the semiconductor device of the present invention is not limited to this example. For example, a structure in which three or more kinds of electric charges can be retained in the node FG of the semiconductor device may be employed. With such a structure, the semiconductor device can be multi-valued and the storage capacity can be increased.

<Structure of Memory Device>

Figure 30:
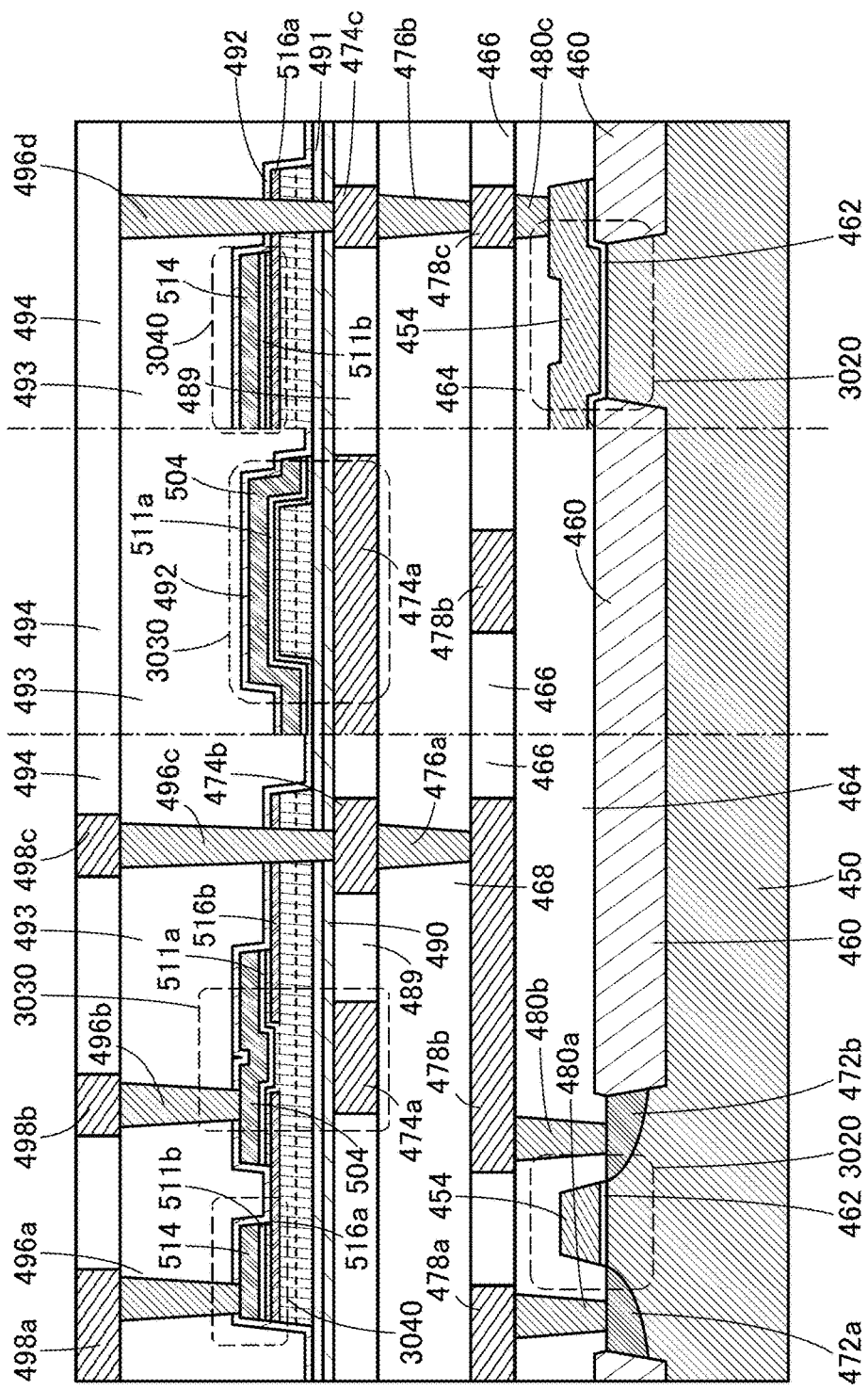
FIG. 30 is a cross-sectional view illustrating one embodiment of a semiconductor device.

FIG. 30 is a cross-sectional view of the semiconductor device illustrated in FIG. 29A and shows the transistor 3020 and the transistor 3030 in a channel length direction, the transistor 3030 in a channel width direction, and the transistor 3020 in a channel width direction. The semiconductor device illustrated in FIG. 30 includes the transistor 3020, the transistor 3030, and the capacitor 3040. The transistor 3030 and the capacitor 3040 are placed above the transistor 3020. Note that although the transistor 3020 is an n-channel transistor in the above description, the transistor 3020 may be a p-channel transistor.

In FIG. 30, the transistor 3030 has a structure where the transistor 20 (FIGS. 5C and 5D) includes a conductor 504 serving as a top gate electrode over an oxide semiconductor as in the transistor 12 (FIGS. 3A and 3B). Note that the semiconductor device of one embodiment of the present invention is not limited to this structure. Any of the transistors described in the above embodiment can be used as the transistor 3030. Therefore, the description regarding the above-mentioned transistors can be referred to for the transistor 3030 as appropriate.

The transistor 3020 illustrated in FIG. 30 is a transistor using a semiconductor substrate 450. The transistor 3020 includes a region 472a in the semiconductor substrate 450, a region 472b in the semiconductor substrate 450, an insulator 462, and a conductor 454.

In the transistor 3020, the regions 472a and 472b have functions as a source region and a drain region. The insulator 462 has a function as a gate insulator. The conductor 454 has a function as a gate electrode. Therefore, resistance of a channel formation region can be controlled by a potential applied to the conductor 454. In other words, conduction or non-conduction between the region 472a and the region 472b can be controlled by the potential applied to the conductor 454.

As the semiconductor substrate 450, a single-material semiconductor substrate formed using silicon, germanium, or the like or a semiconductor substrate formed using silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting p-type conductivity is used. However, a semiconductor substrate including impurities imparting n-type conductivity may be used as the semiconductor substrate 450. In that case, a well including impurities imparting the p-type conductivity may be provided in a region where the transistor 3020 is formed. Alternatively, the semiconductor substrate 450 may be an i-type semiconductor substrate.

The regions 472a and 472b are regions including impurities imparting the n-type conductivity. Accordingly, the transistor 3020 has a structure of a n-channel transistor.

Note that the transistor 3020 is separated from an adjacent transistor by a region 460 and the like. The region 460 is an insulating region.

The semiconductor device illustrated in FIG. 30 includes insulators 464, 466, and 468; conductors 480a, 480b, 480c, 478a, 478b, 478c, 476a, 476b, 474a, 474b, 474c, 496a, 496b, 496c, 496d, 498a, 498b, and 498c; insulators 489, 490, 491, 492, 493, and 494; the conductor 504; insulators 511a and 511b; and conductors 514, 516a, and 516b.

The insulator 464 is provided over the transistor 3020. The insulator 466 is provided over the insulator 464. The insulator 468 is provided over the insulator 466. The insulator 489 is provided over the insulator 468. The transistor 3030 is provided over the insulator 489. The insulator 493 is provided over the transistor 3030. The insulator 494 is provided over the insulator 493.

The insulator 464 has an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with the channel formation region of the transistor 3030, an opening reaching the conductor 476a, and an opening reaching the conductor 476b. In the openings, the conductors 474a, the conductor 474b, and the conductor 474c are embedded.

The conductor 474a may have a function as a bottom gate electrode of the transistor 3030. Alternatively, for example, electric characteristics such as the threshold voltage of the transistor 3030 may be controlled by application of a constant potential to the conductor 474a. Further alternatively, for example, the conductor 474a and the conductor 504 that is the top gate electrode of the transistor 3030 may be electrically connected to each other. Thus, the on-state current of the transistor 3030 can be increased. A punch-through phenomenon can be suppressed; thus, stable electric characteristics in the saturation region of the transistor 3030 can be obtained.

The conductor 504 is preferably provided to cover even a side surface of a semiconductor of the transistor 3030 as illustrated in FIG. 30. With this structure, the semiconductor of the transistor 3030 can be electrically surrounded by electric fields of the conductor 504 and the conductor 474a. Thus, an electric field for inducing a channel can be effectively applied to the semiconductor; therefore, the current drive capability of the transistor 3030 can be improved and high on-state current characteristics can be obtained.

The insulator 490 includes an opening reaching the conductor 474b and an opening reaching the conductor 474c. Note that the insulator 490 corresponds to the insulator 106 in the above embodiment and thus, the description of the insulator 106 can be referred to for details about the insulator 490.

The insulator 491 includes an opening reaching the conductor 474b and an opening reaching the conductor 474c. Note that the insulator 491 corresponds to the insulator 107 in the above embodiment and thus, the description of the insulator 107 can be referred to for details about the insulator 491.

The insulator 511a serves as a gate insulating film of the transistor 3030. Note that the insulator 511a corresponds to one or more of the insulators 114, 116, and 118; therefore, the description of the insulator 114, 116, or 118 can be referred to for details.

The insulator 492 includes an opening reaching the conductor 474b through the conductor 516b that is one of a source electrode and a drain electrode of the transistor 3030, an opening reaching the conductor 514 that overlaps with the conductor 516a that is the other of the source electrode and the drain electrode of the transistor 3030, with the insulator 511b positioned therebetween, an opening reaching the conductor 504 that is a gate electrode of the transistor 3030, and an opening reaching the conductor 474c through the conductor 516a that is the other of the source electrode and the drain electrode of the transistor 3030.

The insulator 493 includes an opening reaching the conductor 474b through the conductor 516b that is one of a source electrode and a drain electrode of the transistor 3030, an opening reaching the conductor 514 that overlaps with the conductor 516a that is the other of the source electrode and the drain electrode of the transistor 3030, with the insulator 511b positioned therebetween, an opening reaching the conductor 504 that is a gate electrode of the transistor 3030, and an opening reaching the conductor 474c through the conductor 516a that is the other of the source electrode and the drain electrode of the transistor 3030. In the openings, the conductor 496a, the conductor 496b, the conductor 496c, and the conductor 496d are embedded. Note that in some cases, an opening provided in a component of the transistor 3030 or the like is positioned between openings provided in other components.

The insulator 494 includes an opening reaching the conductor 496a, an opening reaching the conductor 496b, and an opening reaching the conductor 496c. In the openings, the conductors 498a, 498b, and 498c are embedded.

The insulators 464, 466, 468, 489, 492, 493, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

At least one of the insulators 464, 466, 468, 489, 492, 493, and 494 preferably has a function of blocking oxygen and impurities such as hydrogen. When an insulator that has a function of blocking oxygen and impurities such as hydrogen is placed near the transistor 3030, the electrical characteristics of the transistor 3030 can be stable.

The conductors 480a, 480b, 480c, 478a, 478b, 478c, 476a, 476b, 474a, 474b, 474c, 496a, 496b, 496c, 496d, 498a, 498b, and 498c may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The source or drain of the transistor 3020 is electrically connected to the conductor 516b that is one of a source electrode and a drain electrode of the transistor 3030 through the conductor 480b, the conductor 478b, the conductor 476a, the conductor 474b, and the conductor 496c. The conductor 454 that is the gate electrode of the transistor 3020 is electrically connected to the conductor 516a that is the other of the source electrode and the drain electrode of the transistor 3030 through the conductor 480c, the conductor 478c, the conductor 476b, the conductor 474c, and the conductor 496d.

The capacitor 3040 includes the conductor 516a that is the other of the source electrode and the drain electrode of the transistor 3030, the conductor 514, and an insulator 511b. Because the insulator 511b can be formed by the same step as the insulator 511a of the transistor 3030, productivity can be preferably increased in some cases. When a layer formed by the same step as the conductor 504 serving as a gate electrode of the transistor 3030 is used as the conductor 514, productivity can be preferably increased in some cases.

<Circuit Configuration 2>

The semiconductor device in FIG. 29B is different from the semiconductor device in FIG. 29A in that the transistor 3020 is not provided. Also in this case, data can be written and retained in a manner similar to that of the semiconductor device in FIG. 29A.

Reading of data in the semiconductor device in FIG. 29B is described. When the transistor 3030 is brought into on state, the third wiring 3003 which is in a floating state and the capacitor 3040 are brought into conduction, and the electric charge is redistributed between the third wiring 3003 and the capacitor 3040. As a result, the potential of the third wiring 3003 is changed. The amount of change in the potential of the third wiring 3003 varies depending on the potential of the one electrode of the capacitor 3040 (or the electric charge accumulated in the capacitor 3040).

For example, the potential of the third wiring 3003 after the charge redistribution is $(C_B \times V_{B0} + C \times V)/(C_B + C)$, where V is the potential of the one electrode of the capacitor 3040, C is the capacitance of the capacitor 3040, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3040 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3030.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

The structures, the methods, and the like described in this embodiment can be combined as appropriate with any of the structures, the methods, and the like described in the other embodiments.

(Embodiment 6)

In this embodiment, a configuration of a pixel circuit capable of being used in a semiconductor device of one embodiment of the present invention will be described below with reference to FIG. 31A.

<Configuration of Pixel Circuit>

Figure 31A:
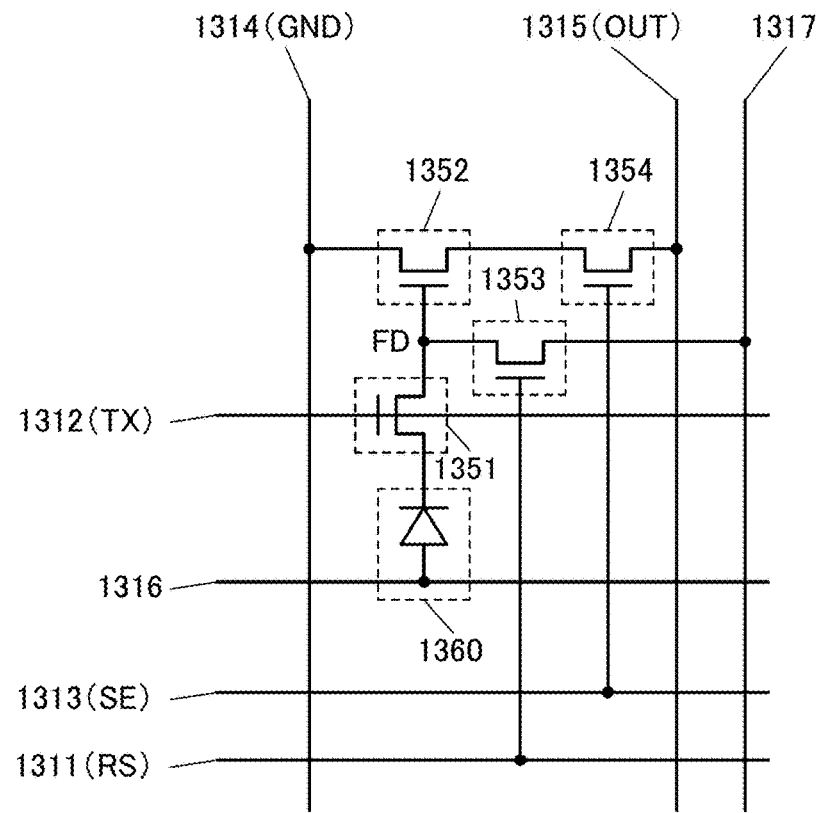
FIG. 31A is a diagram showing a configuration of a pixel circuit.

FIG. 31A illustrates a configuration of the pixel circuit. The circuit in FIG. 31A includes a photoelectric conversion element 1360, a transistor 1351, a transistor 1352, a transistor 1353, and a transistor 1354.

An anode of the photoelectric conversion element 1360 is connected to a wiring 1316, and a cathode of the photoelectric conversion element 1360 is connected to one of a source electrode and a drain electrode of the transistor 1351. The other of the source electrode and the drain electrode of the transistor 1351 is connected to a charge accumulation portion (FD), and a gate electrode of the transistor 1351 is connected to a wiring 1312 (TX). One of a source electrode and a drain electrode of the transistor 1352 is connected to a wiring 1314 (GND), and the other of the source electrode and the drain electrode of the transistor 1352 is connected to one of a source electrode and a drain electrode of the transistor 1354. A gate electrode of the transistor 1352 is connected to the charge accumulation portion (FD). One of a source electrode and a drain electrode of the transistor 1353 is connected to the charge accumulation portion (FD), and the other of the source electrode and the drain electrode of the transistor 1353 is connected to a wiring 1317. A gate electrode of the transistor 1353 is connected to a wiring 1311 (RS). The other of the source electrode and the drain electrode of the transistor 1354 is connected to a wiring 1315 (OUT), and a gate electrode of the transistor 1354 is connected to a wiring 1313 (SE). Note that all the connection is electrical connection.

A potential such as GND, VSS, or VDD may be applied to the wiring 1314. Here, a potential or voltage has a relative value. Therefore, the potential GND is not necessarily 0 V.

The photoelectric conversion element 1360 is a light-receiving element and has a function of generating current based on the amount of light that enters the pixel circuit. The transistor 1353 has a function of controlling accumulation of charge in the charge accumulation portion (FD) by the photoelectric conversion element 1360. The transistor 1354 has a function of outputting a signal based on the potential of the charge accumulation portion (FD). The transistor 1352 has a function of resetting the potential of the charge accumulation portion (FD). The transistor 1352 has a function of controlling selection of the pixel circuit at the time of reading.

Note that the charge accumulation portion (FD) is a charge retention node and retains charge that is changed depending on the amount of light received by the photoelectric conversion element 1360.

Note that the transistors 1352 and 1354 only need to be connected in series between the wirings 1314 and 1315. Thus, the wiring 1314, the transistor 1352, the transistor 1354, and the wiring 1315 may be arranged in that order, or the wiring 1314, the transistor 1354, the transistor 1352, and the wiring 1315 may be arranged in that order.

The wiring 1311 (RS) functions as a signal line for controlling the transistor 1353. The wiring 1312 (TX) functions as a signal line for controlling the transistor 1351. The wiring 1313 (SE) functions as a signal line for controlling the transistor 1354. The wiring 1314 (GND) functions as a signal line for supplying a reference potential (e.g., GND). The wiring 1315 (OUT) functions as a signal line for reading a signal output from the transistor 1352. The wiring 1316 functions as a signal line for outputting charge from the charge accumulation portion (FD) through the photoelectric conversion element 1360 and is a low-potential line in the circuit in FIG. 31A. The wiring 1317 functions as a signal line for resetting the potential of the charge accumulation portion (FD) and is a high-potential line in the circuit in FIG. 31A.

Next, a structure of each component illustrated in FIG. 31A will be described.

<Photoelectric Conversion Element>

An element including selenium or a selenium-containing compound (hereinafter referred to as a selenium-based material) or an element including silicon (e.g., an element in which a pin junction is formed) can be used as the photoelectric conversion element 1360. The photoelectric conversion element including the selenium-based material is preferably used in combination with a transistor including an oxide semiconductor, in which case high reliability can be achieved.

<Transistor>

Although a silicon semiconductor such as amorphous silicon, microcrystalline silicon, polycrystalline silicon, or single crystal silicon can be used to form the transistors 1351 to 1354, an oxide semiconductor is preferably used to form the transistors. A transistor in which a channel formation region is formed using an oxide semiconductor has extremely low off-state current. Any of the transistors described in the above embodiment, for example, can be used as the transistor in which the channel formation region is formed of an oxide semiconductor.

In particular, when the transistors 1351 and 1353 connected to the charge accumulation portion (FD) has high leakage current, charge accumulated in the charge accumulation portion (FD) cannot be held for a sufficiently long time. The use of an oxide semiconductor for the transistors 1351 and 1353 can prevent unwanted output of charge from the charge accumulation portion (FD).

Figure 32:
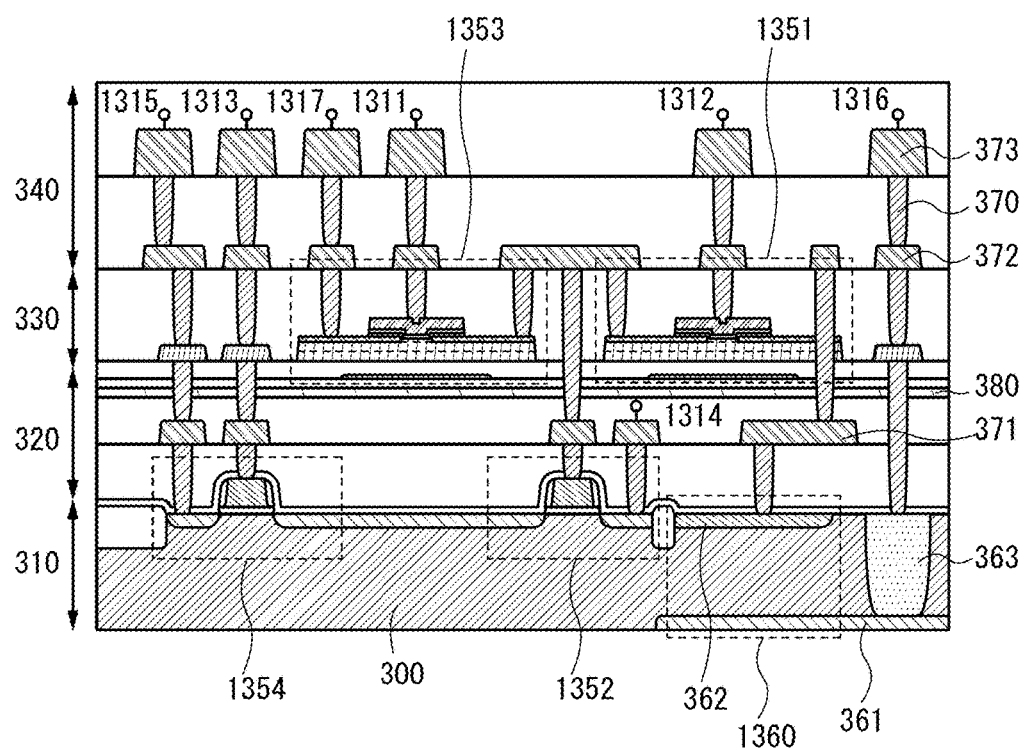
FIG. 32 is a cross-sectional view illustrating one embodiment of a semiconductor device.

FIG. 32 is a cross-sectional view of an example of a semiconductor device with the configuration of the pixel circuit shown in FIG. 31A. Note that FIG. 32 illustrates an example of a cross section in which the connection relation between the components is the same as in FIG. 31A. The configuration of the pixel circuit in FIG. 31A is not limited to the structure of the semiconductor device in FIG. 32.

The semiconductor device illustrated in FIG. 32 includes a transistor 1352 and a transistor 1354 which include silicon of a silicon substrate 300; a transistor 1351 and a transistor 1353 which include an oxide semiconductor and are stacked over the transistors 1352 and 1354; and a photoelectric conversion element 1360 provided in the silicon substrate 300. The photoelectric conversion element 1360 includes an anode 361 and a cathode 362 which are provided in the silicon substrate 300. The transistors and the photoelectric conversion element 1360 are electrically connected to plugs 370 and wirings 371 to 373. They are electrically connected to one another and connected to wiring 1311 to 1317 as shown in FIG. 31A. In addition, the anode 361 of the photoelectric conversion element 1360 is electrically connected to the plug 370 through a low-resistance region 363.

The semiconductor device includes a layer 310 including the transistor 1352, the transistor 1354, and the photoelectronic conversion element 1360, which are provided in the silicon substrate 300; a layer 320 which is in contact with the layer 310 and includes the wirings 371; a layer 330 which is in contact with the layer 320 and includes the transistors 1351 and 1353; and a layer 340 which is in contact with the layer 330 and includes a wiring 372 and a wiring 373.

In the example of cross-sectional view in FIG. 32, a light-receiving surface of the photoelectric conversion element 1360 is provided on the side opposite to a surface of the silicon substrate 300 where the transistors 1352 and 1354 are formed. With this structure, a light path can be secured without an influence of the transistors and the wirings. Thus, a pixel with a high aperture ratio can be formed. Note that the light-receiving surface of the photoelectric conversion element 1360 can be the same as the surface where the transistors 1352 and 1354 are formed.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistors 1352 and 1354 and the photoelectric conversion element 1360 and the layer 330 including the transistors 1351 and 1353. However, there is no limitation on the position of the insulator 380.

Hydrogen in an insulator provided in the vicinity of each of channel formation regions of the transistors 1352 and 1354 terminates dangling bonds of silicon; accordingly, the reliability of the transistors 1352 and 1354 can be improved. In contrast, hydrogen in the insulator provided in the vicinity of the transistors 1351 and 1353 and the like becomes one of factors generating a carrier in the oxide semiconductor. This hydrogen may reduce the reliability of the transistors 1351 and 1353 and the like. Therefore, in the case where the transistor using an oxide semiconductor is provided over the transistor using a silicon-based semiconductor material, it is preferable that the insulator 380 having a function of blocking hydrogen be provided between the transistors. When the hydrogen is confined below the insulator 380, the reliability of the transistors 1352 and 1354 can be improved. In addition, the hydrogen can be prevented from being diffused from a part below the insulator 380 to a part above the insulator 380; thus, the reliability of the transistor 1351 and the transistor 1353 can be increased.

As the insulator 380, an insulator having a function of blocking oxygen or hydrogen is used, for example.

In the cross-sectional view in FIG. 32, the photoelectric conversion element 1360 in the layer 310 and the transistor in the layer 330 can be formed so as to overlap with each other. This structure can increase the degree of integration of pixels. In other words, the resolution of the semiconductor device can be increased.

Although the transistors 1352 and 1354 are formed in the silicon substrate 300 in FIG. 32, the structure of the semiconductor device described in this embodiment is not limited thereto. For example, channel formation regions of the transistors 1352 and 1354 may be formed using an oxide semiconductor. With this structure, leakage current of the transistors 1352 and 1354 can be reduced, so that unwanted output of charge to the wiring 1314 or 1315 can be prevented.

<Timing Chart of Circuit Operation>

An example of operation of the circuit shown in FIG. 31A will be described with reference to a timing chart in FIG. 31B.

Figure 31B:
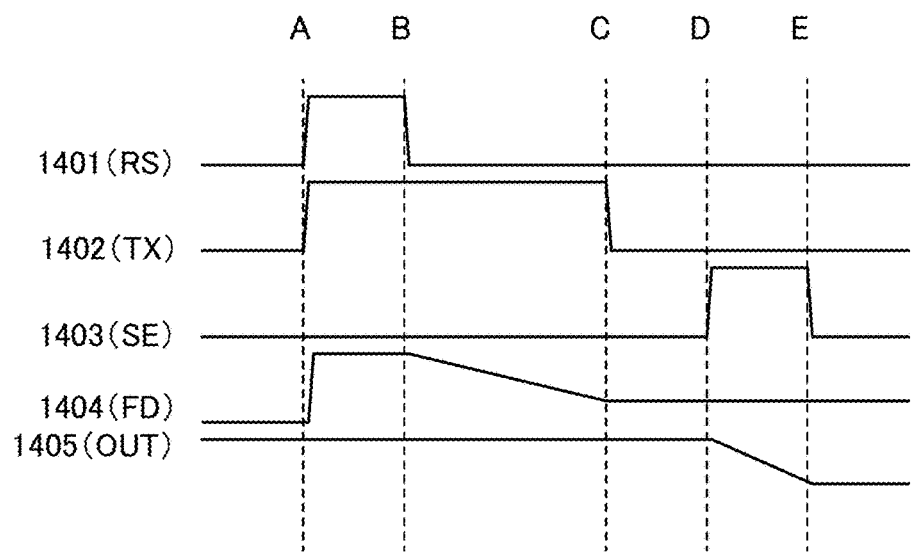
FIG. 31B is a timing chart illustrating the operation of the pixel circuit.

In FIG. 31B, the potential of each wiring is a signal that varies between two levels for simplicity. Since each potential is an analog signal, the potential can, in practice, have various levels depending on conditions without being limited to two levels. In FIG. 31B, a signal 1401 corresponds to the potential of the wiring 1311 (RS); a signal 1402 corresponds to the potential of the wiring 1312 (TX); a signal 1403 corresponds to the potential of the wiring 1313 (SE); a signal 1404 corresponds to the potential of the charge accumulation portion (FD); and a signal 1405 corresponds to the potential of the wiring 1315 (OUT). Note that the potential of the wiring 1316 is always at a low level, and the potential of the wiring 1317 is always at a high level.

At time A, the potential (signal 1401) of the wiring 1311 is at a high level and the potential (signal 1402) of the wiring 1312 is at a high level, so that the potential (signal 1404) of the charge accumulation portion (FD) is initialized to the potential (high level) of the wiring 1317, and reset operation is started. Note that the potential (signal 1405) of the wiring 1315 is precharged to a high level.

At time B, the potential (signal 1401) of the wiring 1311 is set at a low level, so that the reset operation is terminated to start accumulation operation. Here, a reverse bias is applied to the photoelectric conversion element 1360, so that the potential (signal 1404) of the charge accumulation portion (FD) starts to decrease due to reverse current. Since irradiation of the photoelectric conversion element 1360 with light increases the reverse current, the rate of decrease in the potential (signal 1404) of the charge accumulation portion (FD) changes depending on the amount of the light irradiation. In other words, channel resistance between the source electrode and the drain electrode of the transistor 1354 changes depending on the amount of light delivered to the photoelectric conversion element 1360.

At time C, the potential (signal 1402) of the wiring 1312 is set to a low level to terminate the accumulation operation, so that the potential (signal 1404) of the charge accumulation portion (FD) becomes constant. Here, the potential is determined by the amount of charge generated by the photoelectric conversion element 1360 during the accumulation operation. That is, the potential changes depending on the amount of light delivered to the photoelectric conversion element 1360. Furthermore, since each of the transistors 1351 and 1353 is a transistor that includes a channel formation region formed using an oxide semiconductor and has extremely low off-state current, the potential of the charge accumulation portion (FD) can be kept constant until subsequent selection operation (read operation) is performed.

Note that when the potential (signal 1402) of the wiring 1312 is set at a low level, the potential of the charge accumulation portion (FD) might change owing to parasitic capacitance between the wiring 1312 and the charge accumulation portion (FD). In the case where the amount of change in the potential is large, the amount of charge generated by the photoelectric conversion element 1360 during the accumulation operation cannot be obtained accurately. Examples of effective measures to reduce the amount of change in the potential include reducing capacitance between the gate electrode and the source electrode (or between the gate electrode and the drain electrode) of the transistor 1351, increasing the gate capacitance of the transistor 1352, and providing a storage capacitor in the charge accumulation portion (FD). Note that in this embodiment, the change in the potential can be ignored by taking these measures.

At time D, the potential (signal 1403) of the wiring 1313 is set at a high level to turn on the transistor 1354, so that selection operation starts and the wirings 1314 and 1315 are electrically connected to each other through the transistors 1352 and 1354. The potential (signal 1405) of the wiring 1315 starts to decrease. Note that precharge of the wiring 1315 is terminated before the time D. Here, the rate at which the potential (signal 1405) of the wiring 1315 decreases depends on current between the source electrode and the drain electrode of the transistor 1352. That is, the potential (signal 1405) of the wiring 1315 changes depending on the amount of light delivered to the photoelectric conversion element 1360 during the accumulation operation.

At time E, the potential (signal 1403) of the wiring 1313 is set at a low level to turn off the transistor 1354, so that the selection operation is terminated and the potential (signal 1405) of the wiring 1315 becomes a constant value. Here, the constant value changes depending on the amount of light delivered to the photoelectric conversion element 1360. Therefore, the amount of light delivered to the photoelectric conversion element 1360 during the accumulation operation can be determined by measuring the potential of the wiring 1315.

Specifically, when the photoelectric conversion element 1360 is irradiated with light with high intensity, the potential of the charge accumulation portion (FD), that is, the gate voltage of the transistor 1352 is decreased. Therefore, current flowing between the source electrode and the drain electrode of the transistor 1352 becomes small; as a result, the potential (signal 1405) of the wiring 1315 is gradually decreased. Thus, a comparatively high potential can be read from the wiring 1315.

In contrast, when the photoelectric conversion element 1360 is irradiated with light with low intensity, the potential of the charge accumulation portion (FD), that is, the gate voltage of the transistor 1352 is increased. Therefore, the current flowing between the source electrode and the drain electrode of the transistor 1352 becomes large; as a result, the potential (signal 1405) of the wiring 1315 is rapidly decreased. Thus, a comparatively low potential can be read from the wiring 1315.

The structure described in this embodiment can be combined as appropriate with any of the structures described in the other embodiments.

(Embodiment 7)

In this embodiment, a display module and electronic devices which include a semiconductor device of one embodiment of the present invention will be described with reference to FIG. 33 and FIGS. 34A to 34G.

<Display Module>

Figure 33:
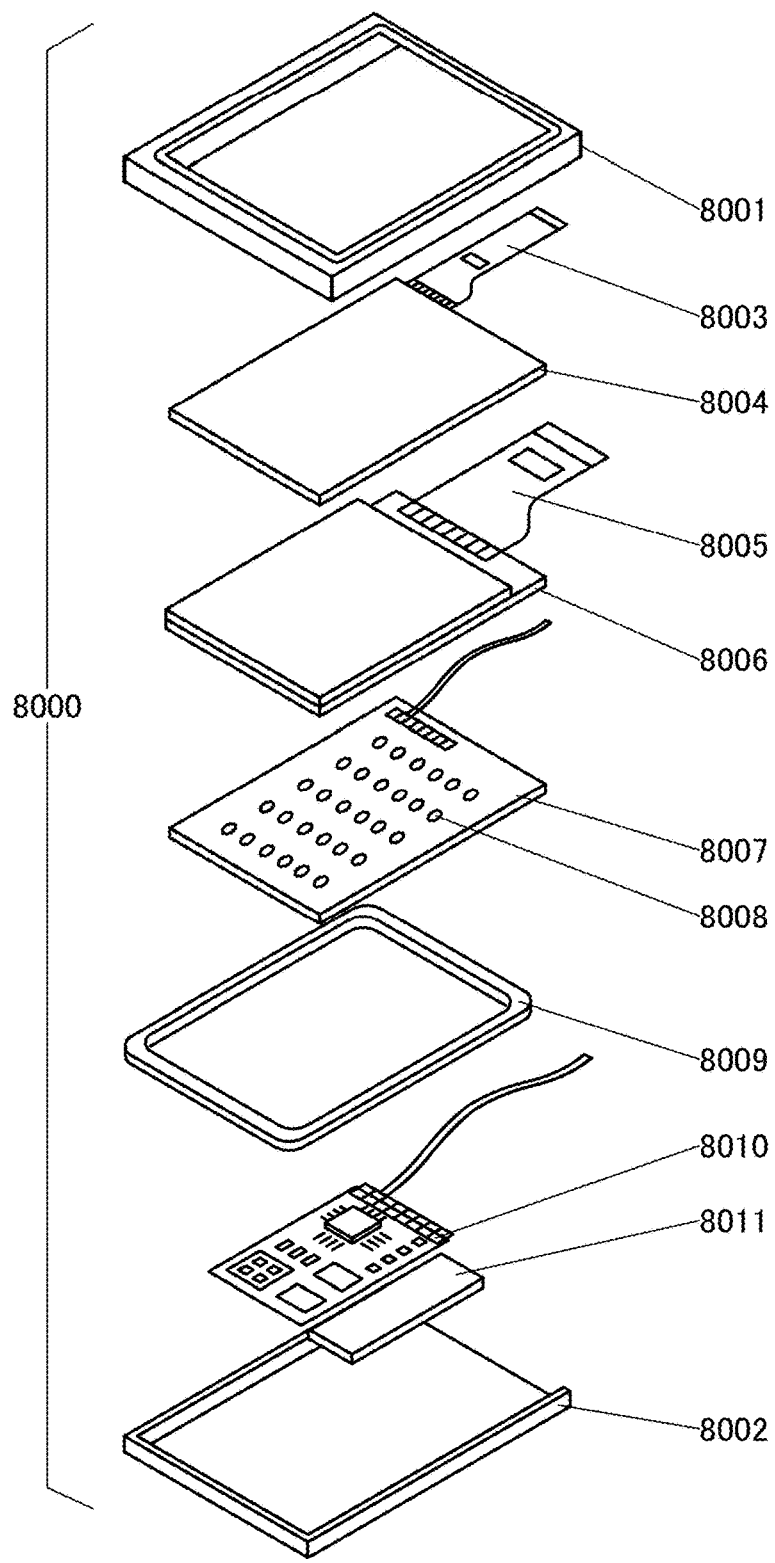
FIG. 33 illustrates a display module.

In a display module 8000 illustrated in FIG. 33, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight 8007 includes light sources 8008. Note that although a structure in which the light sources 8008 are provided over the backlight 8007 is illustrated in FIG. 33, one embodiment of the present invention is not limited to this structure. For example, a structure in which the light sources 8008 are provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

<Electronic Device>

FIGS. 34A to 34G illustrate electronic devices. These electronic devices can each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The electronic devices illustrated in FIGS. 34A to 34G can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that functions of the electronic devices illustrated in FIGS. 34A to 34G are not limited thereto, and the electronic devices can have a variety of functions. Although not illustrated in FIGS. 34A to 34G, the electronic devices may each have a plurality of display portions. The electronic devices may each have a camera or the like and a function of taking a still image, a function of taking a moving image, a function of storing the taken image in a storage medium (an external storage medium or a storage medium incorporated in the camera), a function of displaying the taken image on the display portion, and the like.

The electronic devices illustrated in FIGS. 34A to 34G will be described in detail below.

Figure 34A:
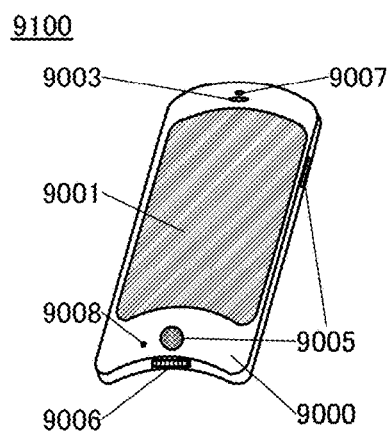
FIGS. 34A to 34G are diagrams illustrating electronic devices.

FIG. 34A is a perspective view of a portable information terminal 9100. The display portion 9001 of the portable information terminal 9100 is flexible and thus can be incorporated along the curved surface of the housing 9000. Furthermore, the display portion 9001 includes a touch sensor, and operation can be performed by touching a screen with a finger, a stylus, or the like. For example, by touching an icon displayed on the display portion 9001, an application can be started.

Figure 34B:
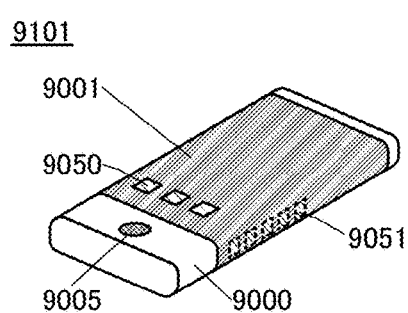

FIG. 34B is a perspective view of a portable information terminal 9101. The portable information terminal 9101 functions as, for example, one or more of a telephone set, a notebook, an information browsing system, and the like. Specifically, the portable information terminal 9101 can be used as a smartphone. Note that the speaker 9003, the connection terminal 9006, the sensor 9007, and the like, which are not illustrated in FIG. 34B, can be positioned in the portable information terminal 9101 as in the portable information terminal 9100 illustrated in FIG. 34A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming e-mail, social networking service (SNS) message, call, or the like; the title and sender of an e-mail, SNS message, or the like; the date; the time; remaining battery; the strength of an antenna; and the like. Instead of the information 9051, the operation buttons 9050 or the like may be displayed in the position where the information 9051 is displayed.

Figure 34C:
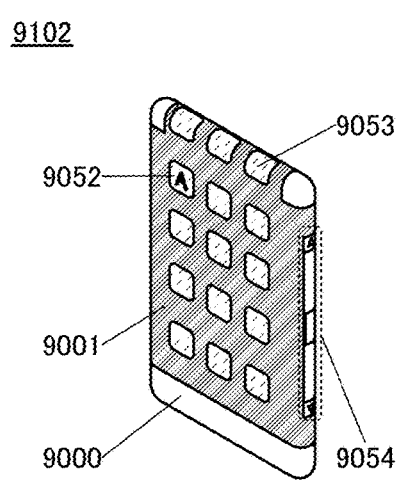

FIG. 34C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in the position that can be seen from above the portable information terminal 9102. Thus, the user can see the display without taking out the portable information terminal 9102 from the pocket and decide whether to answer the call.

Figure 34D:
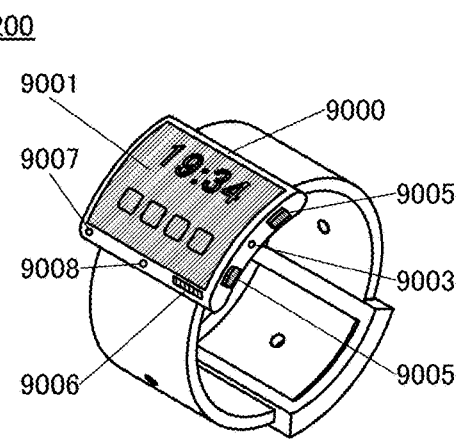

FIG. 34D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is curved, and display can be performed on the curved display surface. The portable information terminal 9200 can employ near field communication conformable to a communication standard. For example, hands-free calling can be achieved with mutual communication between the portable information terminal 9200 and a headset capable of wireless communication. Moreover, the portable information terminal 9200 includes the connection terminal 9006, and data can be directly transmitted to and received from another information terminal via a connector. Charging through the connection terminal 9006 is also possible. Note that the charging operation may be performed by wireless power feeding without using the connection terminal 9006.

Figure 34E:
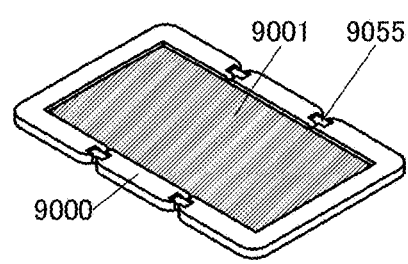
Figure 34F:
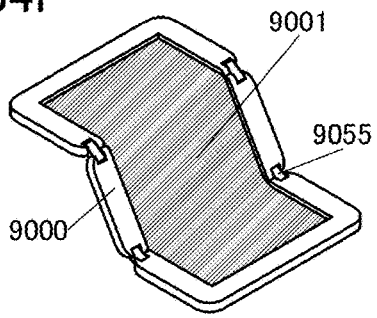
Figure 34G:
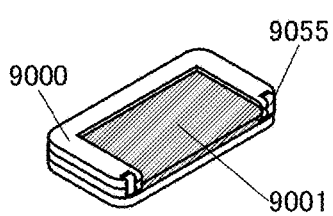

FIGS. 34E, 34F, and 34G are perspective views of a foldable portable information terminal 9201. FIG. 34E is a perspective view of the foldable portable information terminal 9201 that is opened. FIG. 34F is a perspective view of the foldable portable information terminal 9201 that is being opened or being folded. FIG. 34G is a perspective view of the foldable portable information terminal 9201 that is folded. The portable information terminal 9201 is highly portable when folded. When the portable information terminal 9201 is opened, a seamless large display region provides high browsability. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from the opened state to the folded state. For example, the portable information terminal 9201 can be bent with a radius of curvature of greater than or equal to 1 mm and less than or equal to 150 mm.

The electronic devices described in this embodiment each include the display portion for displaying some sort of data. Note that the semiconductor device of one embodiment of the present invention can also be used for an electronic device that does not have a display portion. The structure in which the display portion of the electronic device described in this embodiment is flexible and display can be performed on the curved display surface or the structure in which the display portion of the electronic device is foldable is described as an example; however, the structure is not limited thereto, and a structure in which the display portion of the electronic device is not flexible and display is performed on a plane portion may be employed.

The structure described in this embodiment can be combined as appropriate with any of the structures described in the other embodiments.

(Embodiment 8)

In this embodiment, a deposition apparatus which can be used for manufacturing the display module of one embodiment of the present invention will be described with reference to FIG. 35.

Figure 35:
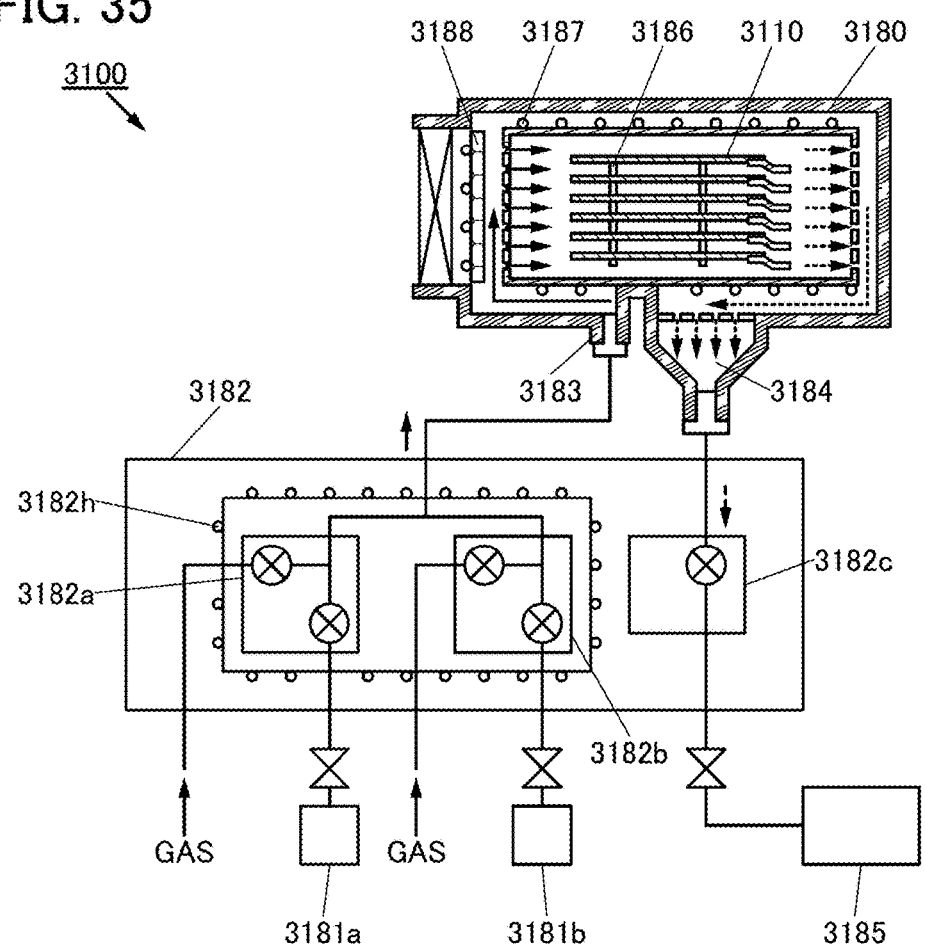
FIG. 35 illustrates a structure of a deposition apparatus.

FIG. 35 illustrates a deposition apparatus 3100 which can be used for manufacturing the display module of one embodiment of the present invention. Note that the deposition apparatus 3100 is an example of a batch-type ALD apparatus.

<Structural Example of Deposition Apparatus>

The deposition apparatus 3100 described in this embodiment includes a deposition chamber 3180 and a control portion 3182 connected to the deposition chamber 3180 (see FIG. 35).

The control portion 3182 includes a control unit (not illustrated) which supplies control signals and flow rate controllers 3182a, 3182b, and 3182c to which the control signals are supplied. For example, high-speed valves can be used as the flow rate controllers. Specifically, flow rates can be precisely controlled by using ALD valves or the like. The control portion 3182 also includes a heating mechanism 3182h which controls the temperatures of the flow rate controllers and pipes.

The flow rate controller 3182a is supplied with a control signal, a first source material, and an inert gas and has a function of supplying the first source material or the inert gas in accordance with the control signal.

The flow rate controller 3182b is supplied with a control signal, a second source material, and an inert gas and has a function of supplying the second source material or the inert gas in accordance with the control signal.

The flow rate controller 3182c is supplied with a control signal and has a function of connecting to an evacuation unit 3185 in accordance with the control signal.

<Source Material Supply Portion>

A source material supply portion 3181a has a function of supplying the first source material and is connected to the flow rate controller 3182a.

A source material supply portion 3181b has a function of supplying the second source material and is connected to the flow rate controller 3182b.

A vaporizer, a heating unit, or the like can be used as each of the source material supply portions. Thus, a gaseous source material can be generated from a solid or liquid source material.

Note that the number of source material supply portions is not limited to two and may be three or more.

<Source Material>

Any of a variety of substances can be used as the first source material. For example, an organometallic compound, a metal alkoxide, or the like can be used as the first source material. Any of a variety of substances which react with the first source material can be used as the second source material. For example, a substance which contributes to an oxidation reaction, a substance which contributes to a reduction reaction, a substance which contributes to an addition reaction, a substance which contributes to a decomposition reaction, a substance which contributes to a hydrolysis reaction, or the like can be used as the second source material.

Furthermore, a radical or the like can be used. For example, plasma obtained by supplying a source material to a plasma source or the like can be used. Specifically, an oxygen radical, a nitrogen radical, or the like can be used.

The second source material combined with the first source material is preferably a source material which reacts at a temperature close to room temperature. For example, a source material which reacts at a temperature higher than or equal to room temperature and lower than or equal to 200° C., preferably higher than or equal to 50° C. and lower than or equal to 150° C., is preferable.

<Evacuation Unit>

The evacuation unit 3185 has an evacuating function and is connected to the flow rate controller 3182c. Note that a trap for capturing the source material to be evacuated may be provided between an outlet port 3184 and the flow rate controller 3182c. The evacuated gas or the like is removed by using a removal unit.

<Control Portion>

The control portion 3182 supplies the control signals which controls the flow rate controllers, a control signal which controls the heating mechanism, or the like. For example, in a first step, the first source material is supplied to a surface of a process member. Then, in a second step, the second source material which reacts with the first source material is supplied. Accordingly, a reaction product of the first source material and the second source material can be deposited onto a surface of a process member 3110.

Note that the amount of the reaction product to be deposited onto the surface of the process member 3110 can be controlled by repetition of the first step and the second step.

Note that the amount of the first source material to be supplied to the process member 3110 is limited by the maximum possible amount of adsorption on the surface of the process member 3110. For example, conditions are selected so that a monomolecular layer of the first source material is formed on the surface of the process member 3110, and the formed monomolecular layer of the first source material is reacted with the second source material, whereby a significantly uniform layer containing the reaction product of the first source material and the second source material can be formed.

Accordingly, a variety of materials can be deposited on a surface of the process member 3110 even when the surface has a complicated structure. For example, a film having a thickness greater than or equal to 3 nm and less than or equal to 200 nm can be formed on the process member 3110.

In the case where, for example, a small hole called a pinhole or the like is formed in the surface of the process member 3110, the pinhole can be filled by depositing a material into the pinhole.

The remainder of the first source material or the second source material is evacuated from the deposition chamber 3180 with use of the evacuation unit 3185. For example, the evacuation may be performed while an inert gas such as argon or nitrogen is introduced.

<Deposition Chamber>

The deposition chamber 3180 includes an inlet port 3183 from which the first source material, the second source material, and the inert gas are supplied and the outlet port 3184 from which the first source material, the second source material, and the inert gas are evacuated.

The deposition chamber 3180 includes a support portion 3186 which has a function of supporting one or a plurality of process members 3110, a heating mechanism 3187 which has a function of heating the one or plurality of process members, and a door 3188 which has a function of opening or closing to load and unload the one or plurality of process members 3110.

For example, a resistive heater, an infrared lamp, or the like can be used as the heating mechanism 3187. The heating mechanism 3187 has a function of heating up, for example, to 80° C. or higher, 100° C. or higher, or 150° C. or higher. The heating mechanism 3187 heats the one or plurality of process members 3110 to a temperature higher than or equal to room temperature and lower than or equal to 200° C., preferably higher than or equal to 50° C. and lower than or equal to 150° C.

The deposition chamber 3180 may also include a pressure regulator and a pressure detector.

<Support Portion>

The support portion 3186 supports the one or plurality of process members 3110. Accordingly, an insulating film, for example, can be formed over the one or plurality of process members 3110 in each treatment.

<Example of Film>

An example of a film which can be formed with the deposition apparatus 3100 described in this embodiment will be described.

For example, a film including an oxide, a nitride, a fluoride, a sulfide, a ternary compound, a metal, or a polymer can be formed.

For example, the film can be formed with a material including aluminum oxide, hafnium oxide, aluminum silicate, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, or the like.

For example, the film can be formed with a material including aluminum nitride, hafnium nitride, silicon nitride, tantalum nitride, titanium nitride, niobium nitride, molybdenum nitride, zirconium nitride, gallium nitride, or the like.

For example, the film can be formed with a material including copper, platinum, ruthenium, tungsten, iridium, palladium, iron, cobalt, nickel, or the like.

For example, the film can be formed with a material including zinc sulfide, strontium sulfide, calcium sulfide, lead sulfide, calcium fluoride, strontium fluoride, zinc fluoride, or the like.

For example, the film can be formed with a material which includes a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

This embodiment can be combined with any of the other embodiments in this specification as appropriate.

This application is based on Japanese Patent Application serial no. 2014-264126 filed with Japan Patent Office on Dec. 26, 2014, the entire contents of which are hereby incorporated by reference.

What is claimed is:

1. A semiconductor device comprising:
a first conductor over a substrate;
a first insulator over the first conductor;
a first metal oxide over the first insulator to overlap with at least part of the first conductor;
an oxide semiconductor in contact with at least part of a top surface of the first metal oxide;
a second metal oxide in contact with at least part of a top surface of the oxide semiconductor;
a second conductor in contact with at least part of the second metal oxide; and
a third conductor in contact with at least part of the second metal oxide and separated from the second conductor,
wherein an entire portion of the oxide semiconductor overlaps with the first conductor in a channel length direction,
wherein the first metal oxide comprises In, Zn, and M,
wherein a content of In is lower than a content of M in the first metal oxide,
wherein the content of In is K times lower than a content of Zn in the first metal oxide,
wherein the oxide semiconductor comprises In and M,
wherein a content of In is higher than a content of M in the oxide semiconductor,
wherein the second metal oxide comprises In, Zn, and M,
wherein M represents any one of Ti, Ga, Y, Zr, La, Ce, Nd, Sn, and Hf, and
wherein K is greater than or equal to 4 and less than or equal to 7.

2. The semiconductor device according to claim 1,
wherein a side edge portion of the first metal oxide and a side edge portion of the oxide semiconductor are aligned with each other, wherein the side edge portion of the oxide semiconductor and a side edge portion of the second metal oxide are aligned with each other, and wherein the second conductor and the third conductor are in contact with a top surface of the second metal oxide.

3. The semiconductor device according to claim 2, wherein the second metal oxide has a depression in a region, which is not in contact with the second conductor and the third conductor.

4. The semiconductor device according to claim 2, wherein a thickness of a region of the second metal oxide, which is not in contact with the second conductor and the third conductor, is smaller than a thickness of a region of the second metal oxide, which is in contact with the second conductor and the third conductor.

5. The semiconductor device according to claim 1, wherein a side edge portion of the second metal oxide recedes from a side edge portion of the oxide semiconductor, and wherein the second conductor and the third conductor are in contact with a top surface of the oxide semiconductor and a top surface of the second metal oxide.

6. The semiconductor device according to claim 1, wherein a bottom surface of the second metal oxide is in contact with the second conductor and the third conductor, and wherein the second conductor and the third conductor are in contact with a top surface of the oxide semiconductor.

7. The semiconductor device according to claim 1, further comprising:

a second insulator over the second metal oxide, the second conductor, and the third conductor; and a fourth conductor over the second insulator to overlap with at least part of the second metal oxide.

8. The semiconductor device according to claim 1, wherein an energy level of a conduction band minimum of the first metal oxide is closer to a vacuum level than an energy level of a conduction band minimum of the oxide semiconductor, and wherein an energy level of a conduction band minimum of the second metal oxide is closer to the vacuum level than the energy level of the conduction band minimum of the oxide semiconductor.

9. The semiconductor device according to claim 1, wherein the oxide semiconductor further comprises Ge.

10. The semiconductor device according to claim 1, wherein the oxide semiconductor has a polycrystalline structure.

11. A display device comprising:
the semiconductor device according to claim 1; and
a display element.

12. An electronic device comprising:
the semiconductor device according to claim 1; and
an operation key or a battery.

13. The semiconductor device according to claim 1, wherein in the first metal oxide a combined content of M and Zn is N times higher than a content of In, and wherein N is greater than or equal to 9 and smaller than or equal to 13.

14. A semiconductor device comprising:
a first conductor over a substrate;
a first insulator over the first conductor;
a first metal oxide over the first insulator to overlap with at least part of the first conductor;
an oxide semiconductor in contact with at least part of a top surface of the first metal oxide;
a second metal oxide in contact with at least part of a top surface of the oxide semiconductor;
a second conductor in contact with at least part of the second metal oxide; and
a third conductor in contact with at least part of the second metal oxide and separated from the second conductor, wherein an entire portion of the oxide semiconductor overlaps with the first conductor in a channel length direction, wherein the first metal oxide comprises In, Zn and M, wherein the oxide semiconductor comprises In and M, wherein a content of In is higher than a content of M in the oxide semiconductor, wherein the second metal oxide comprises In, Zn, and M wherein in the first metal oxide a combined content of M and Zn is N times higher than a content of In, wherein M represents any one of Ti, Ga, Y, Zr, La, Ce, Nd, Sn, and Hf, and wherein N is greater than or equal to 9 and less than or equal to 13.

15. The semiconductor device according to claim 14, wherein a side edge portion of the first metal oxide and a side edge portion of the oxide semiconductor are aligned with each other, wherein the side edge portion of the oxide semiconductor and a side edge portion of the second metal oxide are aligned with each other, and wherein the second conductor and the third conductor are in contact with a top surface of the second metal oxide.

16. The semiconductor device according to claim 15, wherein the second metal oxide has a depression in a region, which is not in contact with the second conductor and the third conductor.

17. The semiconductor device according to claim 15, wherein a thickness of a region of the second metal oxide, which is not in contact with the second conductor and the third conductor, is smaller than a thickness of a region of the second metal oxide, which is in contact with the second conductor and the third conductor.

18. The semiconductor device according to claim 14, wherein a side edge portion of the second metal oxide recedes from a side edge portion of the oxide semiconductor, and wherein the second conductor and the third conductor are in contact with a top surface of the oxide semiconductor and a top surface of the second metal oxide.

19. The semiconductor device according to claim 14, wherein a bottom surface of the second metal oxide is in contact with the second conductor and the third conductor, and wherein the second conductor and the third conductor are in contact with a top surface of the oxide semiconductor.

20. The semiconductor device according to claim 14, further comprising:

a second insulator over the second metal oxide, the second conductor, and the third conductor; and a fourth conductor over the second insulator to overlap with at least part of the second metal oxide.

21. The semiconductor device according to claim 14, wherein an energy level of a conduction band minimum of the first metal oxide is closer to a vacuum level than an energy level of a conduction band minimum of the oxide semiconductor, and wherein an energy level of a conduction band minimum of the second metal oxide is closer to the vacuum level than the energy level of the conduction band minimum of the oxide semiconductor.

22. The semiconductor device according to claim 14, wherein the oxide semiconductor further comprises Ge.

23. The semiconductor device according to claim 14, wherein the oxide semiconductor has a polycrystalline structure.

24. A display device comprising:
the semiconductor device according to claim 14; and
a display element.

25. An electronic device comprising:
the semiconductor device according to claim 14; and
an operation key or a battery.

26. The semiconductor device according to claim 14,
wherein in the first metal oxide an content of Zn is K times higher than a content of In, and
wherein K is greater than or equal to 4 and smaller than or equal to 7.

* * * * *